(12) United States Patent
Kwon et al.

(10) Patent No.: US 12,720,741 B2
(45) Date of Patent: Aug. 25, 2026

(54) SEMICONDUCTOR DATA STORAGE DEVICE INCLUDING FIRST AND SECOND STACK STRUCTURES WITH DUMMY STRUCTURE THEREBETWEEN AND DATA STORAGE SYSTEM INCLUDING THE SAME

(71) Applicant: SAMSUNG ELECTRONICS CO., LTD., Suwon-si (KR)

(72) Inventors: Donghoon Kwon, Suwon-si (KR); Chungki Min, Suwon-si (KR); Boun Yoon, Suwon-si (KR); Kihoon Jang, Suwon-si (KR)

(73) Assignee: SAMSUNG ELECTRONICS CO., LTD., Suwon-si (KR)

(*) Notice: Subject to any disclaimer, the term of this patent is extended or adjusted under 35 U.S.C. 154(b) by 643 days.

(21) Appl. No.: 18/070,536

(22) Filed: Nov. 29, 2022

(65) Prior Publication Data

US 2023/0328986 A1 Oct. 12, 2023

(30) Foreign Application Priority Data

Apr. 6, 2022 (KR) ........................ 10-2022-0042843

(51) Int. Cl.
*H10B 43/27* (2023.01)
*G11C 16/04* (2006.01)
(Continued)

(52) U.S. Cl.
CPC ......... *H10B 43/27* (2023.02); *G11C 16/0483* (2013.01); *H10B 41/10* (2023.02);
(Continued)

(58) Field of Classification Search
CPC ........ H10B 43/27; H10B 41/10; H10B 41/27; H10B 41/35; H10B 43/10; H10B 43/35;
(Continued)

(56) References Cited

U.S. PATENT DOCUMENTS

2020/0111803 A1 4/2020 Baek et al.
2020/0303413 A1 9/2020 Shin et al.
(Continued)

FOREIGN PATENT DOCUMENTS

DE 102021117434 A1 4/2022
KR 10-2020-0040351 A 4/2020
(Continued)

OTHER PUBLICATIONS

Dhananjay Krithika et al: "Monolithic 3D Integrated Circuits: Recent Trends and Future Prospects", IEEE Transactions on Circuits and Systems II: Express Briefs, IEEE, USA, vol. 68, No. 3, Jan. 13, 2021.
(Continued)

*Primary Examiner* — Davienne N Monbleau
*Assistant Examiner* — John Patrick Cornely
(74) *Attorney, Agent, or Firm* — Muir Patent Law, PLLC

(57) ABSTRACT

A semiconductor device includes a source structure, first and second stack structures, including first gate electrodes stacked on the source structure to be spaced apart from each other; a dummy structure on the source structure between the first and the second stack structures, and including second gate electrodes stacked to be spaced apart from each other; first separation regions passing through the first and second stack structures, and spaced apart from each other; second separation regions extending between each of the first and second stack structures and the dummy structure; channel structures passing through the first and second stack structures, and respectively including a channel layer, connected to the source structure through the channel layer; and first source contact structures passing through the dummy structure, and respectively including a first contact layer connected to the source structure through a lower surface of the first contact layer.

18 Claims, 36 Drawing Sheets

(51) Int. Cl.

| | |
|---|---|
| ***H10B 41/10*** | (2023.01) |
| ***H10B 41/27*** | (2023.01) |
| ***H10B 41/35*** | (2023.01) |
| ***H10B 43/10*** | (2023.01) |
| ***H10B 43/35*** | (2023.01) |
| ***H10W 20/41*** | (2026.01) |
| ***H10W 20/42*** | (2026.01) |

(52) U.S. Cl.

CPC ............. *H10B 41/27* (2023.02); *H10B 41/35* (2023.02); *H10B 43/10* (2023.02); *H10B 43/35* (2023.02); *H10W 20/42* (2026.01); *H10W 20/435* (2026.01)

(58) Field of Classification Search

CPC ........ H10B 43/40; H10B 41/40; H10B 41/50; H10B 43/50; G11C 16/0483; H01L 23/5226; H01L 23/5283; H01L 25/18

See application file for complete search history.

(56) References Cited

U.S. PATENT DOCUMENTS

| | | | | |
|---|---|---|---|---|
| 2020/0350014 | A1 * | 11/2020 | Liu | H01L 21/50 |
| 2020/0350331 | A1 | 11/2020 | Kim | |
| 2021/0375905 | A1 | 12/2021 | Hwang et al. | |
| 2021/0398915 | A1 | 12/2021 | Lim et al. | |
| 2021/0399003 | A1 | 12/2021 | Shin et al. | |
| 2022/0085056 | A1 * | 3/2022 | Zhang | H10B 43/10 |
| 2022/0102273 | A1 | 3/2022 | Kubo | |
| 2022/0122651 | A1 | 4/2022 | Kim et al. | |

FOREIGN PATENT DOCUMENTS

| | | | |
|---|---|---|---|
| KR | 1020200127106 | A | 11/2020 |
| KR | 1020210082272 | A | 7/2021 |
| KR | 1020210125152 | A | 10/2021 |
| KR | 1020220025771 | A | 3/2022 |
| KR | 1020220039970 | A | 3/2022 |
| WO | WO 2021/071545 | A1 | 4/2021 |

OTHER PUBLICATIONS

Extended European Search Report dated Aug. 1, 2023, of the corresponding EP application No. 23165254.6.

* cited by examiner

SEMICONDUCTOR DATA STORAGE DEVICE INCLUDING FIRST AND SECOND STACK STRUCTURES WITH DUMMY STRUCTURE THEREBETWEEN AND DATA STORAGE SYSTEM INCLUDING THE SAME

CROSS-REFERENCE TO RELATED APPLICATIONS

This application claims benefit of priority to Korean Patent Application No. 10-2022-0042843, filed on Apr. 6, 2022, in the Korean Intellectual Property Office, the disclosure of which is incorporated herein by reference in its entirety.

BACKGROUND

1. Field

Embodiments relate a semiconductor device and a data storage system including the same.

2. Description of the Related Art

In a data storage system requiring data storage, a semiconductor device for storing high-capacity data may be required. Accordingly, methods for increasing data storage capacity of semiconductor devices are being researched. For example, as a method for increasing data storage capacity of a semiconductor device, a semiconductor device including memory cells arranged three-dimensionally, instead of memory cells arranged two-dimensionally, has been proposed.

SUMMARY

According to an aspect of embodiments, a semiconductor device includes a first substrate structure including a substrate, circuit elements disposed on the substrate, and first bonding metal layers disposed on the circuit elements; and a second substrate structure connected to the first substrate structure on the first substrate structure, wherein the second substrate structure includes: a source structure; a first stack structure and a second stack structure, including first gate electrodes stacked on the source structure to be spaced apart from each other in a first direction, perpendicular to an upper surface of the source structure, and spaced apart from each other in a second direction, perpendicular to the first direction; a dummy structure disposed on the source structure between the first stack structure and the second stack structure, and including second gate electrodes stacked to be spaced apart from each other in the first direction; first separation regions passing through the first and second stack structures to extend in the second direction, and spaced apart from each other in a third direction, perpendicular to the first and second directions; second separation regions extending in the third direction between each of the first and second stack structures and the dummy structure; channel structures passing through the first and second stack structures to extend in the first direction, and respectively including a channel layer, connected to the source structure through a side surface of the channel layer; and first source contact structures passing through the dummy structure to extend in the first direction, and respectively including a first contact layer, which is conductive, connected to the source structure through a lower surface of the first contact layer.

According to an aspect of embodiments, a semiconductor device includes a source structure; a first stack structure and a second stack structure, including first gate electrodes stacked on the source structure to be spaced apart from each other in a first direction, perpendicular to an upper surface of the source structure, and spaced apart from each other in a second direction, perpendicular to the first direction; a dummy structure disposed on the source structure between the first stack structure and the second stack structure, and including second gate electrodes stacked to be spaced apart from each other in the first direction; channel structures passing through the first and second stack structures to extend in the first direction, and respectively including a channel layer; first source contact structures passing through the dummy structure to extend in the first direction, and connected to the source structure; second source contact structures disposed outside side surfaces of the first and second stack structures, not facing the dummy structure, and connected to the source structure; first interconnection lines electrically connected to the channel structures and extending in a third direction, perpendicular to the first and second directions; and second interconnection lines electrically connected to the first and second source contact structures and disposed around the first interconnection lines.

According to an aspect of embodiments, a data storage system includes a semiconductor storage device including a source structure, circuit elements on one side of the source structure, and an input/output pad electrically connected to the circuit elements; and a controller electrically connected to the semiconductor storage device through the input/output pad and controlling the semiconductor storage device, wherein the semiconductor storage device further includes a first stack structure and a second stack structure, including first gate electrodes stacked on the source structure to be spaced apart from each other in a first direction, perpendicular to an upper surface of the source structure, and spaced apart from each other in a second direction, perpendicular to the first direction; a dummy structure disposed on the source structure between the first stack structure and the second stack structure, and including second gate electrodes stacked to be spaced apart from each other in the first direction; channel structures passing through the first and second stack structures to extend in the first direction, and respectively including a channel layer, connected to the source structure through a side surface of the channel layer; and first source contact structures passing through the dummy structure to extend in the first direction, and respectively including a first contact layer, which is conductive, connected to the source structure through a lower surface of the first contact layer.

BRIEF DESCRIPTION OF DRAWINGS

Features will become apparent to those of skill in the art by describing in detail exemplary embodiments with reference to the attached drawings, in which.

DETAILED DESCRIPTION

Figure 1:
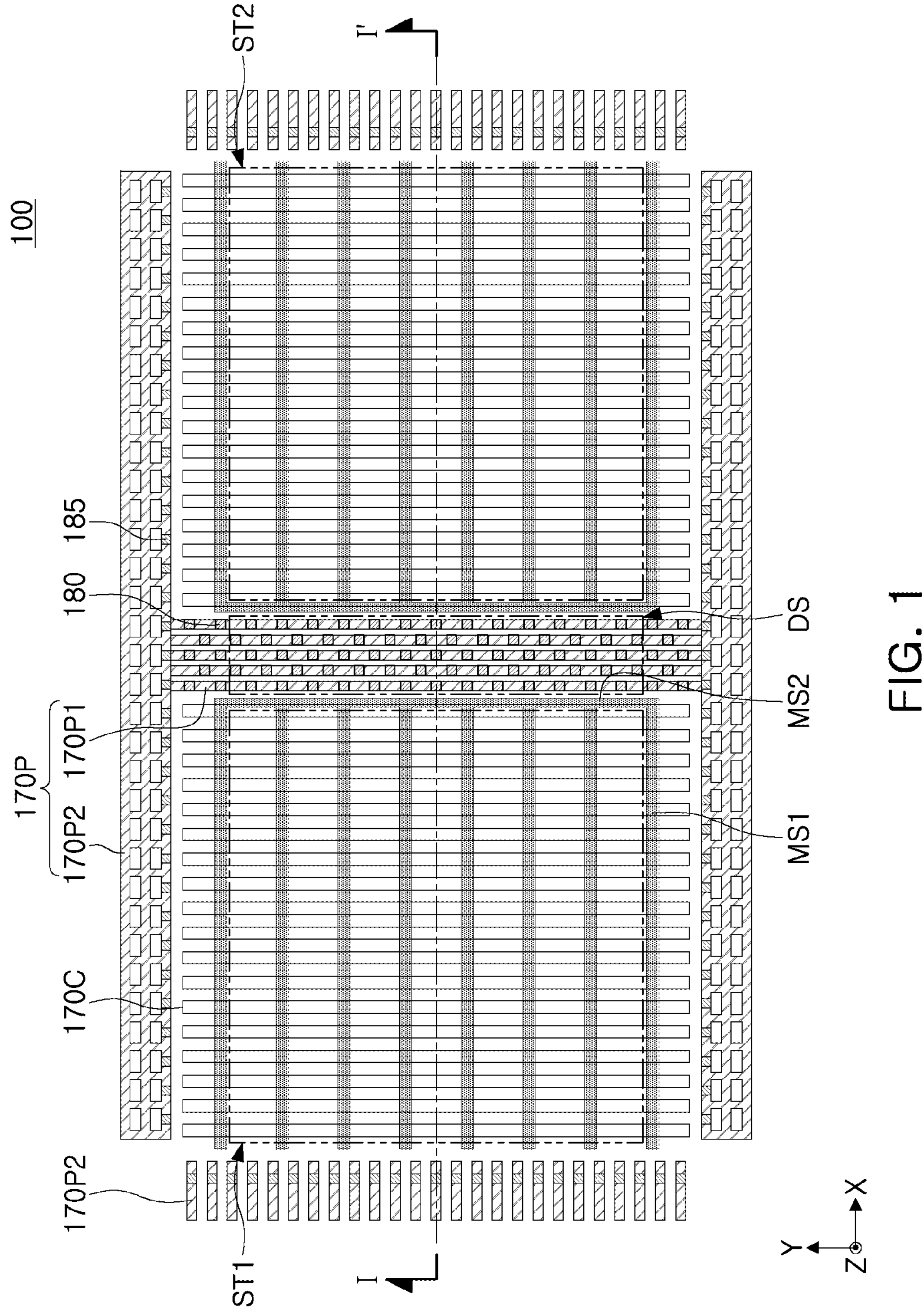
FIG. 1 is a schematic plan view of a semiconductor device according to example embodiments.

FIG. 1 is a schematic plan view of a semiconductor device according to example embodiments. FIG. 1 illustrates only some configurations of the semiconductor device illustrated in FIGS. 2A and 2B.

Figure 2A:
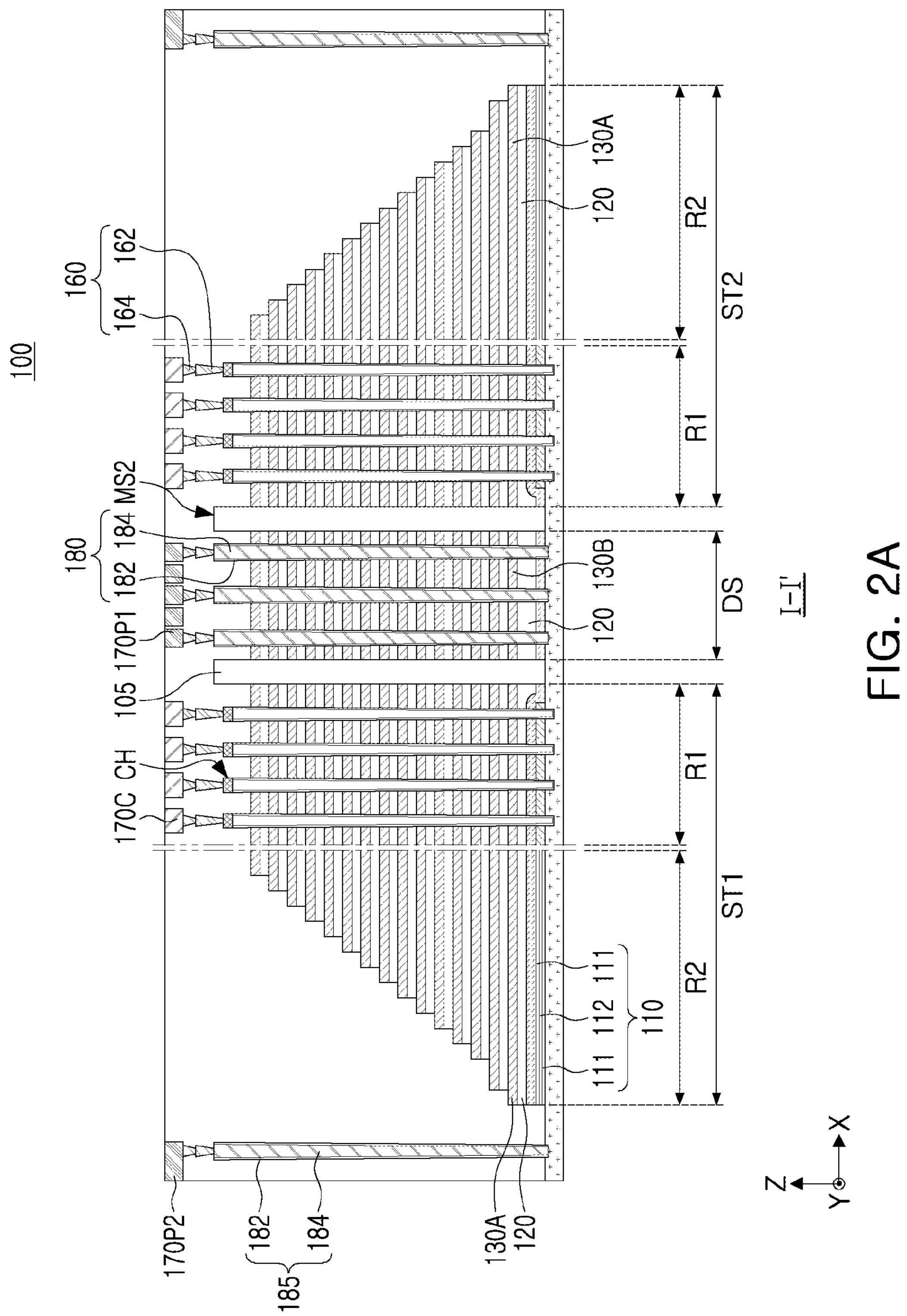
FIGS. 2A and 2B are schematic cross-sectional views of a semiconductor device according to example embodiments.
Figure 2B:
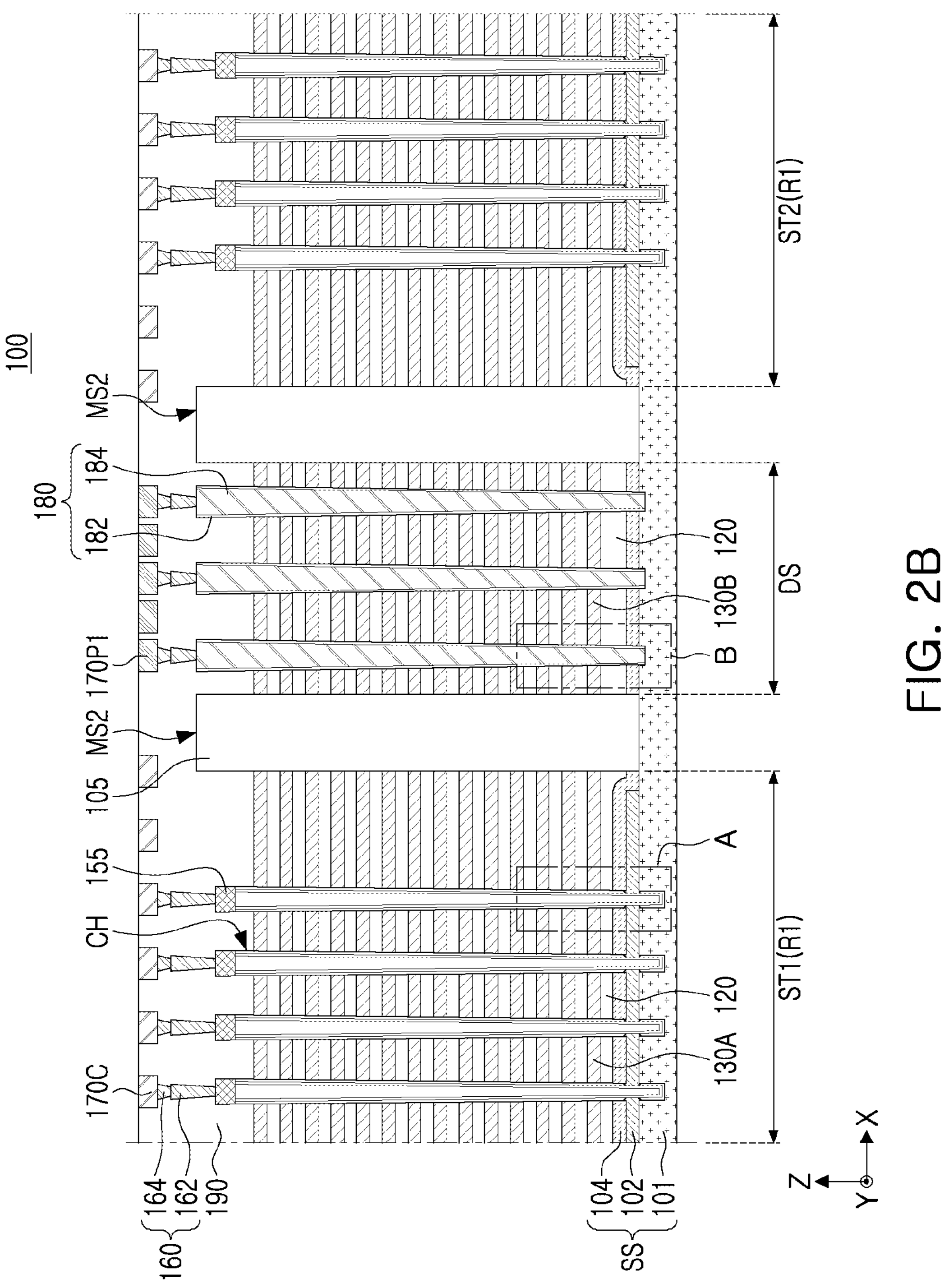
Figure 3A:
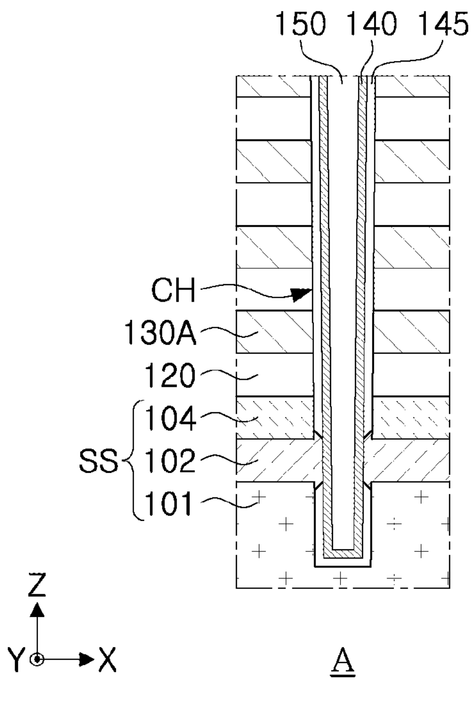
FIGS. 3A and 3B are partially enlarged views of a semiconductor device according to example embodiments.
Figure 3B:
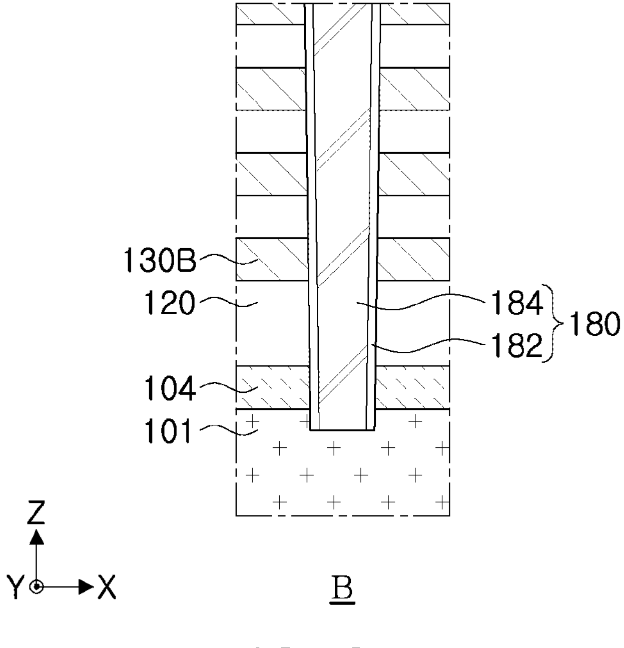

FIG. 2A illustrates a cross-sectional view of FIG. 1, taken along line I-I', and FIG. 2B illustrates a partially enlarged cross-sectional view of FIG. 2A. FIGS. 3A and 3B illustrate enlarged views of portions 'A' and 'B' of FIG. 2B, respectively.

Referring to FIGS. 1 to 3B, a semiconductor device 100 may include a source structure SS including a plate layer 101 and first and second horizontal conductive layers 102 and 104 on the plate layer 101, first and second stack structures ST1 and ST2 including first gate electrodes 130A stacked on the plate layer 101, a dummy structure DS including second gate electrodes 130B stacked on the plate layer 101, interlayer insulating layers 120 forming the first and second stack structures ST1 and ST2 and the dummy structure DS and on which the first and second gate electrodes 130A and 130B are alternately stacked, first separation regions MS1 passing through the first and second stack structures ST1 and ST2 and extending in one direction, second separation regions MS2 separating the first and second stack structures ST1 and ST2 and the dummy structure DS, channel structures CH disposed to pass through the first and second stack structures ST1 and ST2 and including a channel layer 140, and first source contact structures 180 disposed to pass through the dummy structure DS. The semiconductor device 100 may further include second source contact structures 185 disposed on the outside of the first and second stack structures ST1 and ST2 and the dummy structure DS, contact plugs 160 and first and second interconnection lines 170C and 170P, forming an upper interconnection structure, and a cell region insulating layer 190 covering the first and second gate electrodes 130A and 130B and the channel structures CH.

The semiconductor device 100 may be a memory device in which one memory cell string is configured around each of the channel structures CH, and a plurality of memory cell strings are arranged in columns and rows in an X-direction and a Y-direction.

The plate layer 101 may have an upper surface extending in the X-direction and the Y-direction. The plate layer 101 may include a semiconductor material, e.g., a group IV semiconductor, a group III-V compound semiconductor, or a group II-VI compound semiconductor. For example, the group IV semiconductor may include silicon, germanium, or silicon-germanium. The plate layer 101 may be provided as, e.g., a bulk wafer, an epitaxial layer, a silicon-on-insulator (SOI) layer, a semiconductor-on-insulator (SeOI) layer, a polycrystalline layer, or the like. The plate layer 101 may include first regions R1 and second regions R2 disposed on at least one side of the first regions R1.

The first and second horizontal conductive layers 102 and 104 may be stacked and disposed on the upper surface of the plate layer 101. The first and second horizontal conductive layers 102 and 104 may be source layers, and may form the source structure SS together with the plate layer 101. The source structure SS may function as a common source line of the semiconductor device 100. As illustrated in the enlarged view of FIG. 3A, the first horizontal conductive layer 102 may be directly connected to the channel layer 140 around the channel layer 140 and through a side surface of the channel layer 140. The first horizontal conductive layer 102 may partially extend along the channel layer 140 in a Z-direction, to contact the channel layer 140.

The first and second horizontal conductive layers 102 and 104 may include a semiconductor material, e.g., polycrystalline silicon. In this case, at least the first horizontal conductive layer 102 may be a layer doped with impurities of the same conductivity type as that of the plate layer 101. The second horizontal conductive layer 104 may be a doped layer or an intrinsic semiconductor layer including impurities diffused from the first horizontal conductive layer 102. A material of the second horizontal conductive layer 104 is not limited to the semiconductor material, and may be replaced with an insulating layer according to embodiments. In example embodiments, a relatively thin insulating layer may be interposed between an upper surface of the first horizontal conductive layer 102 and a lower surface of the second horizontal conductive layer 104. This may be a portion of a horizontal insulating layer 110 remaining without being removed during the manufacturing process of the semiconductor device 100.

The first horizontal conductive layer 102 may not be disposed in second regions R2 of the first and second stack structures ST1 and ST2 and the dummy structure DS. A horizontal insulating layer 110 may be disposed on the plate layer 101 in the second regions R2 of the first and second stack structures ST1 and ST2. Below the dummy structure DS, the second horizontal conductive layer 104 may be disposed on the plate layer 101. The second horizontal conductive layer 104 may be bent along an end portion of the first horizontal conductive layer 102, in a space between the first regions R1 and the second regions R2 and in outer regions of the second separation regions MS2 in the X-direction, to extend onto the plate layer 101. However, in embodiments, relative arrangement of the first and second horizontal conductive layers 102 and 104 and the horizontal insulating layer 110 according to regions may be variously changed.

The horizontal insulating layer 110 may be disposed on the plate layer 101 on the same level as the first horizontal conductive layer 102 in at least a portion of the second regions R2. The horizontal insulating layer 110 may include first and second horizontal insulating layers 111 and 112 alternately stacked on the plate layer 101. The horizontal insulating layer 110 may include layers remaining after being partially replaced with the first horizontal conductive layer 102 in the manufacturing process of the semiconductor device 100.

The horizontal insulating layer 110 may include, e.g., silicon oxide, silicon nitride, silicon carbide, or silicon oxynitride. The first horizontal insulating layers 111 and the second horizontal insulating layer 112 may include different insulating materials. For example, the first horizontal insulating layers 111 may be formed of the same material as the interlayer insulating layers 120, and the second horizontal insulating layer 112 may be formed of a material different from that of the interlayer insulating layers 120.

The first and second stack structures ST1 and ST2 may be disposed to be spaced apart from each other in the X-direction, and may include the first gate electrodes 130A and the interlayer insulating layers 120, alternately stacked in the Z-direction, respectively. The first and second stack structures ST1 and ST2 may include the first regions R1 and the second regions R2, respectively.

The dummy structure DS may include the second gate electrodes 130B and the interlayer insulating layers 120, alternately stacked in the Z-direction. The dummy structure DS may be located between the first stack structure ST1 and the second stack structure ST2. The dummy structure DS may be separated and spaced apart from the first and second stack structures ST1 and ST2 by the second separation regions MS2.

In some embodiments, the dummy structure DS may also extend outwardly from side surfaces of the first and second stack structures ST1 and ST2 extending in the X-direction, in the plan view of FIG. 1. In this case, the dummy structure DS may be separated and spaced apart from the first and second stack structures ST1 and ST2 by the second separation regions MS2 and the first separation regions MS1 on both ends in the Y-direction. In example embodiments, positions of end portions of the first and second stack structures ST1 and ST2 and the dummy structure DS in the Y-direction may be variously changed.

The first gate electrodes 130A may be vertically spaced apart and stacked on the plate layer 101 to form the first and second stack structures ST1 and ST2. The first gate electrodes 130A may include a lower gate electrode constituting a gate of a ground select transistor, memory gate electrodes constituting a plurality of memory cells, and upper gate electrodes constituting gates of string select transistors. The number of the memory gate electrodes constituting the memory cells may be determined according to capacity of the semiconductor device 100. According to an embodiment, each of the upper and lower gate electrodes may be one or two or more, and may have the same or different structure as the memory gate electrodes. In example embodiments, the first gate electrodes 130A may be disposed above the upper gate electrodes and/or below the lower gate electrode, and a first gate electrode 130A constituting an erase transistor used for an erase operation using a gate induced drain leakage (GIDL) phenomenon may further be included. Also, some of the first gate electrodes 130A, e.g., gate electrodes adjacent to the upper or lower gate electrode, may be dummy gate electrodes.

The first gate electrodes 130A may be disposed to be separated in a predetermined unit in the X-direction and the Y-direction by the first and second separation regions MS1 and MS2. First gate electrodes 130A surrounded by a pair of first separation regions MS1 and a second separation region MS2 connected thereto may form a memory block, but a scope of the memory block is not limited thereto.

The first gate electrodes 130A may extend from the first region R1 to the second region R2 at different lengths to form a stepped structure in a portion of the second region R2. The first gate electrodes 130A may be disposed to have a stepped structure with each other in the Y-direction. Due to the stepped structure, each of the first gate electrodes 130A may extend to have a lower first gate electrode 130A, longer than an upper first gate electrode 130A, to have pad regions of which upper surfaces are exposed from the interlayer insulating layers 120 and a different first gate electrode 130A in an upward direction. The first gate electrodes 130A may be respectively connected to separate gate contacts in the pad regions to receive an electrical signal from the upper interconnection structure. The first gate electrodes 130A may have an increased thickness in the pad regions.

The second gate electrodes 130B may be vertically spaced apart and stacked on the plate layer 101 to form the dummy structure DS. The second gate electrodes 130B may be stacked in the same number as the first gate electrodes 130A. The second gate electrodes 130B may be located on substantially the same level as the first gate electrodes 130A, respectively. The second gate electrodes 130B may extend to have substantially the same length in the X-direction and the Y-direction without forming a step difference with each other.

The second gate electrodes 130B may be in a floating state to which no electrical signal is applied. Alternatively, even when an electrical signal is applied to the second gate electrodes 130B, the second gate electrodes 130B may not constitute a memory cell in the semiconductor device 100. A gate plug for applying an electrical signal may not be connected to the second gate electrodes 130B.

The first and second gate electrodes 130A and 130B may include a metal material, e.g., tungsten (W). In some embodiments, the first and second gate electrodes 130A and 130B may include polycrystalline silicon or a metal silicide material. In example embodiments, the first and second gate electrodes 130A and 130B may further include a diffusion barrier, and, e.g., the diffusion barrier may include tungsten nitride (WN), tantalum nitride (TaN), titanium nitride (TiN), or a combination thereof.

The interlayer insulating layers 120 may be disposed between the first and second gate electrodes 130A and 130B, stacked in the Z-direction. Like the first and second gate electrodes 130A and 130B, the interlayer insulating layers 120 may also be disposed to be spaced apart from each other in a direction perpendicular to the upper surface of the plate layer 101. The interlayer insulating layers 120 may include an insulating material, e.g., silicon oxide or silicon nitride.

The first separation regions MS1 may pass through the first and second stack structures ST1 and ST2, and may extend in one direction, e.g., the X-direction. Specifically, the first separation regions MS1 may pass through the first gate electrodes 130A, the interlayer insulating layers 120, and the first and second horizontal conductive layers 102 and 104 to extend in the X-direction, and lower ends of the first separation regions MS1 may be connected to the plate layer 101. As illustrated in FIG. 1, the first separation regions MS1 may be disposed parallel to each other. In the first separation regions MS1, end portions facing the dummy structure DS may be connected to the second separation regions MS2. In example embodiments, the number of first separation regions MS1 passing through each of the first and second stack structures ST1 and ST2 may be variously changed. In addition, gaps between the first separation regions MS1 in the first regions R1 and the second regions R2 in the Y-direction may be different from each other, and specific arrangement may be variously changed in embodiments.

The second separation regions MS2 may be disposed between each of the first and second stack structures ST1 and ST2 and the dummy structure DS to define the dummy structure DS. The second separation regions MS2 may extend in a direction, intersecting the first separation regions MS1, e.g., in the Y-direction, and may be connected to the first separation regions MS1. The second separation regions MS2 may be included to minimize a spare region in the semiconductor device 100 and to improve a degree of integration.

The first and second separation regions MS1 and MS2 may have substantially the same internal structure. This is because the first and second separation regions MS1 and MS2 are formed together in the same process operation, e.g., simultaneously and of the same materials. Levels of upper surfaces of the first and second separation regions MS1 and MS2 may be equal to each other, e.g., coplanar. The first and second separation regions MS1 and MS2 may have shapes in which widths decrease toward the plate layer 101 due to a high aspect ratio. The first and second separation regions MS1 and MS2 may include isolation insulating layers 105 disposed in trenches. The isolation insulating layers 105 may include an insulating material, e.g., silicon oxide, silicon nitride, or silicon oxynitride.

Each of the channel structures CH may form one memory cell string. The channel structures CH may pass through the first and second stack structures ST1 and ST2, e.g., in the Z-direction, and may be disposed to be spaced apart from each other while forming rows and columns on the plate layer 101. For example, the channel structures CH may be disposed to form a grid pattern on an X-Y plane, or may be disposed in a zigzag shape in one direction. The channel structures CH may have a columnar shape filling a channel hole, and may have inclined side surfaces that become narrower toward the plate layer 101 according to an aspect ratio. In some embodiments, the channel structures CH may have a form in which a plurality of channel structures are stacked and connected in the Z-direction.

Each of the channel structures CH may include a channel layer 140, a channel dielectric layer 145, a channel buried insulating layer 150, and a channel pad 155, disposed in the channel hole. For example, as illustrated in FIG. 3A, the channel layer 140 may be formed in an annular shape surrounding the channel buried insulating layer 150 therein. In another example, the channel layer 140 may have a columnar shape, e.g., a cylinder or a prism, without the channel buried insulating layer 150. The channel layer 140 may be connected to the first horizontal conductive layer 102 through a side surface of the channel layer 140 in a lower portion of the channel layer 140. A lower surface of the channel layer 140 may be covered with the channel dielectric layer 145, and may be spaced apart from the plate layer 101 by the channel dielectric layer 145. The channel layer 140 may include a semiconductor material, e.g., polycrystalline silicon or single crystal silicon.

The channel dielectric layer 145 may be disposed between the gate electrodes 130A and 130B and the channel layer 140. The channel dielectric layer 145 may include a tunneling layer, a charge storage layer, and a blocking layer, sequentially stacked from the channel layer 140. The tunneling layer may tunnel charges into the charge storage layer, and may include, e.g., silicon oxide ($SiO_2$), silicon nitride ($Si_3N_4$), silicon oxynitride (SiON), or a combination thereof. The charge storage layer may be a charge trapping layer or a floating gate conductive layer. The blocking layer may include silicon oxide ($SiO_2$), silicon nitride ($Si_3N_4$), silicon oxynitride (SiON), a high-κ dielectric material, or a combination thereof. In example embodiments, at least a portion of the channel dielectric layer 145 may extend along the gate electrodes 130A and 130B in a horizontal direction.

The channel pad 155 may be disposed on an upper end of the channel structure CH. The channel pad 155 may include, e.g., doped polycrystalline silicon.

The first and second source contact structures 180 and 185 may extend in the Z-direction, and may be connected to the plate layer 101 of the source structure SS through lower surfaces thereof. The first and second source contact structures 180 and 185 may transmit an electrical signal applied from the upper interconnection structure to the source structure SS. The first source contact structures 180 may be disposed to pass through the dummy structure DS, e.g., so first source contact structures 180 may extend between the first and second stack structures ST1 and T2 while connecting to the plate layer 101. The second source contact structures 185 may be formed on an outside of the first and second stack structures ST1 and ST2. That is, as illustrated in FIG. 1, the second source contact structures 185 may be disposed on outer side surfaces of the first and second stack structures ST1 and ST2 that are not facing the dummy structure DS, e.g., a combined outer perimeter of the first and second stack structures ST1 and ST2 may be surrounded by the second source contact structures 185. For example, as illustrated in FIG. 1, the side surfaces of, e.g., each of, the first and second stack structures ST1 and ST2 may be surrounded by the first and second source contact structures 180 and 185, respectively.

Upper surfaces or upper ends of the first source contact structures 180 may be located on a level higher than a level of an upper end of the dummy structure DS, e.g., relative to the upper surface of the plate layer 101. The upper surfaces of the first source contact structures 180 may be located on a level higher than upper surfaces of the channel structures CH, e.g., relative to the upper surface of the plate layer 101. The first source contact structures 180 may pass through the dummy structure DS, and may further pass through the second horizontal conductive layer 104, to be connected to the plate layer 101. The first source contact structures 180 may or may not partially recess the plate layer 101. As illustrated in FIG. 1, the first source contact structures 180 may be arranged in a zigzag shape in one direction, such that columns in the X-direction may be shifted from each other in the Y-direction, in a plan view. In example embodiments, the number of the first source contact structures 180, an arrangement shape of the first source contact structures 180 on a plane, or the like may be variously changed.

Since the first and second source contact structures 180 and 185 have different electrical functions from the channel structures CH, internal structures thereof may be different. As illustrated in FIG. 3B, the first source contact structures 180 may include a contact insulating layer 182 on an inner wall of a contact hole having a cylindrical shape, and a contact layer 184, which is conductive, filling the contact hole. The contact insulating layer 182 may be formed between the interlayer insulating layers 120 and the contact layer 184, and between the second gate electrodes 130B and the contact layer 184, to cover a side surface of the contact layer 184 and extend in the Z-direction. The contact insulating layer 182 may entirely surround the side surface of the contact layer 184. The contact layer 184 may be in direct contact with and electrically connected to the plate layer 101 through a lower surface thereof, may be spaced apart from the second gate electrodes 130B by the contact insulating layer 182, and may be electrically isolated from the second gate electrodes 130B.

The contact insulating layer 182 may include an insulating material, e.g., silicon oxide, silicon nitride, or silicon oxynitride. The contact layer 184 may include a conductive material, e.g., at least one of tungsten (W), aluminum (Al), copper (Cu), or polycrystalline silicon (Si).

The second source contact structures 185 may be disposed on an outside of the first gate electrodes 130A, e.g., on an outside thereof not facing the dummy structure DS. The second source contact structures 185 may pass through the cell region insulating layer 190 to be connected to the plate layer 101. In some embodiments, at least a portion of the second source contact structures 185 may be disposed to pass through the first and second stack structures ST1 and ST2 in the second regions R2 or at a boundary between the first regions R1 and the second regions R2. The second source contact structures 185 may have the same structure as the first source contact structures 180, e.g., the same internal structure including the contact insulating layer 182 and the contact layer 184, respectively. In some embodiments, the contact insulating layers 182 of the second source contact structures 185 may not be distinguished from the cell region insulating layer 190.

In the semiconductor device 100, in addition to the second source contact structures 185, since first source contact structures 180 passing through the dummy structure DS may further be disposed, noise of an electrical signal transmitted to memory cells adjacent to the dummy structure DS may be reduced to secure electrical characteristics.

The contact plugs 160 may be disposed on the channel structures CH and the first and second source contact structures 180 and 185. The contact plugs 160 may include first and second contact plugs 162 and 164, sequentially stacked in the Z-direction. The first and second contact plugs 162 and 164 may be equally disposed on the channel structures CH and the first and second source contact structures 180 and 185. According to a difference in height between the channel structures CH and the first and second source contact structures 180 and 185, e.g., along the Z-direction, lengths of the first contact plugs 162 on the channel structures CH and the first and second source contact structures 180 and 185 may be different from each other, e.g., along the Z-direction.

The contact plugs 160 may have a cylindrical shape, and may have inclined side surfaces such that widths decrease toward the plate layer 101 according to an aspect ratio. The contact plugs 160 may electrically connect the channel structures CH and the first and second source contact structures 180 and 185 to the first and second interconnection lines 170C and 170P. The contact plugs 160 may be formed of a conductive material, e.g., at least one of tungsten (W), aluminum (Al), or copper (Cu).

The first and second interconnection lines 170C and 170P may form the upper interconnection structure together with the contact plugs 160. The first and second interconnection lines 170C and 170P may be disposed on substantially the same height level, e.g., relative to the plate layer 101. The first interconnection lines 170C may be disposed on the first and second stack structures ST1 and ST2, and the second interconnection lines 170P may be disposed on the dummy structure DS and may be disposed outside or around the first and second stack structures ST1 and ST2. As illustrated in FIG. 1, in a plan view, the second interconnection lines 170P may be disposed to surround the first interconnection lines 170C.

The first interconnection lines 170C may overlap the first and second stack structures ST1 and ST2 in the Z-direction, to extend in one direction, e.g., the Y-direction. The first interconnection lines 170C may be electrically connected to the channel structures CH. In some embodiments, the first interconnection lines 170C may also be electrically connected to the first gate electrodes 130A. The first interconnection lines 170C may include, e.g., bit lines or lines electrically connected to the bit lines.

The second interconnection lines 170P may include first peripheral lines 170P1 connected to the first source contact structures 180, and second peripheral lines 170P2 connected to the second source contact structures 185. The first peripheral lines 170P1 may overlap the dummy structure DS in the Z-direction, and may extend in one direction, e.g., the Y-direction. The first peripheral lines 170P1 may be connected to the second peripheral lines 170P2 in end portions in the Y-direction. The first peripheral lines 170P1 may receive electrical signals from the second peripheral lines 170P2. The number and separation distance of the first peripheral lines 170P1, disposed on the dummy structure DS, may be variously changed in some embodiments.

The second peripheral lines 170P2 may be disposed on an outside of the first and second stack structures ST1 and ST2, except for side surfaces on which the first and second stack structures ST1 and ST2 face each other, and may extend in at least one direction. For example, the second peripheral lines 170P2 may extend in the X-direction, on an outside second side surfaces facing first side surfaces on which the first and second stack structures ST1 and ST2 face each other, among the side surfaces of the first and second stack structures ST1 and ST2. The second peripheral lines 170P2 may extend in the X-direction and the Y-direction and may be arranged in a grid shape, outside side surfaces extending in the X-direction among the side surfaces of the first and second stack structures ST1 and ST2. In embodiments, a specific arrangement of the second peripheral lines 170P2 is not limited thereto.

The cell region insulating layer 190 may be disposed to cover the first and second stack structures ST1 and ST2 and the dummy structure DS. The cell region insulating layer 190 may be disposed to cover the first and second gate electrodes 130A and 130B and the channel structures CH. The cell region insulating layer 190 may include a plurality of insulating layers according to embodiments. The cell region insulating layer 190 may be formed of an insulating material, e.g., at least one of silicon oxide, silicon nitride, or silicon oxynitride.

Figure 4:
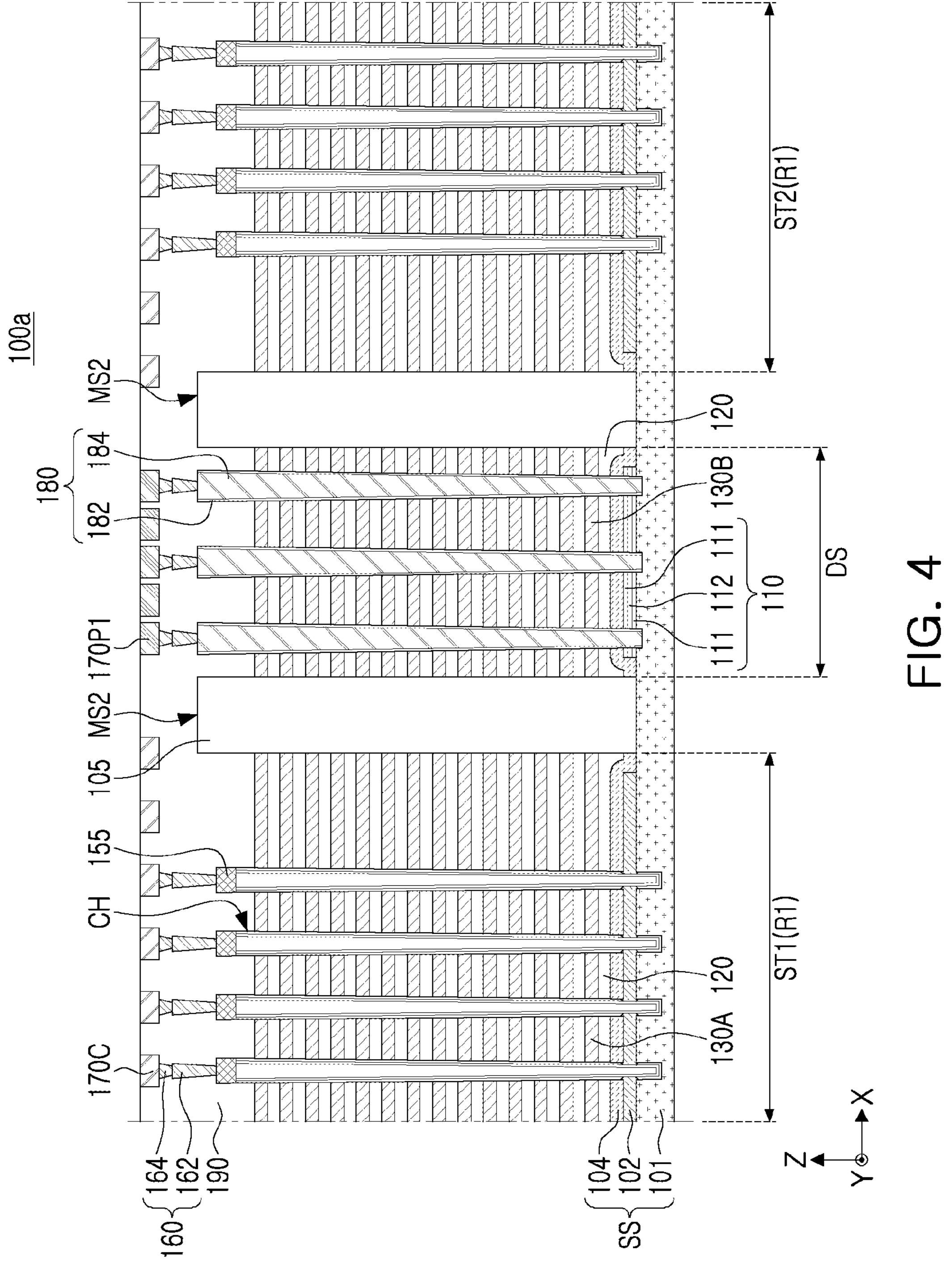
FIG. 4 is a cross-sectional view schematically illustrating a semiconductor device according to example embodiments.

FIG. 4 is a cross-sectional view schematically illustrating a semiconductor device according to example embodiments. FIG. 4 illustrates a region corresponding to FIG. 2B.

Referring to FIG. 4, in a semiconductor device 100*a*, a horizontal insulating layer 110 may further be disposed below a dummy structure DS. The horizontal insulating layer 110 and a second horizontal conductive layer 104 may be sequentially disposed on the plate layer 101, below the dummy structure DS. Therefore, first source contact structures 180 may pass through the horizontal insulating layer 110 and the second horizontal conductive layer 104 to be connected to the plate layer 101.

The semiconductor device 100*a* may be manufactured by not removing the horizontal insulating layer 110 on the plate layer 101, in a region in which the dummy structure DS is formed, during the manufacturing process. As such, in embodiments, specific arrangements of the second horizontal conductive layer 104 and the horizontal insulating layer 110 below the dummy structure DS may be variously changed.

Figure 5A:
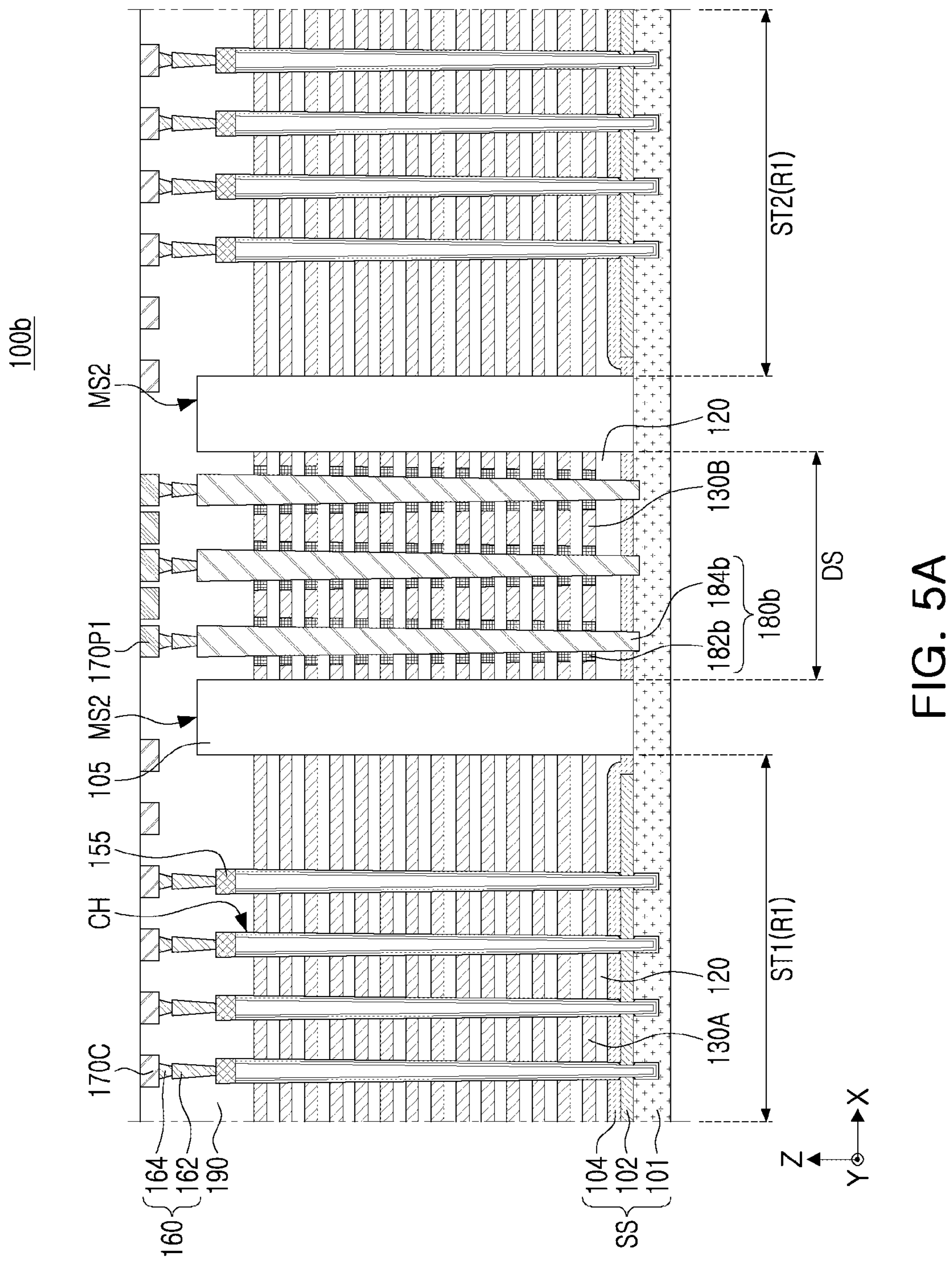
FIGS. 5A and 5B are cross-sectional views schematically illustrating a semiconductor device according to example embodiments.
Figure 5B:
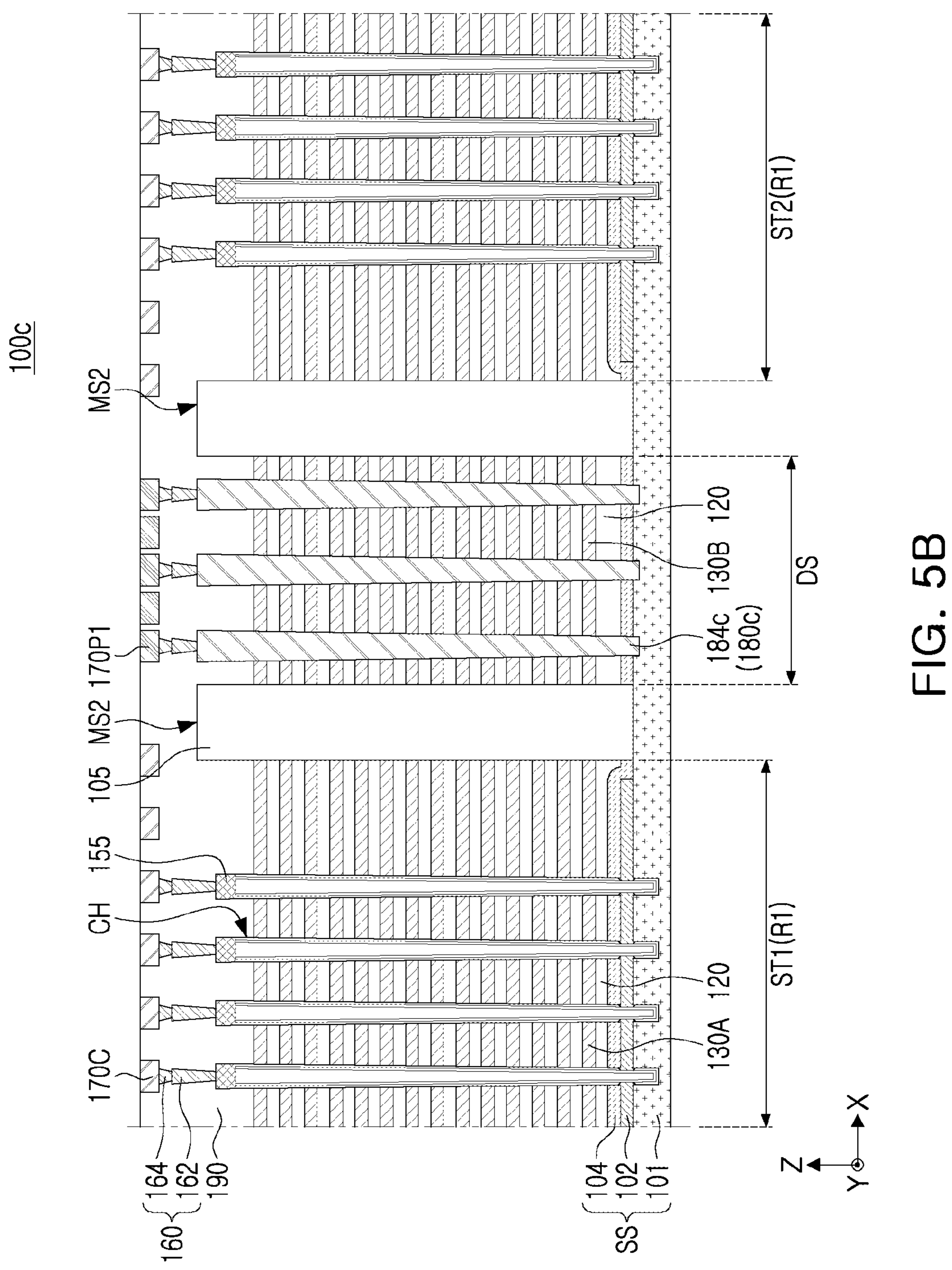

FIGS. 5A and 5B are cross-sectional views schematically illustrating a semiconductor device according to example embodiments. FIGS. 5A and 5B illustrate a region corresponding to FIG. 2B.

Referring to FIG. 5A, in a semiconductor device 100*b*, first source contact structures 180*b* may include a contact layer 184*b* and a plurality of contact insulating layers 182*b* disposed to be spaced apart around the contact layer 184*b* in the Z-direction, respectively. The contact insulating layers 182*b* may be respectively disposed on the same level as the second gate electrodes 130B. The contact insulating layers 182*b* may not extend onto side surfaces of interlayer insulating layers 120, and may be interposed only between the second gate electrodes 130B and the contact layer 184*b*. In some embodiments, the contact insulating layers 182*b* may have side surfaces protruding or recessed toward the contact layer 184*b*, compared to the interlayer insulating layers 120.

The semiconductor device 100*b* may be manufactured, e.g., by forming contact holes in which the first source contact structures 180*b* are disposed during the manufacturing process, and then oxidizing sacrificial insulating layers 118 exposed through the contact holes to form the contact insulating layers 182*b*. Therefore, the contact insulating layers 182*b* may be formed around the contact holes. In this case, the contact insulating layers 182*b* may include, e.g., silicon oxide or silicon oxynitride.

Referring to FIG. 5B, in a semiconductor device 100*c*, first source contact structures 180*c* may include only a contact layer 184*c*, respectively. The contact layer 184*c* may be in direct contact with the second gate electrodes 130B through a side surface thereof, and may be in direct contact with the plate layer 101 through a lower surface thereof. Even in this case, since the second gate electrodes 130B of a dummy structure DS may not be electrically connected to other components, an operation of the semiconductor device 100*c* may not be affected.

Figure 6:
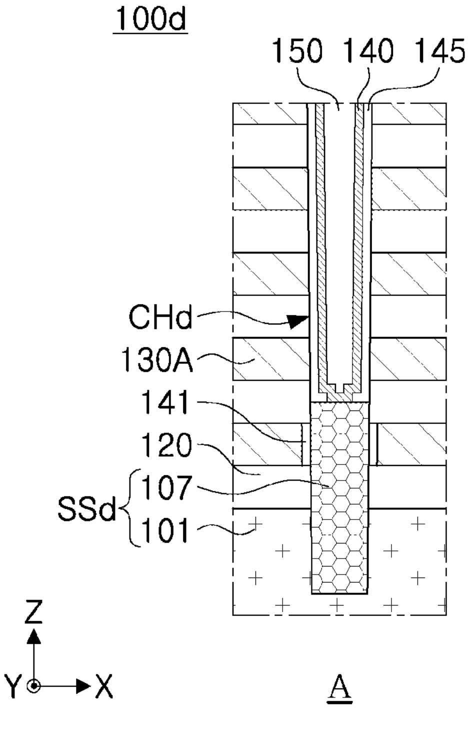
FIG. 6 is a partially enlarged view schematically illustrating a semiconductor device according to example embodiments.

FIG. 6 is a partially enlarged view schematically illustrating a semiconductor device according to example embodiments. FIG. 6 illustrates a region corresponding to FIG. 3A.

Referring to FIG. 6, unlike in the embodiment of FIGS. 2A to 3B, a semiconductor device 100*d* may not include the first and second horizontal conductive layers 102 and 104 on the plate layer 101. In addition, a source structure SSd may further include an epitaxial layer 107 disposed below a channel structure CHd, in addition to the plate layer 101.

The epitaxial layer 107 may be disposed on the plate layer 101 below the channel structure CHd, and may be disposed on a side surface of at least one lowermost first gate electrode 130A. The epitaxial layer 107 may be disposed in a recessed region of the plate layer 101. A height level of an upper surface of the epitaxial layer 107 may be higher than a height level of an upper surface of the lowermost first gate electrode 130A, and may be lower than a height level of a lower surface of a first gate electrode 130A on the lowermost first gate electrode 130A. The epitaxial layer 107 may be connected to a lower surface of the channel layer 140 through an upper surface of the epitaxial layer 107. A gate insulating layer 141 may further be disposed between the epitaxial layer 107 and the lowermost first gate electrode 130A adjacent thereto.

In the present embodiment, the first source contact structure 180 (in FIG. 2B) may pass through the dummy structure DS, and may be in direct contact with the plate layer 101. Shapes of the channel structure CHd and the source structure SSd, as described above, may be applied to other embodiments.

Figure 7A:
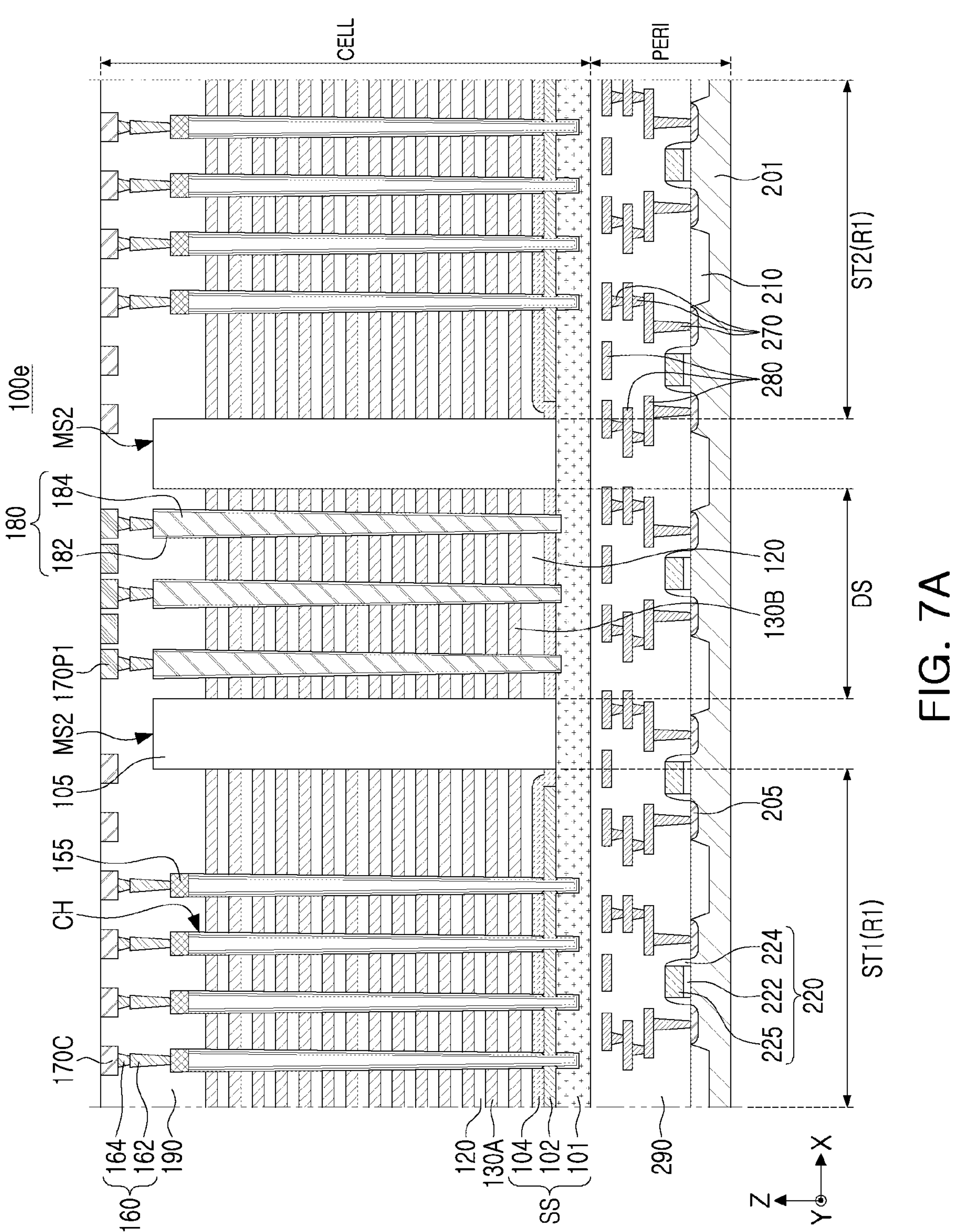
FIGS. 7A and 7B are schematic cross-sectional views of a semiconductor device according to example embodiments.
Figure 7B:
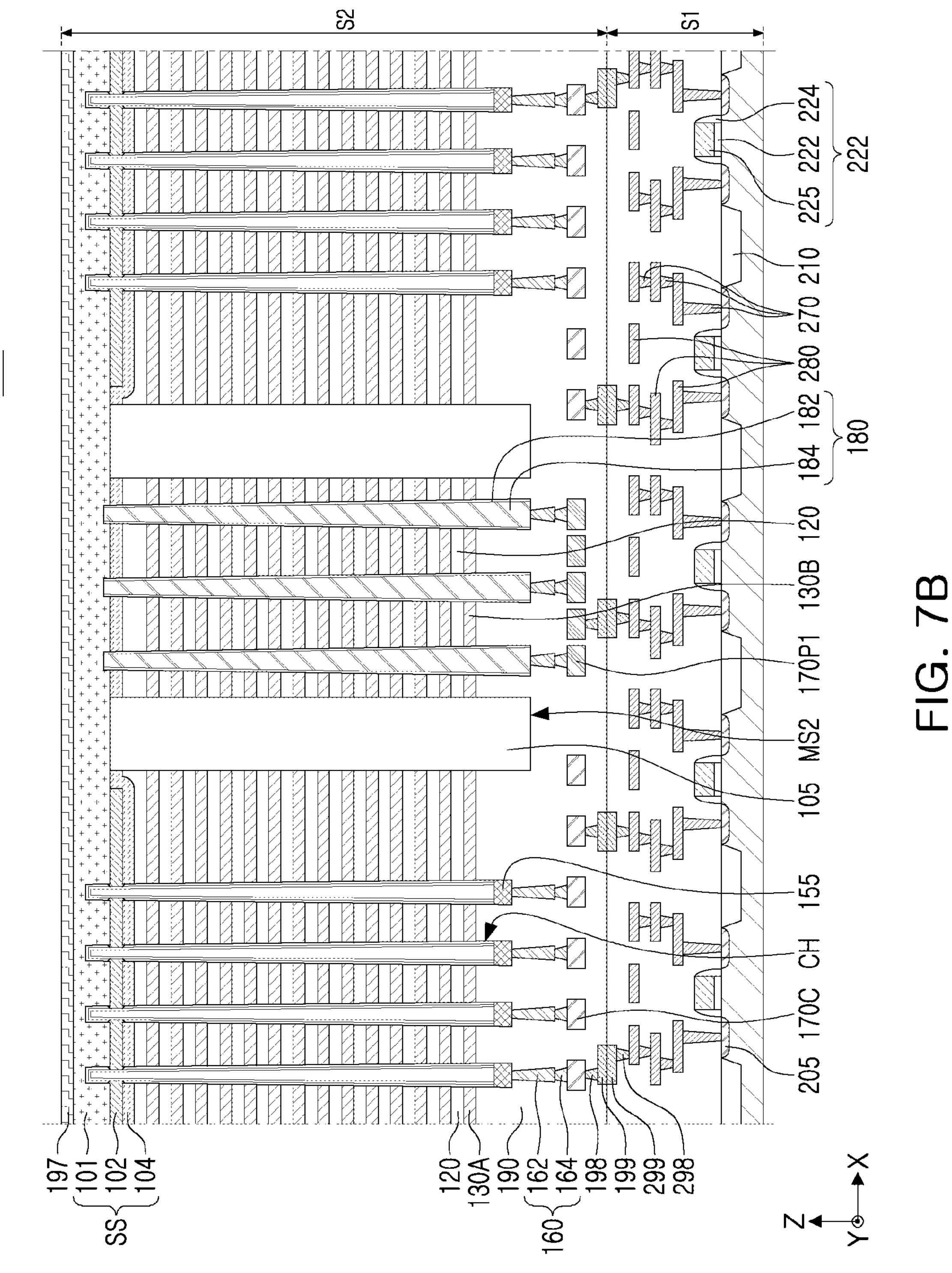

FIGS. 7A and 7B are schematic cross-sectional views of a semiconductor device according to example embodiments. FIGS. 7A and 7B illustrate a region corresponding to FIG. 2B.

Referring to FIG. 7A, a semiconductor device 100*e* may include a memory cell region CELL and a peripheral circuit region PERI, stacked vertically. The memory cell region CELL may be disposed on the peripheral circuit region PERI. For example, in the semiconductor device 100 of FIG. 2B, the peripheral circuit region PERI may be disposed on the plate layer 101 in a region not illustrated, or the peripheral circuit region PERI may be disposed below the plate layer 101, as in the semiconductor device 100*e* of the present embodiment. In example embodiments, the cell region CELL may be disposed below the peripheral circuit region PERI. For a description of the memory cell region CELL, the same description with reference to FIGS. 1 to 3B may be applied.

The peripheral circuit region PERI may include a base substrate 201, circuit elements 220 disposed on the base substrate 201, circuit contact plugs 270, and circuit interconnection lines 280.

The base substrate 201 may have an upper surface extending in the X-direction and the Y-direction. Device isolation layers 210 may be formed on the base substrate 201 to define an active region. Source/drain regions 205 including impurities may be disposed in a portion of the active region. The base substrate 201 may include a semiconductor material, e.g., a group IV semiconductor, a group III-V compound semiconductor, or a group II-VI compound semiconductor. The base substrate 201 may be provided as a bulk wafer or an epitaxial layer. In the present embodiment, the plate layer 101 thereon may be provided as a polycrystalline semiconductor layer, e.g., a polycrystalline silicon layer or an epitaxial layer.

The circuit elements 220 may include horizontal transistors. Each of the circuit elements 220 may include a circuit gate dielectric layer 222, a spacer layer 224, and a circuit gate electrode 225. The source/drain regions 205 may be disposed in the base substrate 201 on both sides of the circuit gate electrode 225.

A peripheral region insulating layer 290 may be disposed on the circuit elements 220 on the base substrate 201. The circuit contact plugs 270 may pass through the peripheral region insulating layer 290 to be connected to the source/drain regions 205. An electrical signal may be applied to the circuit elements 220 by the circuit contact plugs 270. In a region not illustrated, circuit contact plugs 270 may also be connected to the circuit gate electrode 225. The circuit interconnection lines 280 may be connected to the circuit contact plugs 270, and may be arranged as a plurality of layers.

In the semiconductor device 100*e*, after the peripheral circuit region PERI is first manufactured, the plate layer 101 of the memory cell region CELL may be formed thereon, to manufacture the memory cell region CELL. The plate layer 101 may have the same size as the base substrate 201, or may be formed to be smaller than the base substrate 201. The memory cell region CELL and the peripheral circuit region PERI may be connected to each other. A configuration in which the memory cell region CELL and the peripheral circuit region PERI are vertically stacked may be applied to other example embodiments.

Referring to FIG. 7B, a semiconductor device 100*f* may include a first semiconductor structure S1 and a second semiconductor structure S2 bonded by a wafer bonding method.

The description of the peripheral circuit region PERI, described above with reference to FIG. 7A, may be applied to the first semiconductor structure S1. The first semiconductor structure S1 may further include first bonding vias 298 and first bonding pads 299, which may be bonding structures. The first bonding vias 298 may be disposed on uppermost ones of the circuit interconnection lines 280 to be connected to the circuit interconnection lines 280. At least a portion of the first bonding pads 299 may be connected to the first bonding vias 298 on the first bonding vias 298. The first bonding pads 299 may be connected to second bonding pads 199 of the second semiconductor structure S2. The first bonding pads 299 together with the second bonding pads 199 may provide an electrical connection path according to bonding between the first semiconductor structure S1 and the second semiconductor structure S2. The first bonding vias 298 and the first bonding pads 299 may include a conductive material, e.g., copper (Cu).

For the second semiconductor structure S2, the descriptions with reference to FIGS. 1 to 3B may be equally applied, unless otherwise specified. The second semiconductor structure S2 may further include second bonding vias 198 and the second bonding pads 199, which may be bonding structures. The second semiconductor structure S2 may further include a protective layer 197 covering the upper surface of the plate layer 101. In some embodiments, the second semiconductor structure S2 may further include additional vias and additional interconnection lines disposed between the second bonding vias 198 and first and second interconnection lines 170C and 170P.

The second bonding vias 198 and the second bonding pads 199 may be disposed below the first and second interconnection lines 170C and 170P. The second bonding vias 198 may be connected to the first and second interconnection lines 170C and 170P and the second bonding pads 199, and the second bonding pads 199 may be bonded to the first bonding pads 299 of the first semiconductor structure S1. The second bonding vias 198 and the second bonding pads 199 may include a conductive material, e.g., copper (Cu).

The first semiconductor structure S1 and the second semiconductor structure S2 may be bonded in a copper (Cu)-copper (Cu) bonding process by the first bonding pads 299 and the second bonding pads 199. In addition to the copper (Cu)-copper (Cu) bonding process, the first semiconductor structure S1 and the second semiconductor structure S2 may be additionally bonded by a dielectric-dielectric bonding process. The dielectric-dielectric bonding process may be a bonding process by a dielectric layer forming a portion of each of a peripheral region insulating layer 290 and a cell region insulating layer 190, and surrounding each of the first bonding pads 299 and the second bonding pads 199, respectively. Therefore, the first semiconductor structure S1 and the second semiconductor structure S2 may be bonded without a separate adhesive layer.

Figure 8:
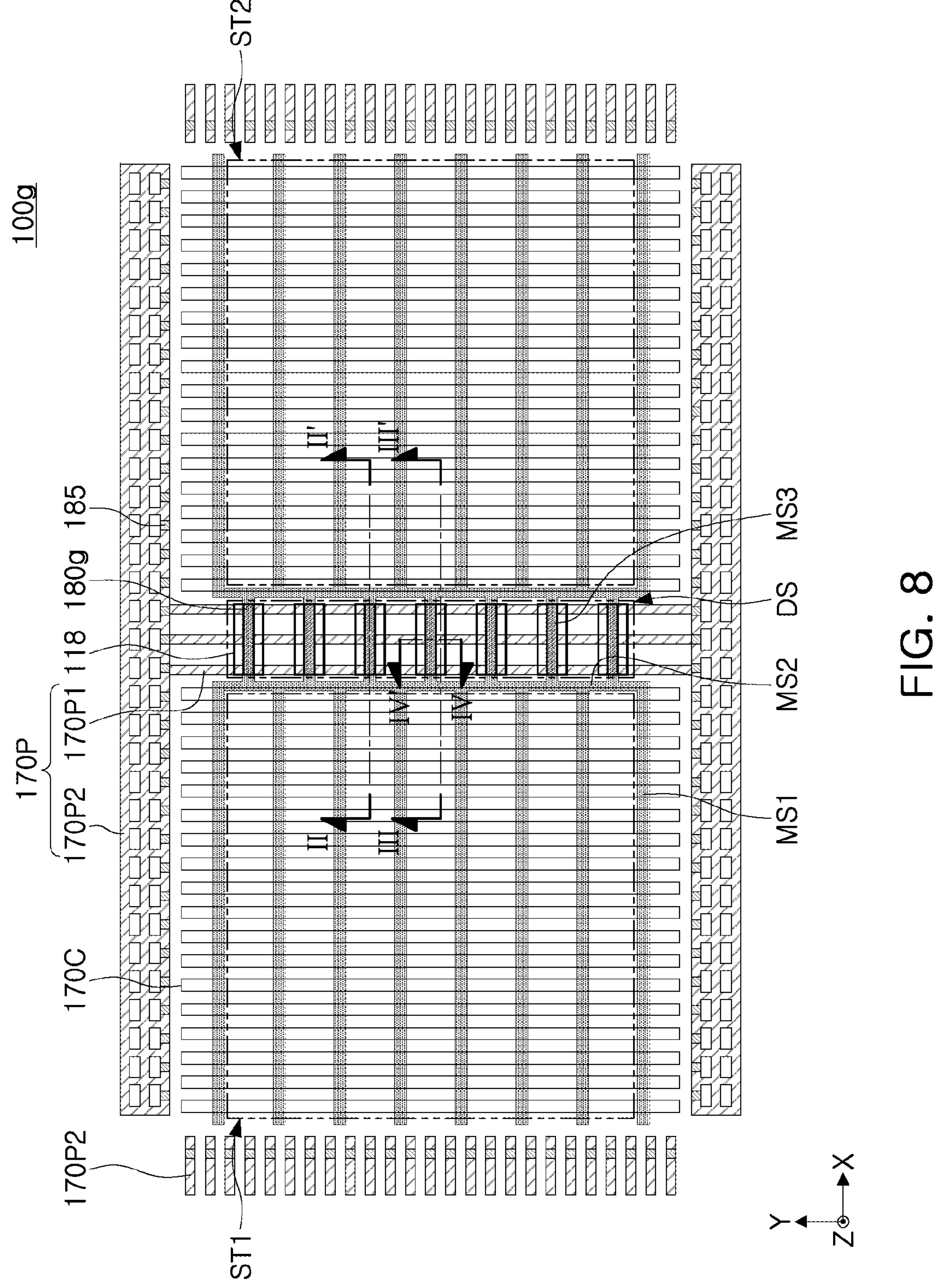
FIG. 8 is a schematic plan view of a semiconductor device according to example embodiments.
Figure 9A:
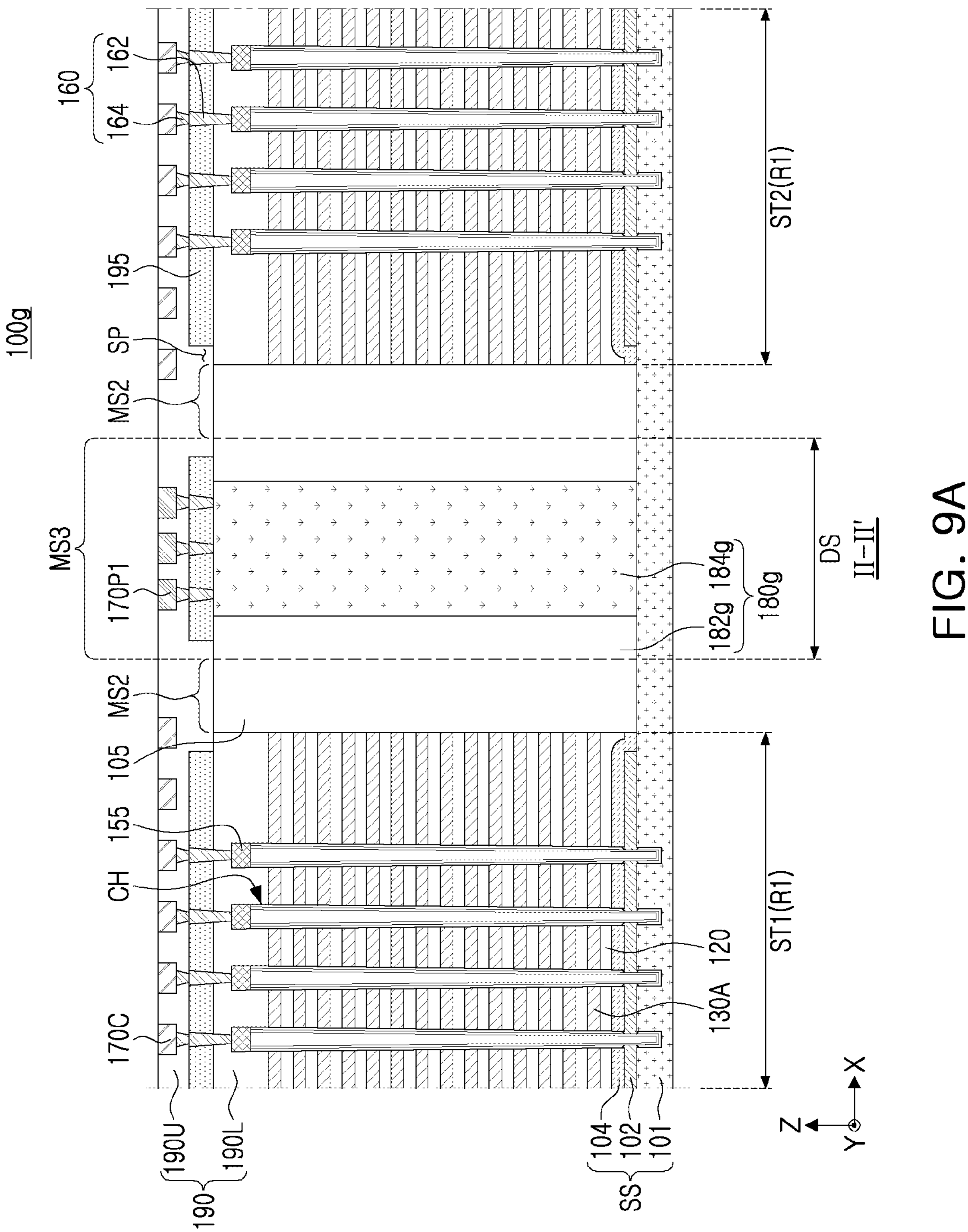
FIGS. 9A to 9C are schematic cross-sectional views of a semiconductor device according to example embodiments.
Figure 9B:
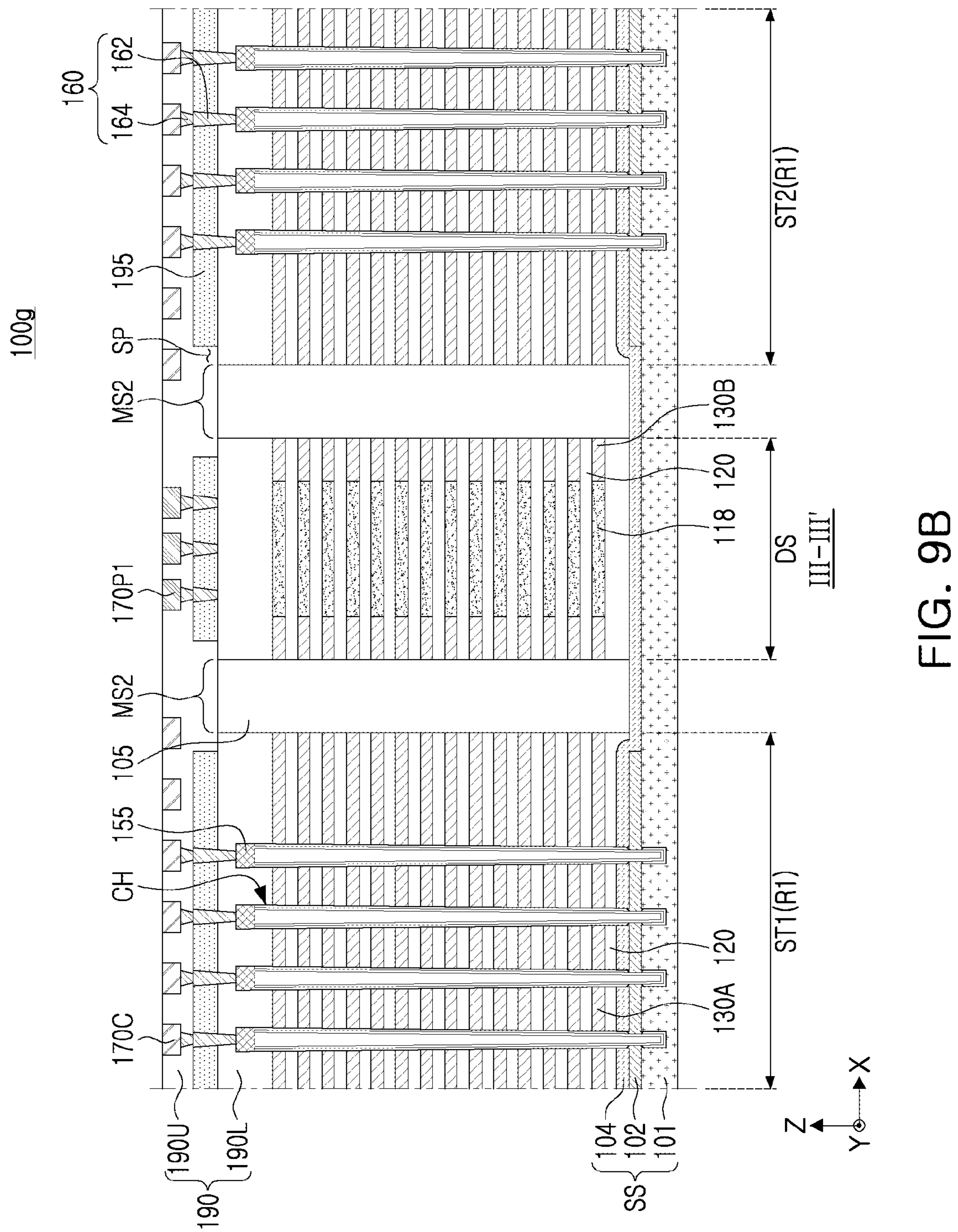
Figure 9C:
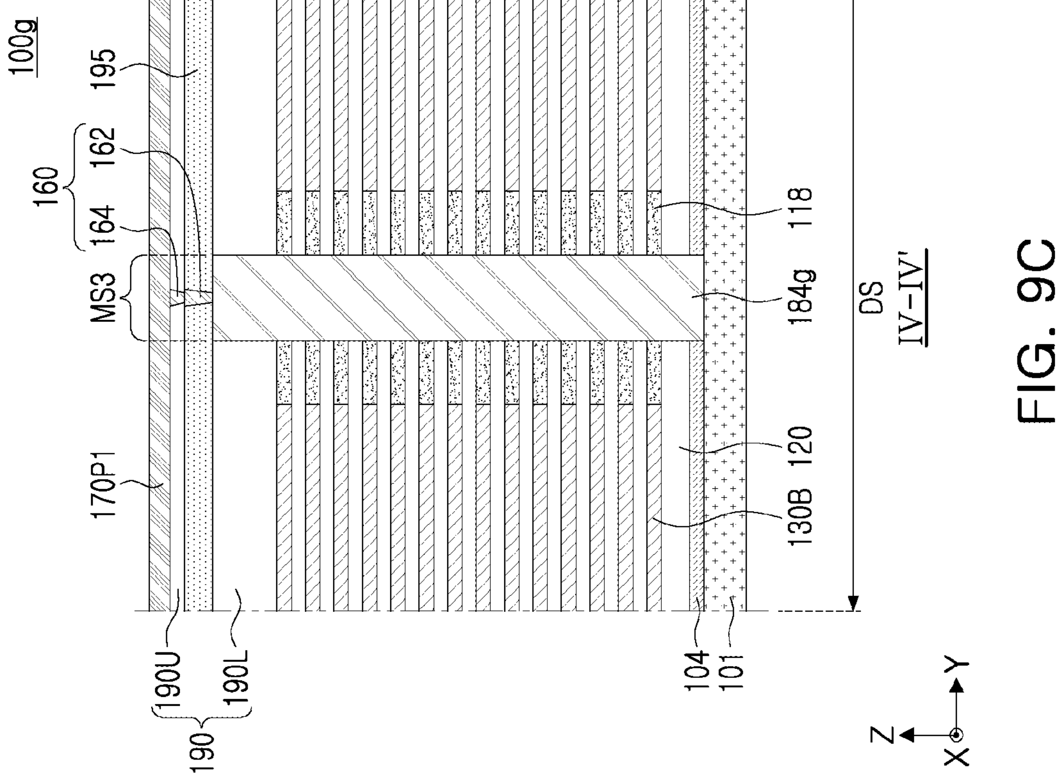

FIG. 8 is a schematic plan view of a semiconductor device according to example embodiments. FIGS. 9A to 9C are schematic cross-sectional views along lines II-II' III-III' and IV-IV' of FIG. 8, respectively.

Referring to FIGS. 8 to 9C, a semiconductor device 100*g* may further include third separation regions MS3 connecting the second separation regions MS2, unlike the embodiment of FIGS. 1 to 3. For example, first source contact structures 180*g* may be respectively disposed in the third separation regions MS3.

The third separation regions MS3 may extend in one direction, e.g., the X-direction, on the dummy structure DS, and may connect two second separation regions MS2 to each other. The third separation regions MS3 may be disposed to be spaced apart from each other in the Y-direction. The third separation regions MS3 may be disposed in a position shifted from, e.g., misaligned with respect to, the first separation regions MS1 in the Y-direction. For example, the third separation regions MS3 may not be disposed on an extension line of the first separation regions MS1, and may be spaced apart from points at which the first separation regions MS1 and the second separation regions MS2 are connected in the Y-direction. Therefore, a region in which all of the first to third separation regions MS1, MS2, and MS3 intersect may not be formed. This is because, when a region where all of the first to third separation regions MS1, MS2, and MS3 intersect is formed, difficulty of a manufacturing process of the semiconductor device 100*g* may increase. The number of the third separation regions MS3 disposed between the second separation regions MS2, and a width of each thereof may be variously changed in some embodiments. Also, in some embodiments, the third separation regions MS3 may extend obliquely in a direction between the X-direction and the Y-direction.

The third separation regions MS3 may be disposed to penetrate the dummy structure DS and the second horizontal conductive layer 104. Upper surfaces of the first to third separation regions MS1, MS2, and MS3 may have the same level, e.g., coplanar, as each other. The third separation regions MS3 may have a shape in which a width decreases toward the plate layer 101 due to a high aspect ratio. Each of the third separation regions MS3 may include the first source contact structure 180*g*. The third separation regions MS3 may have different internal structures from the first and second separation regions MS1 and MS2. This is due to a position of an upper support layer 195 disposed on the third separation regions MS3. This will be described in more detail below with reference to FIGS. 15A to 18B.

Each of the first source contact structures 180*g* may have a first length in the X-direction, and may have a second length, shorter than the first length, in the Y-direction, along the third separation regions MS3. Each of the first source contact structures 180*g* may have, e.g., a linear shape, a rectangular shape, an elliptical shape, or an elongated shape, extending relatively long in the X-direction, in the third separation regions MS3. The first source contact structure 180*g* may include a contact layer 184*g*. Both side surfaces of the contact layer 184*g* in the X-direction may be covered with contact insulating layers 182*g* including the isolation insulating layer 105. Both side surfaces of the contact layer 184*g* in the Y-direction may be in contact with the interlayer insulating layers 120 and sacrificial insulating layers 118, as illustrated in FIG. 9C. In the present embodiment, the contact layer 184*g* may include, e.g., polycrystalline silicon (Si). Each of the first source contact structures 180*g* may be connected to at least one of the first and second contact plugs 162 and 164.

As illustrated in FIG. 9B, in the dummy structure DS, in the third separation regions MS3, e.g., in regions adjacent to the first source contact structures 180*g* in the Y-direction, the sacrificial insulating layers 118, instead of the second gate electrodes 130B, may be alternately stacked with the interlayer insulating layers 120. The sacrificial insulating layers 118 may be layers remaining without being replaced with the second gate electrodes 130B during the manufacturing process of the semiconductor device 100*g*. The sacrificial insulating layers 118 may be respectively disposed on substantially the same level as the second gate electrodes 130B, and side surfaces thereof may be in contact with the second gate electrodes 130B. The sacrificial insulating layers 118 may include an insulating material different from that of the interlayer insulating layers 120.

The upper support layer 195 may be a layer for preventing leaning of the first and second stack structures ST1 and ST2 during the manufacturing process of the semiconductor device 100*g*. The upper support layer 195 may be disposed between lower and upper cell region insulating layers 190L and 190U. The upper support layer 195 may be disposed on the first to third separation regions MS1, MS2, and MS3, and may have upper openings SP. The upper openings SP may be disposed on the first separation regions MS1 at predetermined intervals in the X-direction, and may be disposed on the second separation regions MS2 at predetermined intervals in the Y-direction. The upper openings SP may not be located on the third separation regions MS3, e.g., the upper openings SP may not vertically overlap the contact layer 184*g* (FIG. 9C). The upper openings SP may be disposed on the first separation regions MS1 to have a width wider than a width of the first separation regions MS1 in the Y-direction, and may be disposed on the second separation regions MS2 to have a width wider than a width of the second separation region MS2 in the X-direction.

The upper support layer 195 may be disposed to cover an upper surface of the contact layer 184*g*. The upper support layer 195 may be disposed on the contact layer 184*g* in the X-direction to have a length, longer than a length of the contact layer 184*g*. Therefore, during the manufacturing process, a vertical sacrificial layer 116 (see FIG. 17A) may remain without being removed to form the contact layer 184*g*, and the sacrificial insulating layers 118 may remain around the contact layer 184*g*.

The upper support layer 195 may be formed of an insulating material, at least one of silicon oxide, silicon nitride, or silicon oxynitride. The upper support layer 195 may be formed of the same or different material as the cell region insulating layer 190. When the upper support layer 195 is formed of the same material as the cell region insulating layer 190, a boundary therebetween may not be distinguished.

Figure 10:
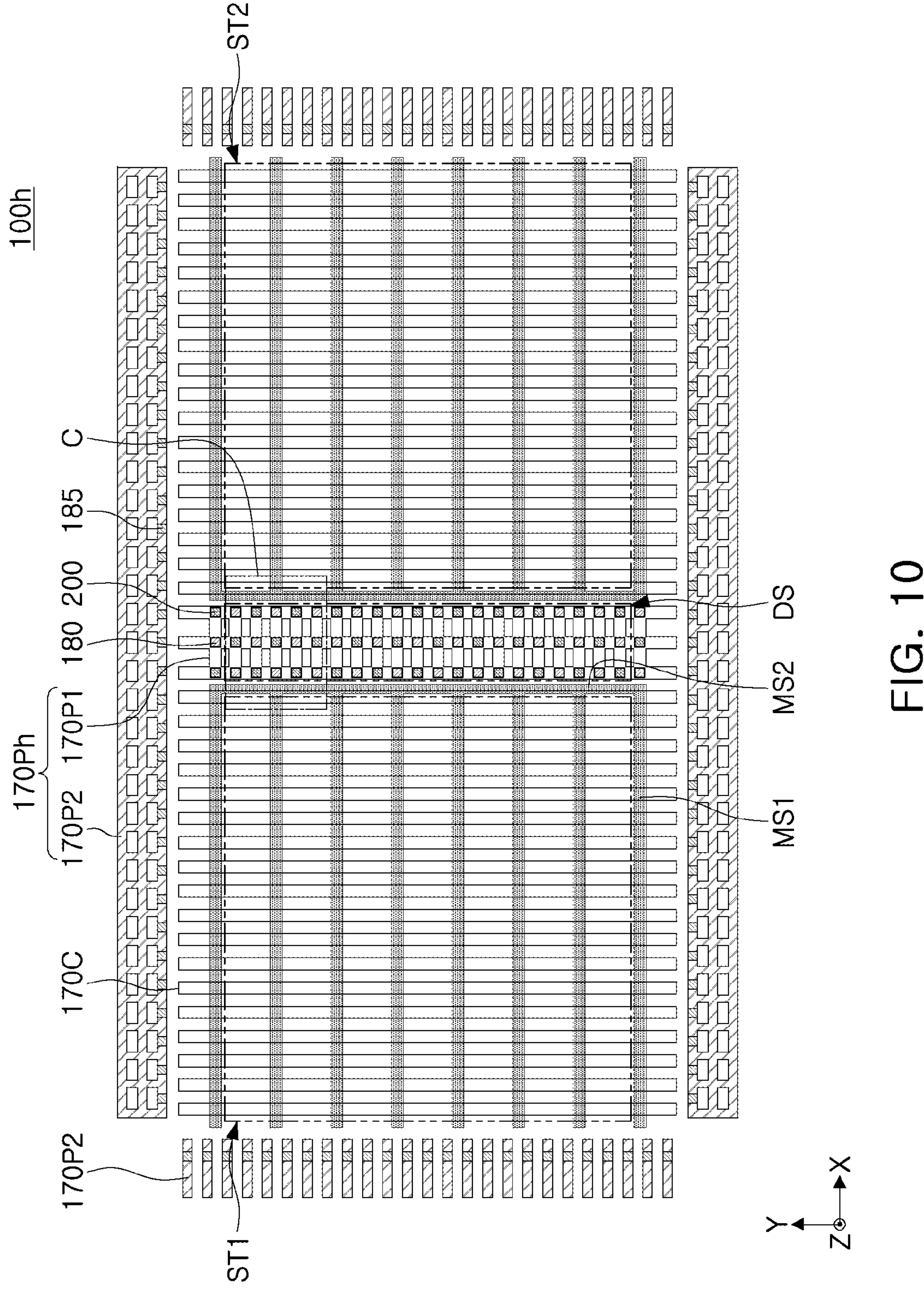
FIG. 10 is a schematic plan view of a semiconductor device according to example embodiments.
Figure 11:
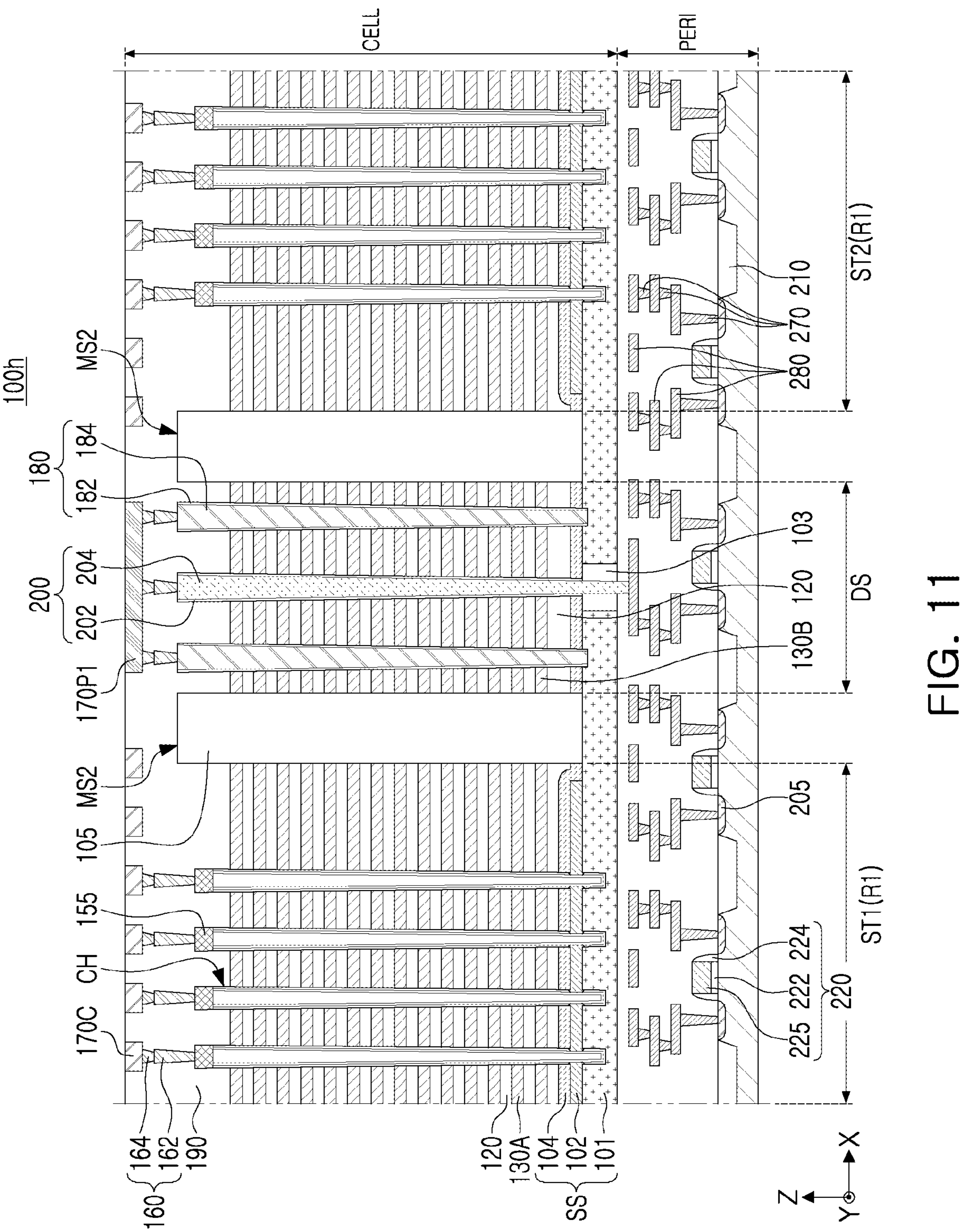
FIG. 11 is a schematic cross-sectional view of a semiconductor device according to example embodiments.

FIG. 10 is a schematic plan view of a semiconductor device according to example embodiments. FIG. 11 is a schematic cross-sectional view of a semiconductor device according to example embodiments. FIG. 11 illustrates a cross-sectional view corresponding to FIG. 2B.

Referring to FIGS. 10 and 11, a semiconductor device 100*h* may include a memory cell region CELL and a peripheral circuit region PERI, stacked vertically, as in the embodiment of FIG. 7A, and through-vias 200 passing through the memory cell region CELL and connected to the circuit interconnection lines 280 of the peripheral circuit region PERI may further be included. Unlike the embodiment of FIG. 1, in the semiconductor device 100*h*, first peripheral lines 170P1 of second interconnection lines 170Ph, disposed on the dummy structure DS, may not be connected to second peripheral lines 170P2.

The through-vias 200 may pass through the dummy structure DS, and may further pass through the second horizontal conductive layer 104, the plate layer 101, and a substrate insulating layer 103 below the dummy structure DS, to be connected to the uppermost circuit interconnection lines 280. As illustrated in FIG. 10, the through-vias 200 may pass through the dummy structure DS, and may be disposed in rows and columns together with the first source contact structures 180. In the present embodiment, the through-vias 200 and the first source contact structures 180 may be disposed to overlap the first peripheral lines 170P1, and may be alternately arranged in each of the X-direction and the Y-direction, which may be extension directions of the first peripheral lines 170P1.

The through-vias 200 may have a cylindrical shape similar to the first source contact structures 180. Each of the through-vias 200 may include a through-insulating layer 202 covering an inner wall of a through-hole, and a through-conductive layer 204 filling the through-hole. The through-conductive layer 204 may be separated from second gate electrodes 130B by the through-insulating layer 202. The through-conductive layer 204 may be spaced apart from the plate layer 101 by the substrate insulating layer 103. The substrate insulating layer 103 may be disposed to surround the through-conductive layer 204 on the same level as the plate layer 101. In the present embodiment, the substrate insulating layer 103 may be disposed to surround each of the through-vias 200.

The through-insulating layer 202 and the substrate insulating layer 103 may include an insulating material, e.g., silicon oxide, silicon nitride, or silicon oxynitride. The through-conductive layer 204 may include a conductive material, e.g., may include at least one of tungsten (W), aluminum (Al), copper (Cu), or polycrystalline silicon (Si).

The first peripheral lines 170P1 may be disposed on the dummy structure DS, and may electrically connect the first source contact structures 180 and the through-vias 200. The first peripheral lines 170P1 of the present embodiment may not be connected to and may be spaced apart from the second peripheral lines 170P2. End portions of the first peripheral lines 170P1 may be located on a straight line with end portions of first interconnection lines 170C in the Y-direction. The first peripheral lines 170P1 may be arranged in the same or similar pattern as the first interconnection lines 170C. In the present embodiment, the first peripheral lines 170P1 may be arranged to form a lattice structure. The first peripheral lines 170P1 may electrically connect a first source contact structure 180 and a through-via 200, adjacent to each other, together with contact plugs 160. Electrical signals from circuit elements 220 in the peripheral circuit region PERI may be transferred to the first plate layer 101 of a source structure SS through the circuit contact plugs 270, the circuit interconnection lines 280, the through-vias 200, the contact plugs 160, the first peripheral lines 170P1, and the first source contact structures 180. The second peripheral lines 170P2 may be disposed around entire first and second stack structures ST1 and ST2 and the dummy structure DS, to surround the first interconnection lines 170C and the first peripheral lines 170P1.

Figure 12A:
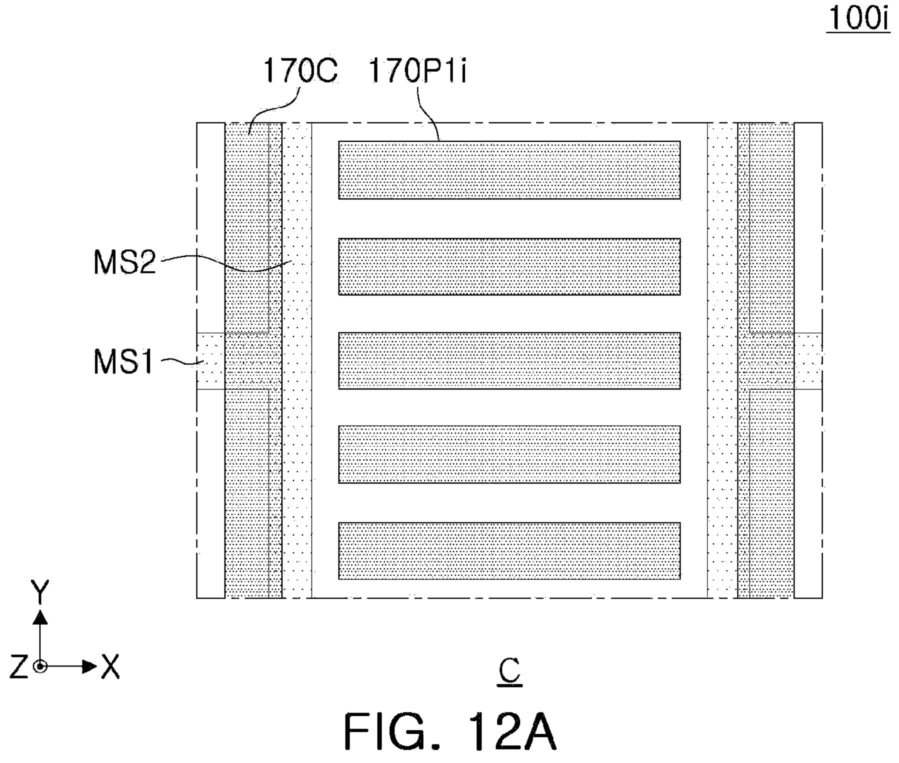
FIGS. 12A and 12B are schematic partially enlarged views of a semiconductor device according to example embodiments.
Figure 12B:
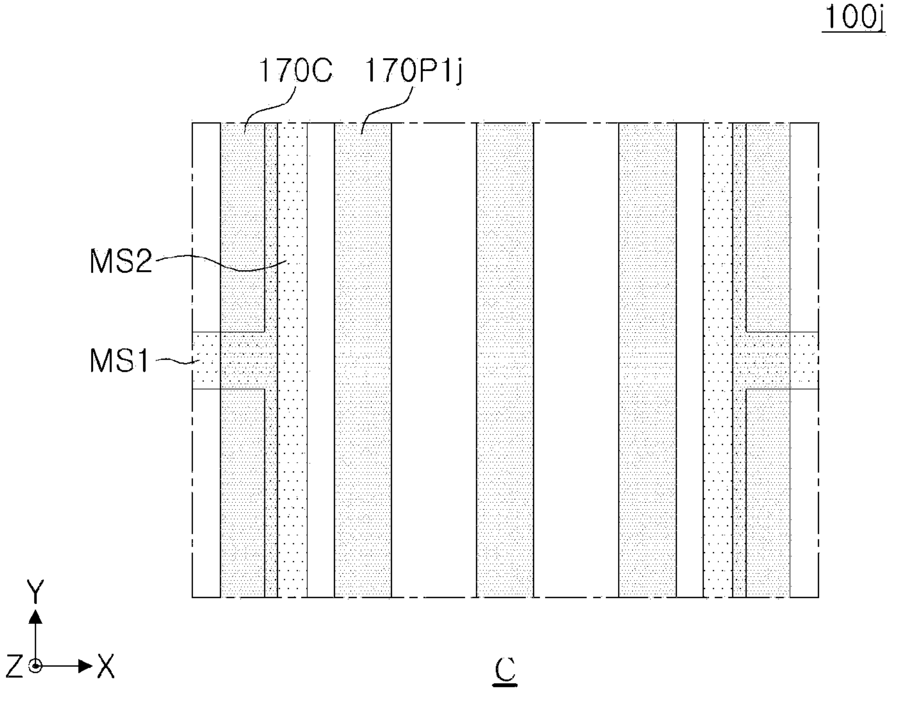

FIGS. 12A and 12B are schematic partially enlarged views of a semiconductor device according to example embodiments. FIGS. 12A and 12B illustrate an enlarged region corresponding to portion 'C' of FIG. 10, and, in these cases, the first source contact structures 180 and through-vias 200 are omitted.

Referring to FIG. 12A, in a semiconductor device 100*i*, first peripheral lines 170P1*i* may extend on the dummy structure DS in the X-direction. The first peripheral lines 170P1*i* may be disposed on a region between the second separation regions MS2, as described above. At least one of the first source contact structures 180 and at least one of the through-vias 200 may be disposed along each of the first peripheral lines 170P1*i*, to be electrically connected to the first peripheral lines 170P1*i*. For example, the first source contact structures 180 and the through-vias 200 may be alternately arranged in the X-direction.

Referring to FIG. 12B, in a semiconductor device 100*j*, first peripheral lines 170P1*j* may extend on the dummy structure DS in the Y-direction. The first peripheral lines 170P1*j* may be arranged in the same pattern as the first interconnection lines 170C. At least one of the first source contact structures 180 and at least one of the through-vias 200 may be disposed along each of the first peripheral lines 170P1*j*, to be electrically connected to the first peripheral lines 170P1*j*. For example, the first source contact structures 180 and the through-vias 200 may be alternately arranged in the Y-direction. As such, in embodiments, an arrangement of the first peripheral lines 170P1*j* may be variously changed.

Figure 13A:
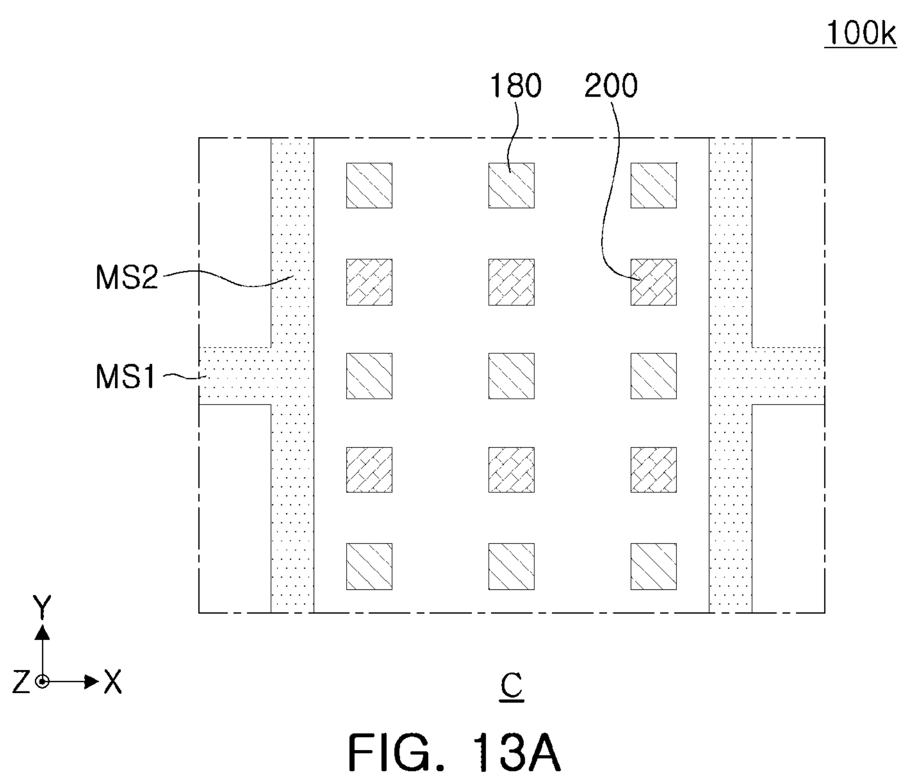
FIGS. 13A and 13B are schematic partially enlarged views of a semiconductor device according to example embodiments.
Figure 13B:
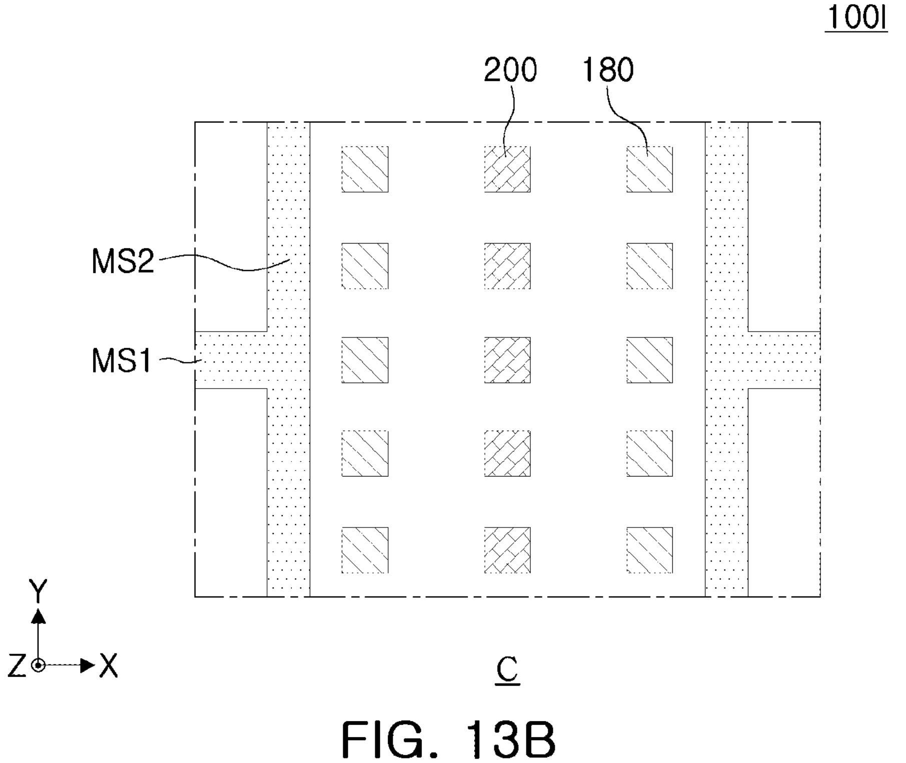

FIGS. 13A and 13B are schematic partially enlarged views of a semiconductor device according to example embodiments. FIGS. 13A and 13B illustrate an enlarged region corresponding to portion 'C' of FIG. 10, and, in these cases, the first peripheral line 170P1 is omitted.

Referring to FIG. 13A, in a semiconductor device 100*k*, the first source contact structures 180 and the through-vias 200 may be arranged to form a row in the X-direction, respectively. The first source contact structures 180 and the through-vias 200 may be alternately disposed in the Y-direction. In some embodiments, in each row, the first source contact structures 180 and/or the through-vias 200 may not be arranged in a straight line in the X-direction, but may also be arranged in rows shifted in the Y-direction in a zigzag form.

In the present embodiment, the substrate insulating layer 103 may be disposed in a linear form extending in the X-direction, to surround entirely the through-vias 200 of each row. First peripheral lines 170P1 may be arranged as in the embodiment of FIG. 10 or FIG. 12B.

Referring to FIG. 13B, in a semiconductor device 100*l*, the first source contact structures 180 and the through-vias 200 may be arranged in a row in the Y-direction, respectively. The first source contact structures 180 and the through-vias 200 may be alternately disposed in the X-direction. In some embodiments, in each column, the first source contact structures 180 and/or the through-vias 200 may not be arranged in a straight line in the Y-direction, but may also be arranged in columns shifted in the X-direction in a zigzag form.

In the present embodiment, the substrate insulating layer 103 may be disposed in a linear form extending in the Y-direction, to surround entirely the through-vias 200 of each column. First peripheral lines 170P1 may be arranged as in the embodiment of FIG. 10 or 12A. As such, in embodiments, an arrangement of the first source contact structures 180 and the through-vias 200 and an arrangement of the substrate insulating layer 103 may be variously changed.

FIGS. 14A to 14G are schematic cross-sectional views illustrating stages in a method of manufacturing a semiconductor device according to example embodiments. FIGS. 14A to 14G illustrate regions corresponding to the region illustrated in FIG. 2B.

Figure 14A:
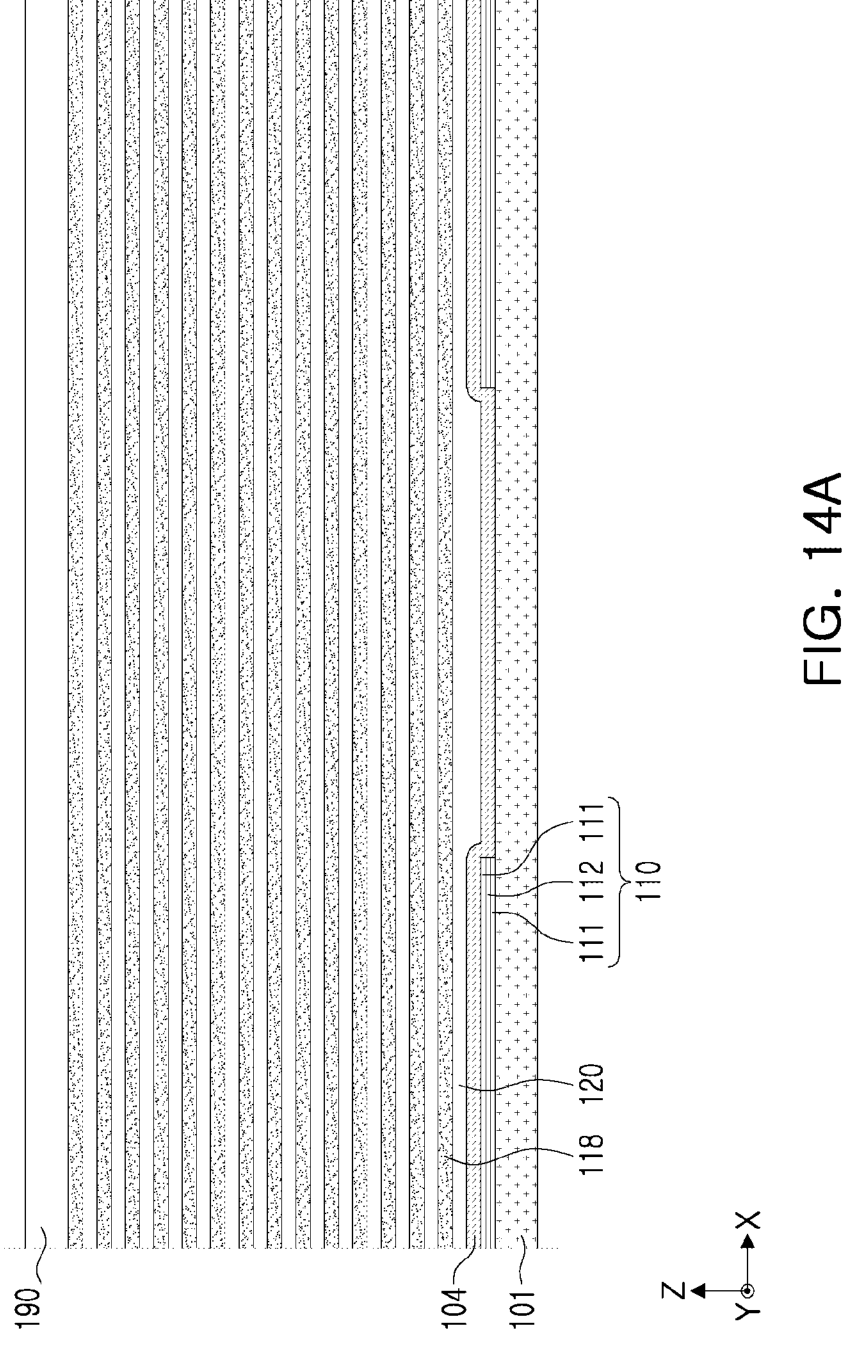
FIGS. 14A to 14G are schematic cross-sectional views of stages in a method of manufacturing a semiconductor device according to example embodiments.

Referring to FIG. 14A, the horizontal insulating layer 110 and the second horizontal conductive layer 104 may be formed on the plate layer 101, and the sacrificial insulating layers 118 and the interlayer insulating layers 120 may be alternately stacked.

The horizontal insulating layer 110 may include the first and second horizontal insulating layers 111 and 112. The first and second horizontal insulating layers 111 and 112 may be layers to be replaced with the first horizontal conductive layer 102 (in FIG. 2B) by a subsequent process. The first and second horizontal insulating layers 111 and 112 may be stacked on the plate layer 101 such that the first horizontal insulating layers 111 is disposed above and below the second horizontal insulating layer 112. The first and second horizontal insulating layers 111 and 112 may include different insulating materials. The horizontal insulating layer 110 may be removed by a patterning process, in a region corresponding to the dummy structure DS and the second separation regions MS2 of FIG. 2B. The second horizontal conductive layer 104 may be formed on the horizontal insulating layer 110.

The sacrificial insulating layers 118 may be partially replaced with the first and second gate electrodes 130A and 130B (in FIG. 2B) by a subsequent process. The sacrificial insulating layers 118 may be formed of a material different from that of the interlayer insulating layers 120, and may be formed of a material having an etching selectivity with respect to the interlayer insulating layers 120 under specific etching conditions. For example, the interlayer insulating layer 120 may be formed of at least one of silicon oxide or silicon nitride, and the sacrificial insulating layers 118 may be formed of a material different from that of the interlayer insulating layer 120, e.g., silicon, silicon oxide, silicon carbide, and silicon nitrides. In embodiments, thicknesses of the interlayer insulating layers 120 may not all be the same. Thickness of the interlayer insulating layers 120 and the sacrificial insulating layers 118, and the number of constituting layers thereof may be variously changed from those illustrated.

Next, in the second region R2 of FIG. 2A, a photolithography process and an etching process for the sacrificial insulating layers 118 may be repeated using a mask layer, such that upper ones of the sacrificial insulating layers 118 extend shorter than lower ones of the sacrificial insulating layers 118 below the upper sacrificial insulating layers 118. Therefore, the sacrificial insulating layers 118 may form a stepped structure in a predetermined unit. Next, a cell region insulating layer 190 covering the stack structure may be partially formed.

Figure 14B:
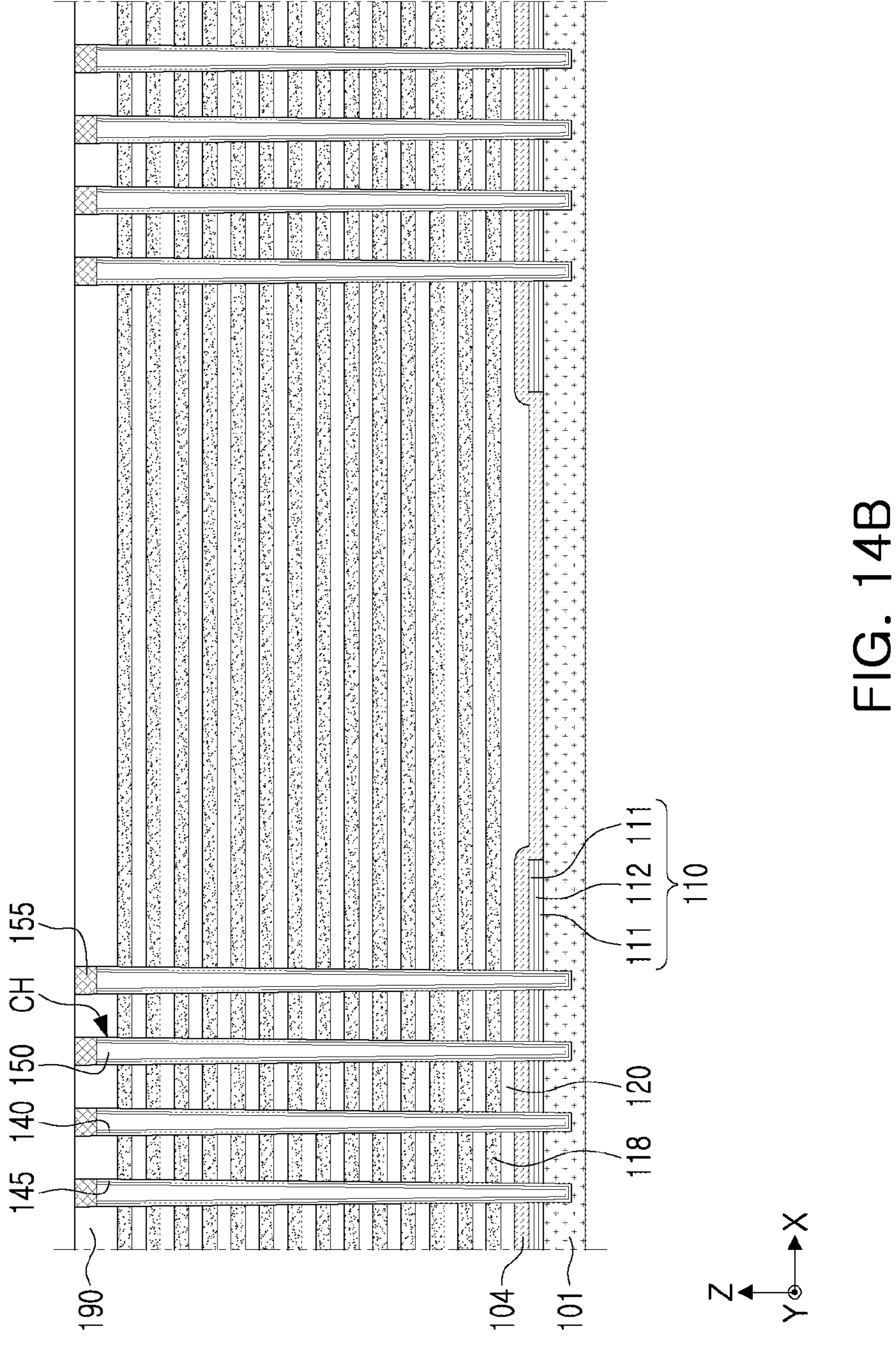

Referring to FIG. 14B, channel holes passing through a stack structure of the sacrificial insulating layers 118 and the interlayer insulating layers 120 may be formed, and the channel structures CH may be formed in the channel holes.

The channel holes may be formed by anisotropically etching the sacrificial insulating layers 118 and the interlayer insulating layers 120 using a mask layer. The channel holes may be formed in regions corresponding to the first regions R1 of the first and second stack structures ST1 and ST2 of FIG. 2A. Due to a height of the stack structure, sidewalls of the channel holes may not be perpendicular to an upper surface of the plate layer 101. The channel holes may be formed to recess a portion of the plate layer 101.

The channel structures CH may be formed in the channel holes by sequentially forming the channel dielectric layer 145, the channel layer 140, the channel buried insulating layer 150, and the channel pads 155. The channel layer 140 may be formed on the channel dielectric layer 145 in the channel structures CH. The channel buried insulating layer 150 may be formed to fill the channel structures CH, and may be formed of an insulating material. In some embodiments, a space between the channel layers 140 may be filled with a conductive material, rather than the channel buried insulating layer 150. The channel pads 155 may be formed of a conductive material, e.g., polycrystalline silicon.

Figure 14C:
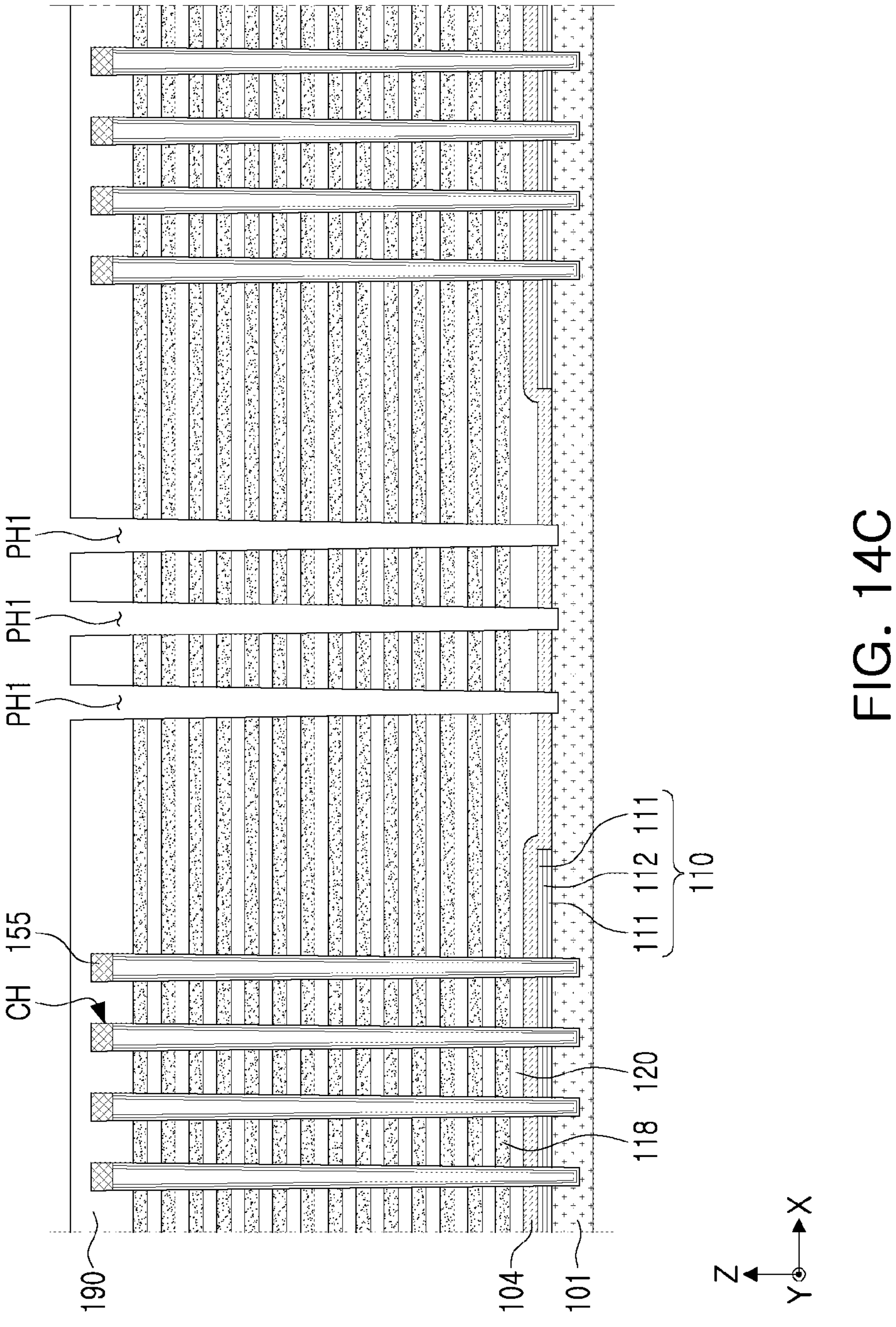

Referring to FIG. 14C, first contact holes PH1 passing through the stack structure of the sacrificial insulating layers 118 and the interlayer insulating layers 120, and the second horizontal conductive layer 104 may be formed in regions corresponding to the first source contact structures 180 (refer to FIG. 2B).

Before forming the first contact holes PH1, the cell region insulating layer 190 may further be formed on the channel structures CH, e.g., a thickness of the cell region insulating layer 190 may be increased to extend above tops of the channel structures CH. The first contact holes PH1 may be formed in regions in which the first source contact structures 180 are to be formed by a subsequent process. Due to a height of the stack structure, sidewalls of the first contact holes PH1 may not be perpendicular to the upper surface of the plate layer 101. The first contact holes PH1 may be formed to recess a portion of the plate layer 101 or to expose the upper surface of the plate layer 101.

Figure 14D:
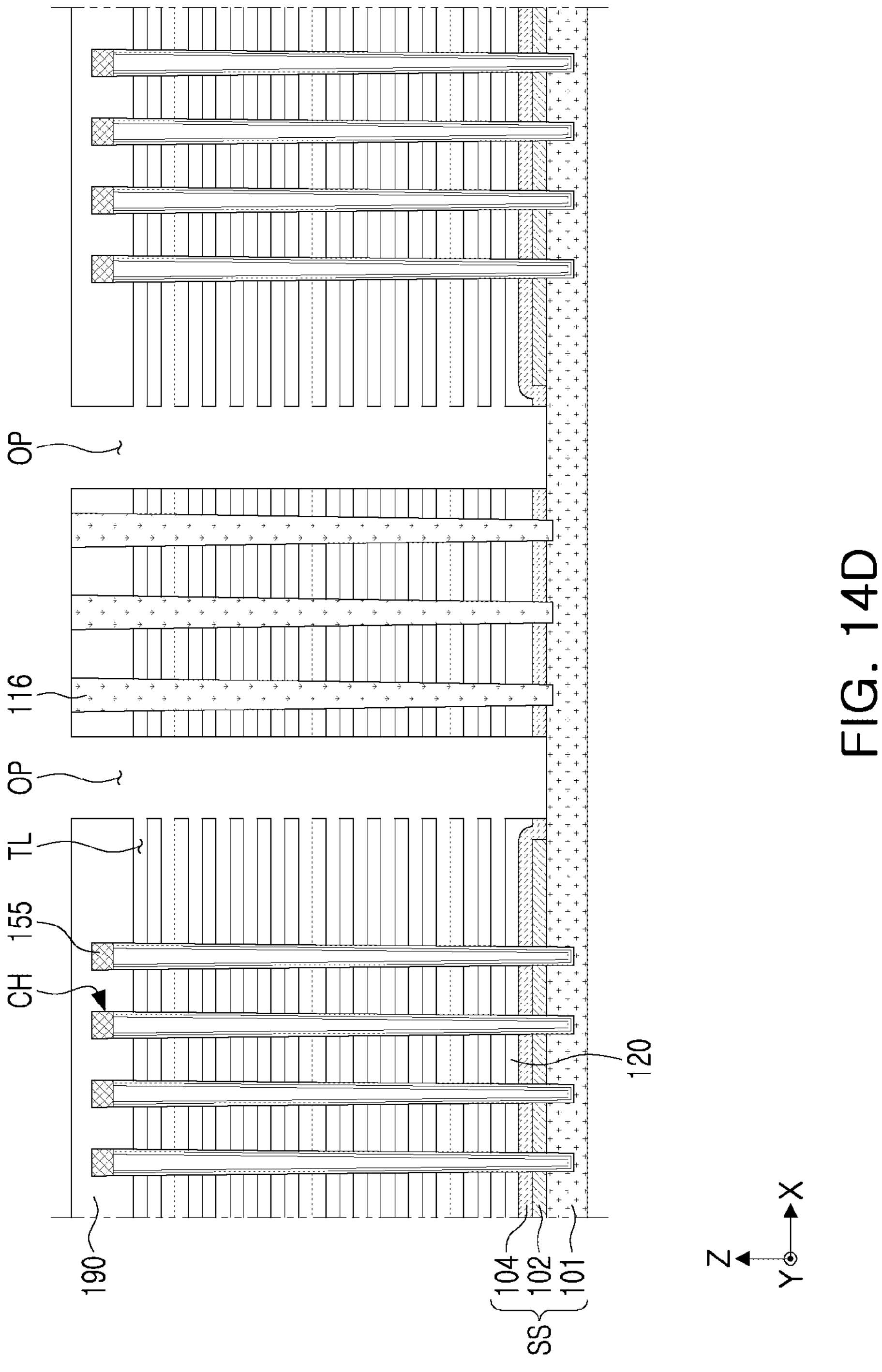

Referring to FIG. 14D, a vertical sacrificial layer 116 may be formed to fill the first contact holes PH1, openings OP passing through the stack structure of the sacrificial insulating layers 118 and the interlayer insulating layers 120 may be formed, and after forming the first horizontal conductive layer 102, the sacrificial insulating layers 118 may be removed.

The vertical sacrificial layer 116 may include a material different from that of the sacrificial insulating layers 118 and the interlayer insulating layers 120. For example, the vertical sacrificial layer 116 may include polycrystalline silicon (Si).

The openings OP may be formed in regions corresponding to the first and second separation regions MS1 and MS2 of FIG. 1. The openings OP may be formed to pass through the stack structure, pass through the second horizontal conductive layer 104 in a lower portion thereof, and may extend in the X-direction and the Y-direction.

Next, in the openings OP, separate sacrificial spacer layers may be formed, an etch-back process may be performed to expose the horizontal insulating layer 110, and the horizontal insulating layer 110 may be removed from an exposed region. The horizontal insulating layer 110 may be removed by, e.g., a wet etching process. In a process of removing the horizontal insulating layer 110, a portion of the channel dielectric layer 145 exposed in a region from which the horizontal insulating layer 110 is removed may also be removed. After the first horizontal conductive layer 102 is formed by depositing a conductive material in a region from which the horizontal insulating layer 110 is removed, the sacrificial spacer layers may be removed in the openings OP. By the present process, a source structure SS including the plate layer 101 and the first and second horizontal conductive layers 102 and 104 may be formed.

The sacrificial insulating layers 118 may be selectively removed with respect to the interlayer insulating layers 120 using, e.g., a wet etching process. Therefore, a plurality of tunnel portions TL may be formed between the interlayer insulating layers 120.

Figure 14E:
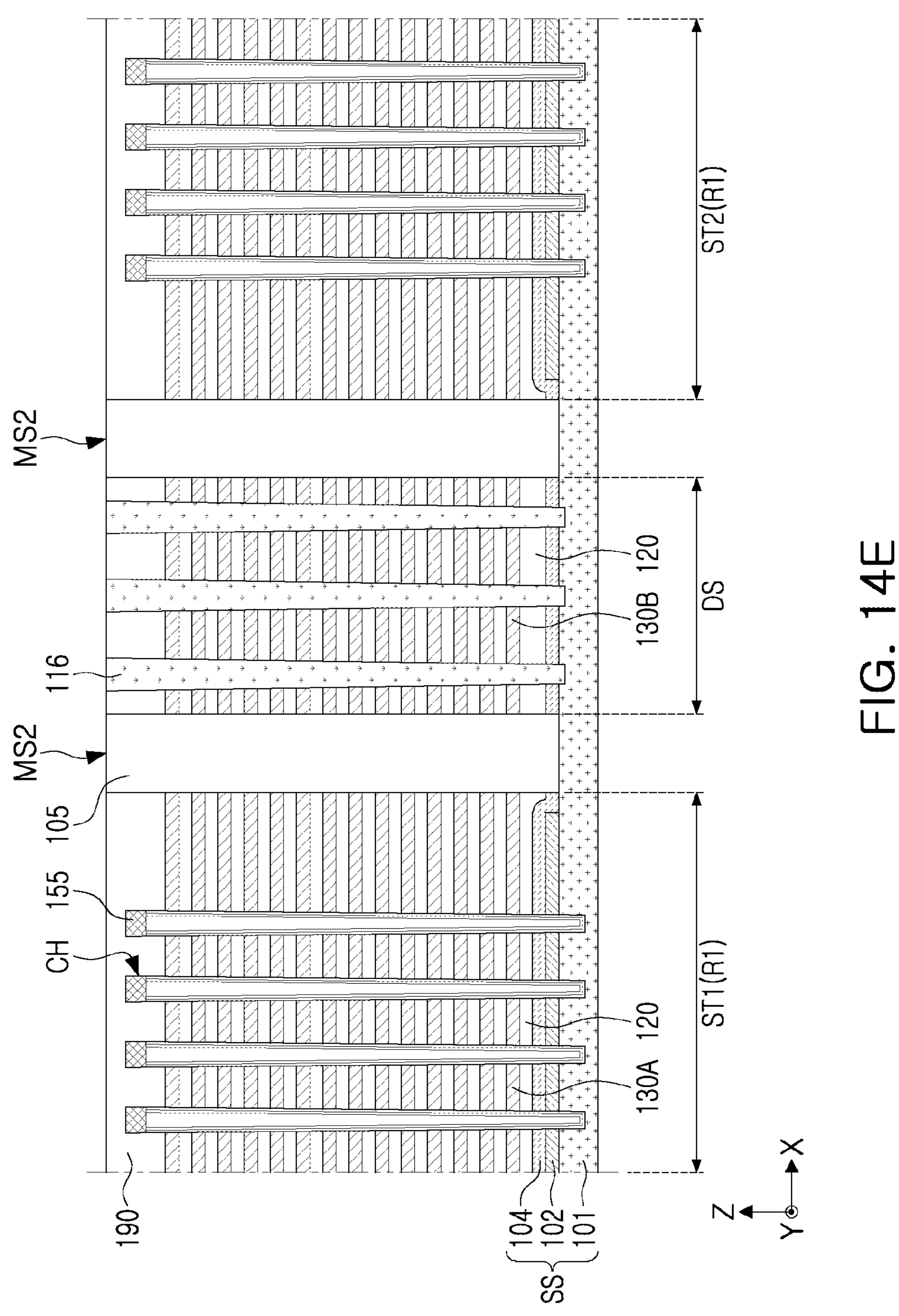

Referring to FIG. 14E, the first and second gate electrodes 130A and 130B may be formed, and the isolation insulating layers 105 may be formed in the openings OP.

The first and second gate electrodes 130A and 130B may be formed by filling the tunnel portions TL from which the sacrificial insulating layers 118 are removed, with a conductive material, e.g., a metal, polycrystalline silicon, or a metal silicide material. Therefore, the first and second stack structures ST1 and ST2 including the first gate electrodes 130A, and the dummy structure DS including the second gate electrodes 130B may be formed. The first and second stack structures ST1 and ST2 may surround the channel structures CH, and the dummy structure DS may surround the vertical sacrificial layers 116.

In embodiments in which a portion of the channel dielectric layer 145 extends horizontally along the first and second gate electrodes 130A and 130B, in the present operation, a portion of the channel dielectric layer 145 may be formed before the first and second gate electrodes 130A and 130B. After forming the first and second gate electrodes 130A and 130B, the isolation insulating layers 105 may be formed in the openings OP to form the first and second separation regions MS1 and MS2.

Figure 14F:
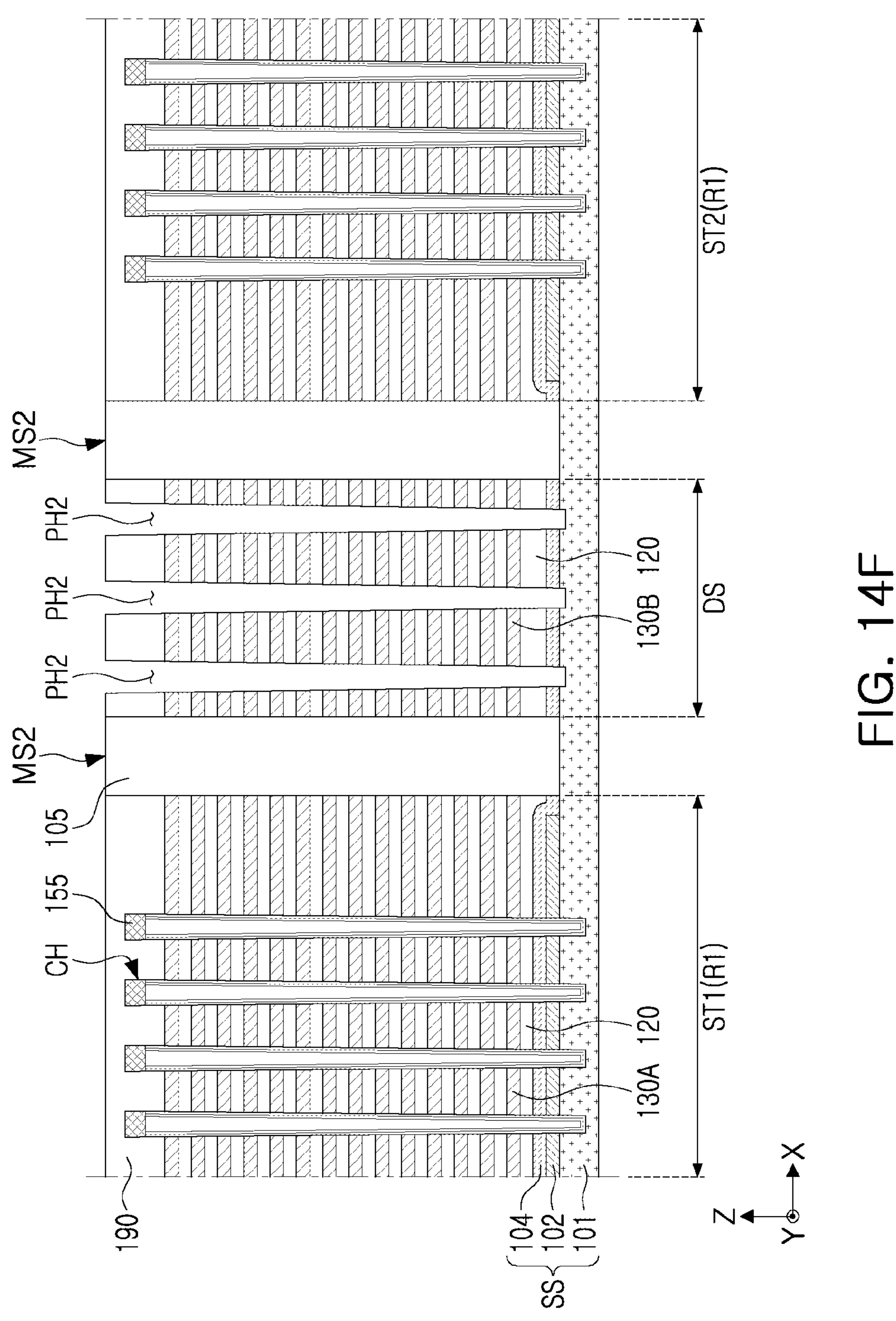

Referring to FIG. 14F, second contact holes PH2 may be formed by removing the vertical sacrificial layers 116. The vertical sacrificial layers 116 may be selectively removed with respect to the second gate electrodes 130B and the interlayer insulating layers 120. The vertical sacrificial layers 116 may be removed by, e.g., a wet etching process. The second contact holes PH2 may have an arrangement and shape corresponding to the first contact holes PH1 of FIG. 14C.

Figure 14G:
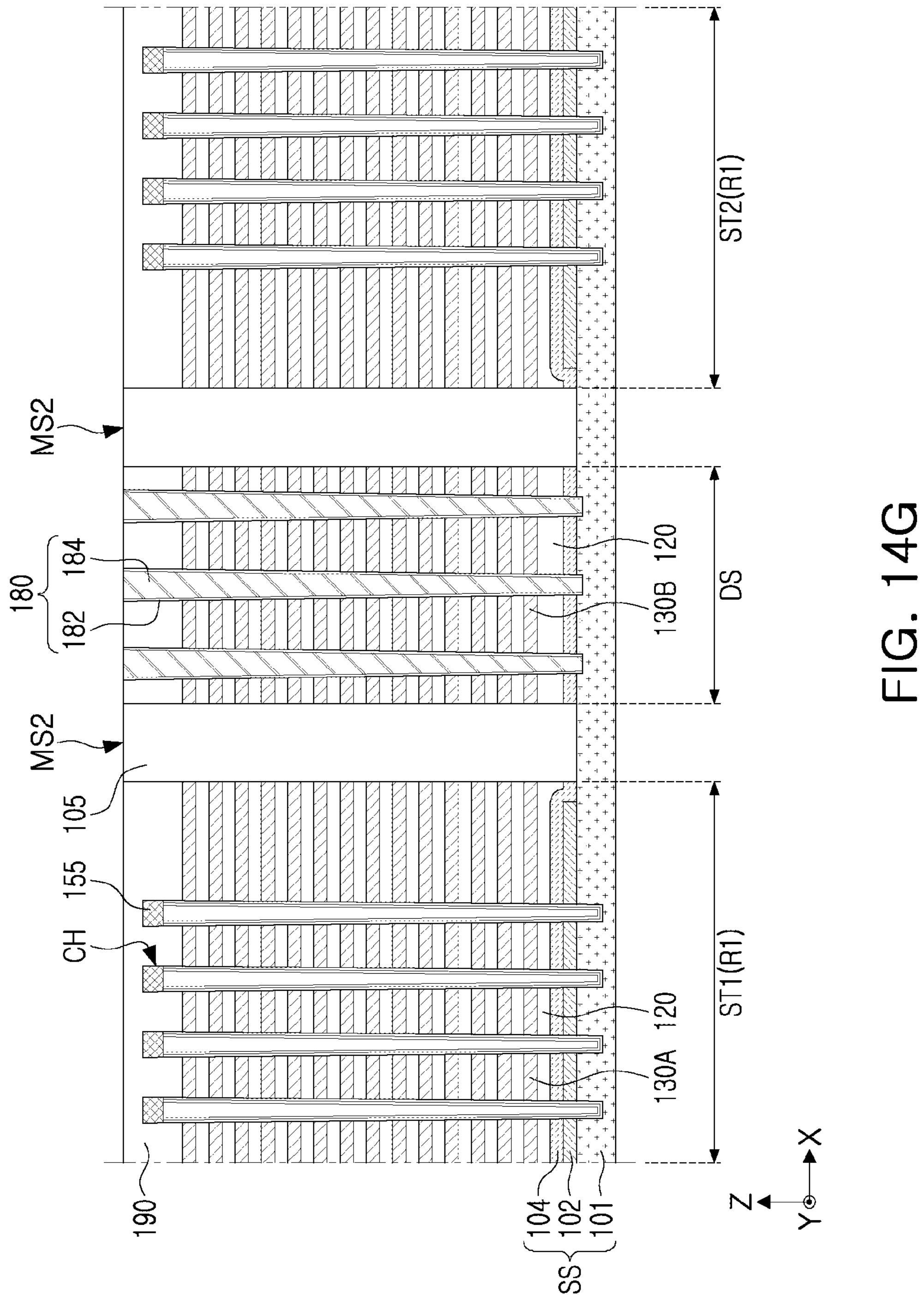

Referring to FIG. 14G, the first source contact structures 180 may be formed by sequentially forming the contact insulating layers 182 and the contact layers 184 in the second contact holes PH2.

The contact insulating layers 182 may be formed in a spacer shape to expose the plate layer 101 in the second contact holes PH2. The contact layers 184 may be formed on the contact insulating layers 182 to fill the second contact holes PH2. Therefore, the first source contact structures 180 may be formed. For example, the second source contact structures 185 of FIG. 2A may be formed together through the same process as the first source contact structures 180. In another example, the second source contact structures 185 may be formed by a separate process, and in this case, may have a structure, different from that of the first source contact structures 180.

In some embodiments, the first source contact structures 180 may be formed earlier than the first and second gate electrodes 130A and 130B, by forming the contact insulating layers 182 and the contact layers 184, instead of forming the vertical sacrificial layers 116, in the operation described above with reference to FIG. 14D.

Next, referring to FIGS. 2A and 2B together, the contact plugs 160 may be formed on the channel structures CH and the first and second source contact structures 180 and 185, and the first and second interconnection lines 170C and 170P may be formed to manufacture the semiconductor device 100.

FIGS. 15A to 18B are schematic cross-sectional views illustrating stages in a method of manufacturing a semiconductor device according to example embodiments. FIGS. 15A, 16A, 17A, and 18A illustrate regions corresponding to the region illustrated in FIG. 9A, and FIGS. 15B, 16B, 17B, and 18B illustrate regions corresponding to the region illustrated in FIG. 9B.

Figure 15A:
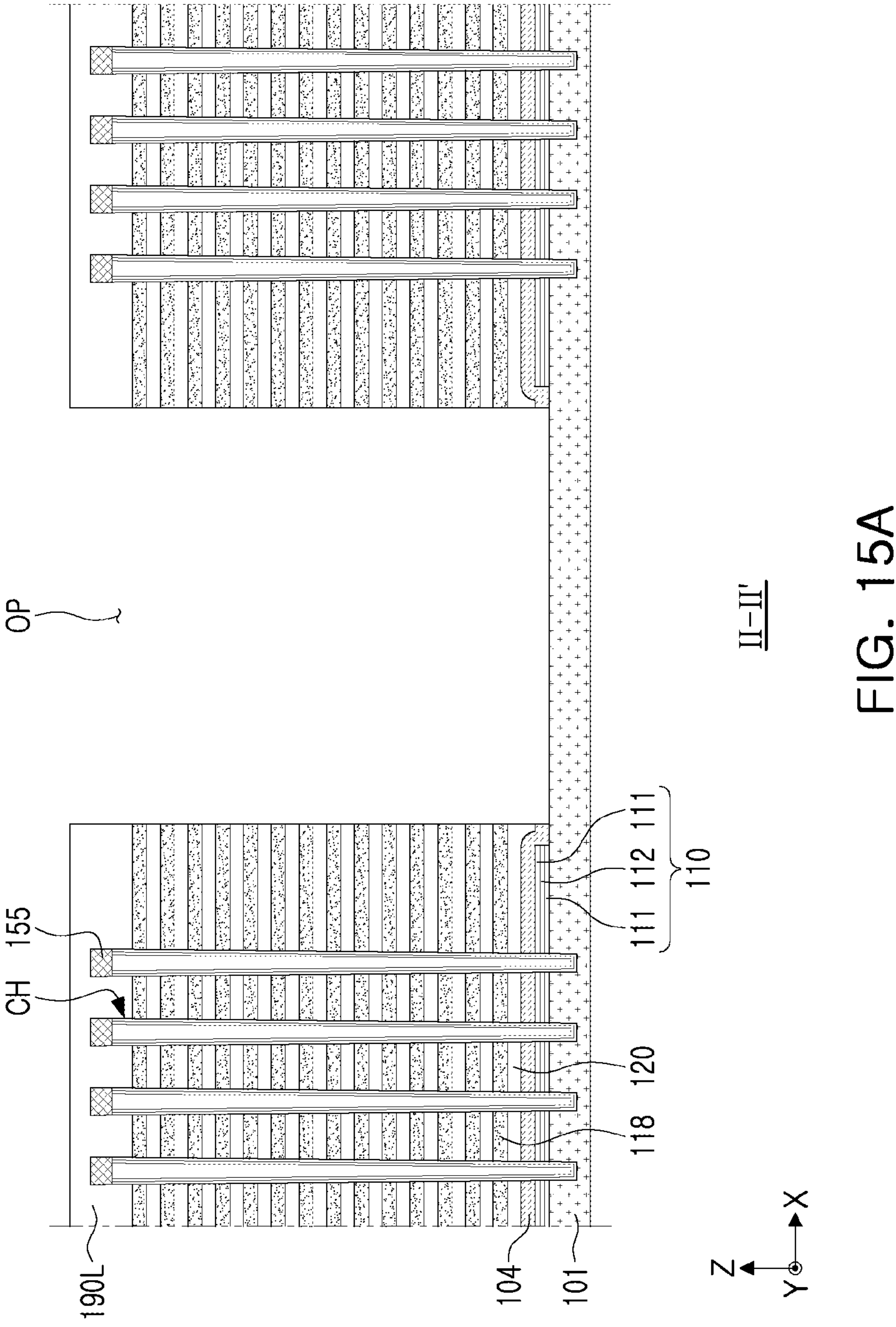
FIGS. 15A to 18B are schematic cross-sectional views of stages in a method of manufacturing a semiconductor device according to example embodiments.
Figure 15B:
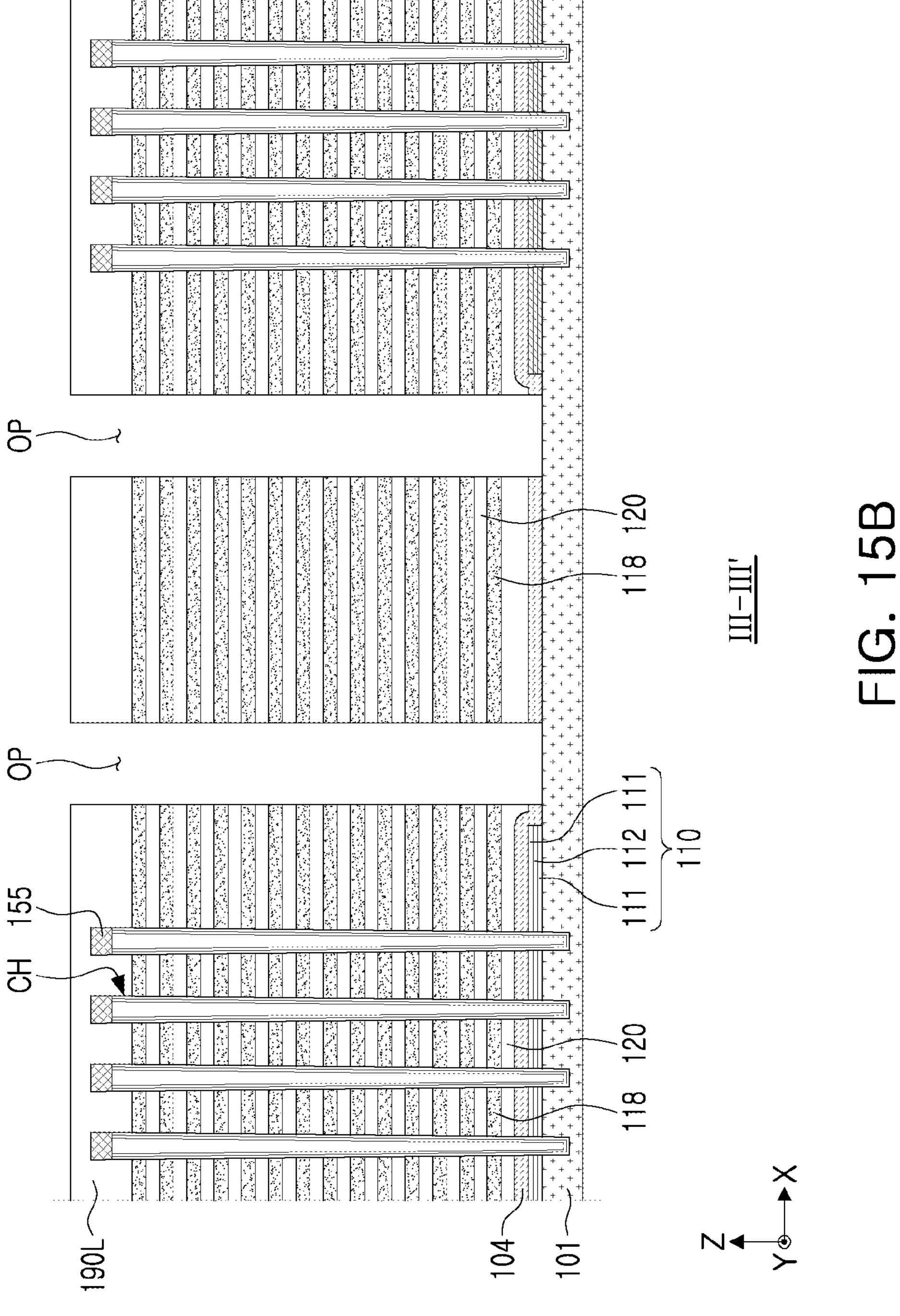

Referring to FIGS. 15A and 15B, after forming the stack structure of the sacrificial insulating layers 118 and the interlayer insulating layers 120, and the channel structures CH passing therethrough, an opening OP may be formed.

The stack structure and the channel structures CH may be formed as described above with reference to FIGS. 14A and 14B. A lower cell region insulating layer 190L may be formed on the stack structure and the channel structures CH.

The opening OP may be formed in regions corresponding to the first to third separation regions MS1, MS2, and MS3 of FIG. 8. The opening OP may have a form in which the regions corresponding to the first to third separation regions MS1, MS2, and MS3 are connected as one. The opening OP may be formed to pass through the stack structure, pass through the second horizontal conductive layer 104 in a lower portion thereof, and extend in the X-direction and the Y-direction, e.g., portions of the opening OP may be continuous with each other to define a grid structure through the stack structure (as viewed in a top view).

Figure 16A:
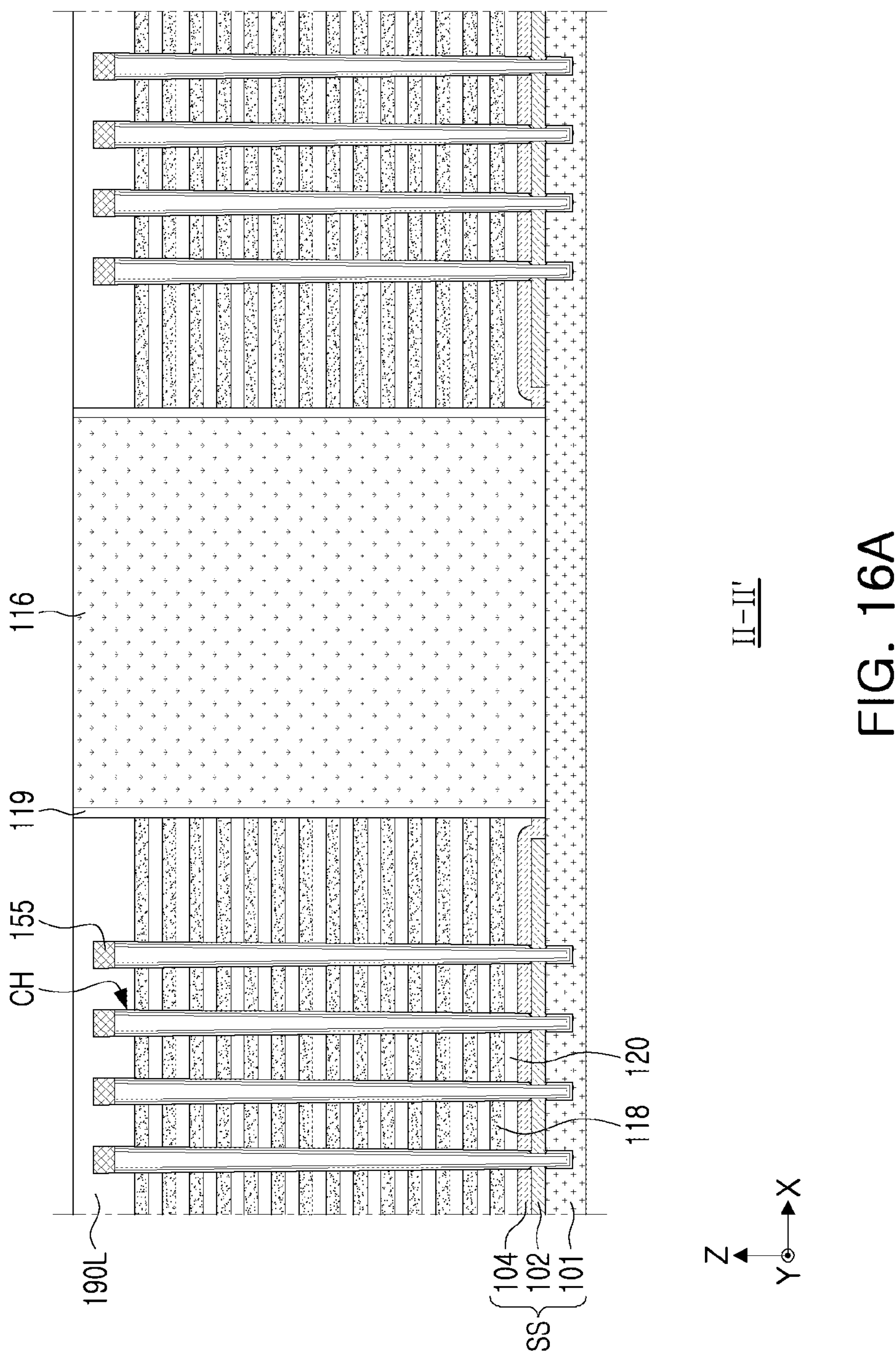
Figure 16B:
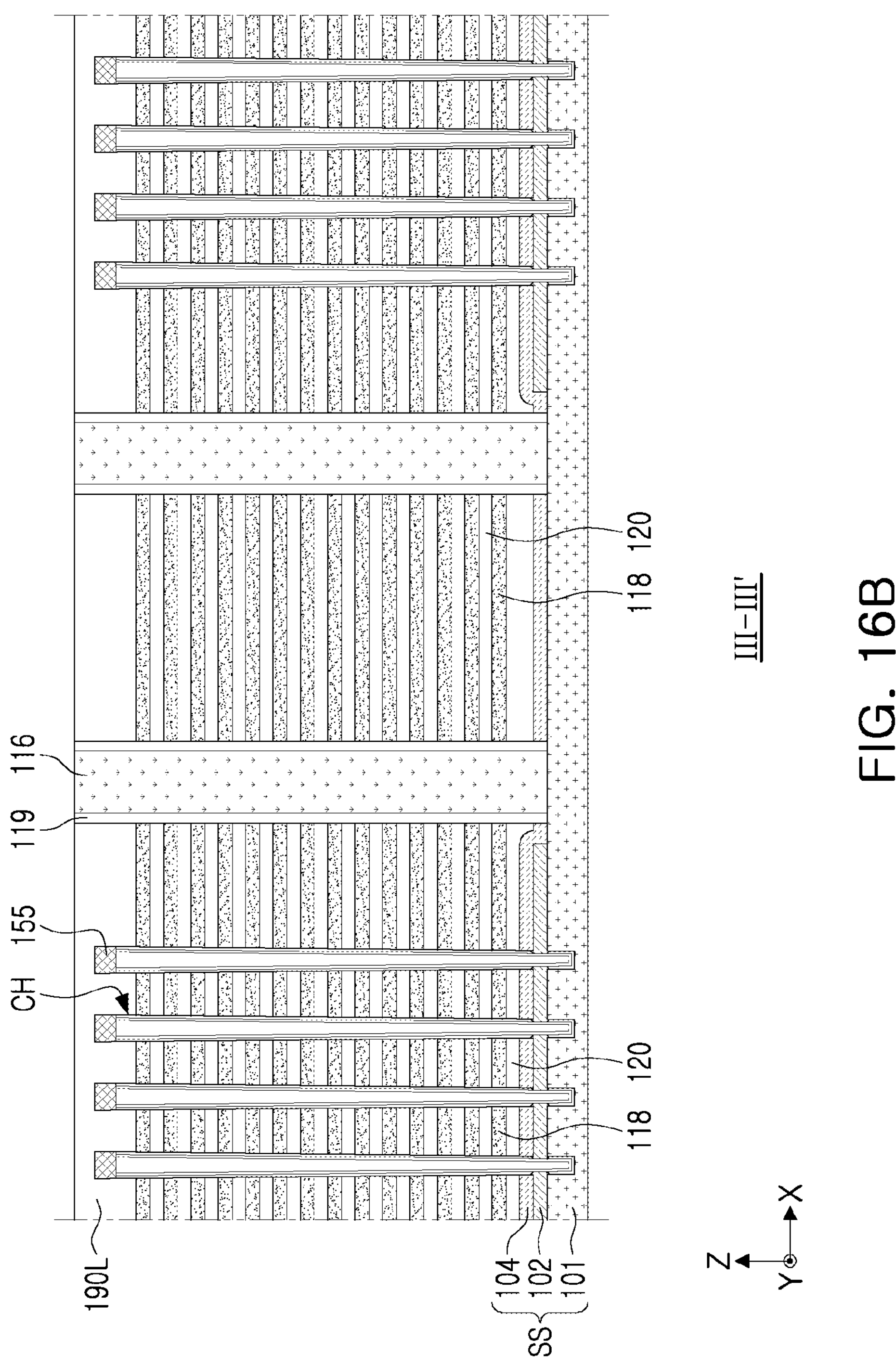

Referring to FIGS. 16A and 16B, using the opening OP, the first horizontal conductive layer 102 may be formed, and opening spacer layers 119 and the vertical sacrificial layer 116 may be formed.

First, separate sacrificial spacer layers may be formed in the opening OP, an etch-back process may be performed to expose the horizontal insulating layer 110, and the horizontal insulating layer 110 may be removed from an exposed region. The horizontal insulating layer 110 may be removed by, e.g., a wet etching process. In a process of removing the horizontal insulating layer 110, a portion of a channel dielectric layer 145 exposed in a region from which the horizontal insulating layer 110 is removed may also be removed. After the first horizontal conductive layer 102 is formed by depositing a conductive material in a region from which the horizontal insulating layer 110 is removed, the sacrificial spacer layers may be removed in the opening OP. By the present process, a source structure SS including the plate layer 101 and the first and second horizontal conductive layers 102 and 104 may be formed.

Next, the opening spacer layers 119 may be formed on inner walls of the opening OP, and the vertical sacrificial layer 116 filling the opening OP may be formed. The vertical sacrificial layer 116 may include, e.g., polycrystalline silicon (Si). The second horizontal conductive layer 104 and the vertical an sacrificial layer 116 may be spaced apart from each other by the opening spacer layers 119. In regions corresponding to the first separation regions MS1 of FIG. 8, the first horizontal conductive layer 102 and the vertical sacrificial layer 116 may be spaced apart from each other by the opening spacer layers 119.

Figure 17A:
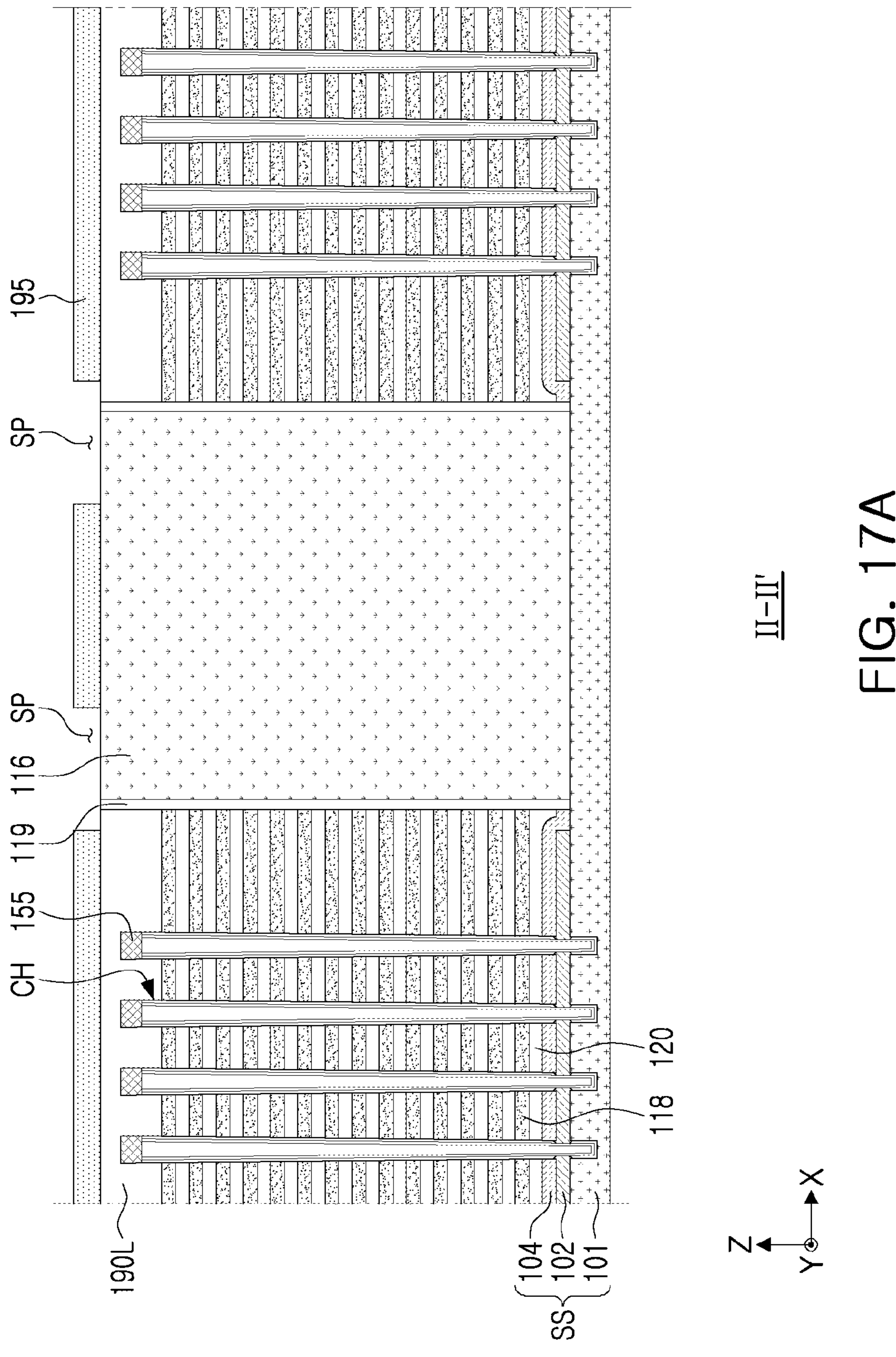
Figure 17B:
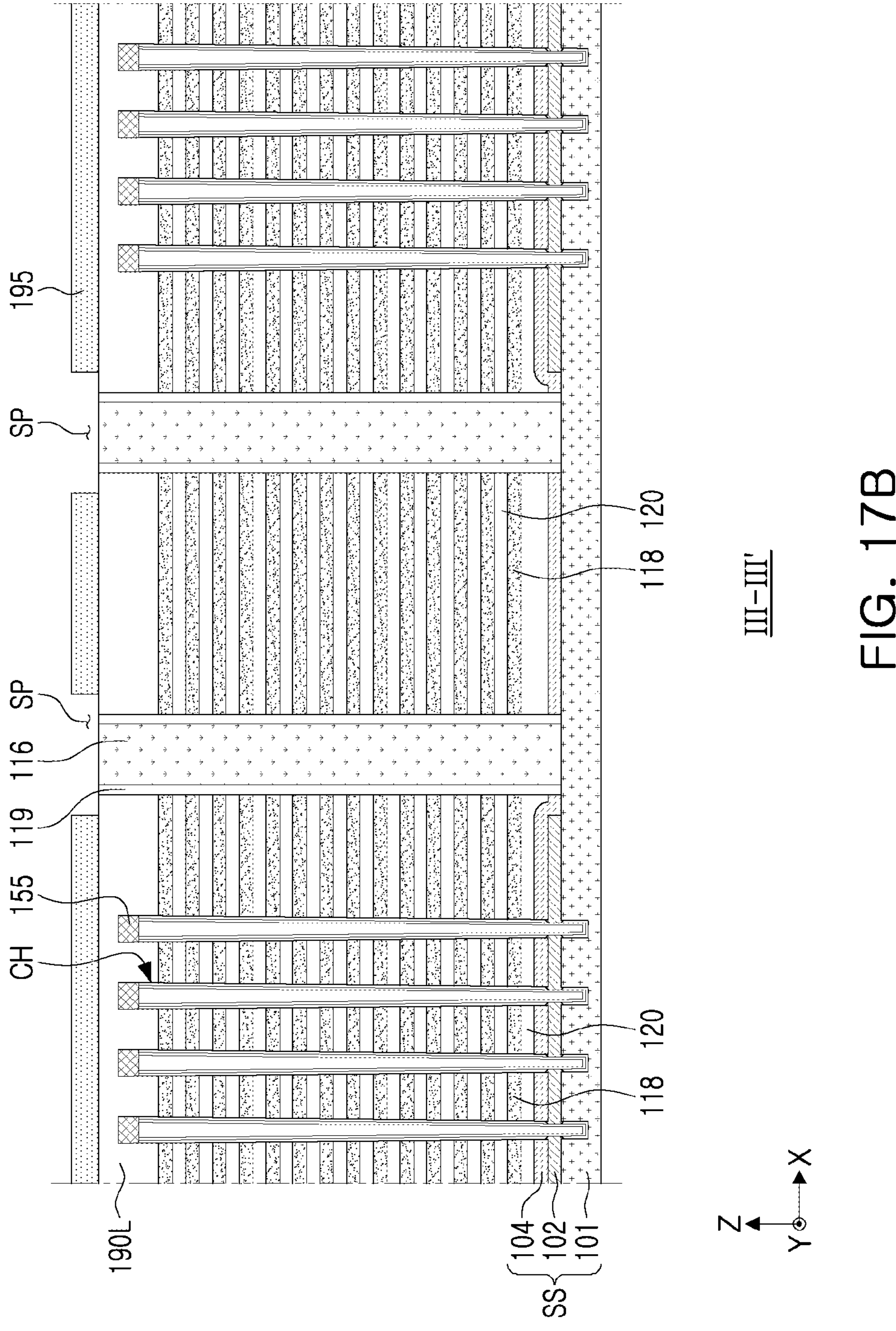

Referring to FIGS. 17A and 17B, the upper support layer 195 may be formed on the lower cell region insulating layer 190L.

The upper support layer 195 may include the upper openings SP, and the upper openings SP may be disposed at predetermined intervals in the extension direction of the vertical sacrificial layer 116. The upper openings SP may not be formed on the vertical sacrificial layer 116 in a region corresponding to the third separation regions MS3 (refer to FIGS. 8 and 9C). In FIG. 17B, the upper openings SP may be disposed on the vertical sacrificial layer 116 to have a width wider than a width of the vertical sacrificial layer 116 in the X-direction, and may extend in the Y-direction by the width. In some embodiments, in the region illustrated in FIG. 17A, the upper openings SP may be relatively formed to have a wider width in the X-direction on positions on which the second separation regions MS2 and the third separation regions MS3 of FIG. 8 are connected.

Figure 18A:
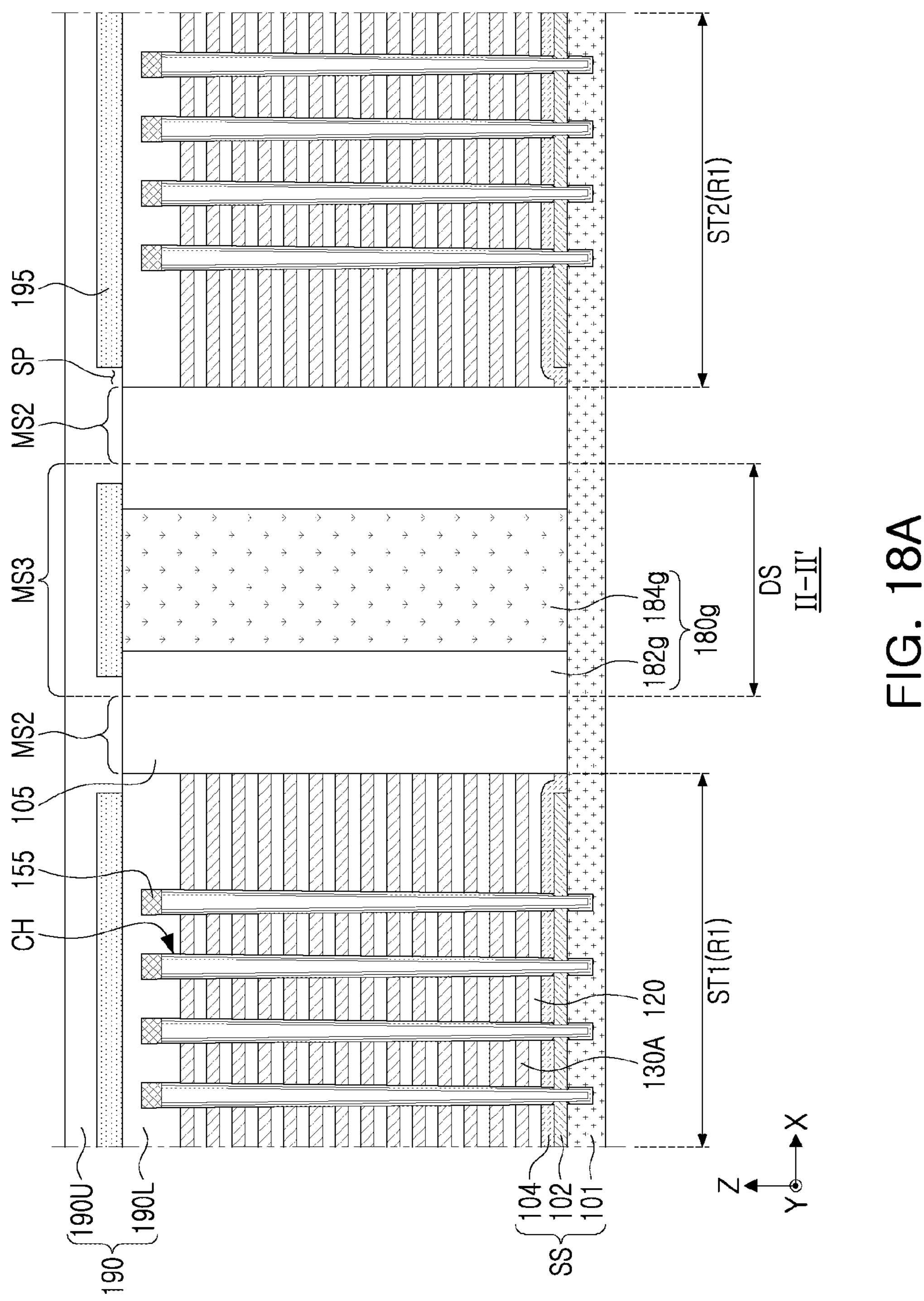
Figure 18B:
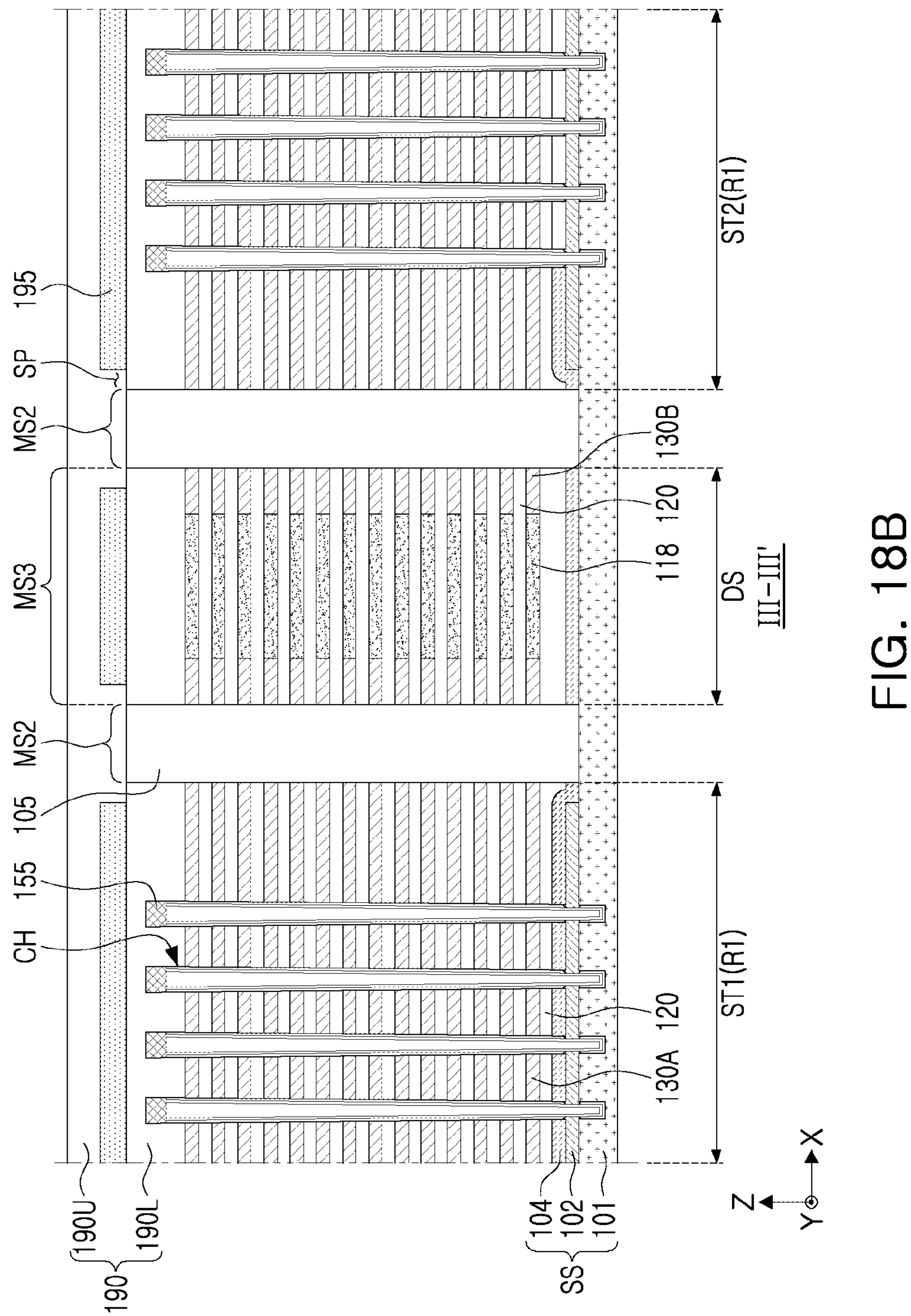

Referring to FIGS. 18A and 18B, after removing the vertical sacrificial layer 116 and the opening spacer layers 119 through the upper openings SP, and removing the exposed sacrificial insulating layers 118, the first and second gate electrodes 130A and 130B, and the isolation insulating layer 105 may be formed.

First, the vertical sacrificial layer 116 and the opening spacer layers 119 may be removed. In the present operation, as illustrated in FIG. 18A, in a region corresponding to the third separation regions MS, the vertical sacrificial layer 116 may partially remain by the upper support layer 195, to form the contact layer 184*g*.

The sacrificial insulating layers 118 may be selectively removed with respect to the interlayer insulating layers 120 as described above with reference to FIG. 14D. In the process of removing the sacrificial insulating layers 118, as illustrated in FIG. 18B, some of the sacrificial insulating layers 118 may remain due to the upper support layer 195 in a region corresponding to the dummy structure DS.

As described above with reference to FIG. 14E, the first and second gate electrodes 130A and 130B may be formed by filling the regions from which the sacrificial insulating layers 118 are removed, with a conductive material. After the first and second gate electrodes 130A and 130B are formed, the isolation insulating layer 105 may be formed to form the first to third separation regions MS1, MS2, and MS3. Partial regions of the isolation insulating layer 105 formed in the region corresponding to the third separation regions MS may form the contact insulating layer 182*g*, and the first source contact structure 180*g* may be formed together with the contact layer 184*g*. Thereafter, an upper cell region insulating layer 190U may further be formed on the upper support layer 195.

Next, referring to FIGS. 9A and 9B together, the contact plugs 160 may be formed on the channel structures CH and the first and second source contact structures 180 and 185, and the first and second interconnection lines 170C and 170P may be formed, to manufacture the semiconductor device 100*g*.

Figure 19:
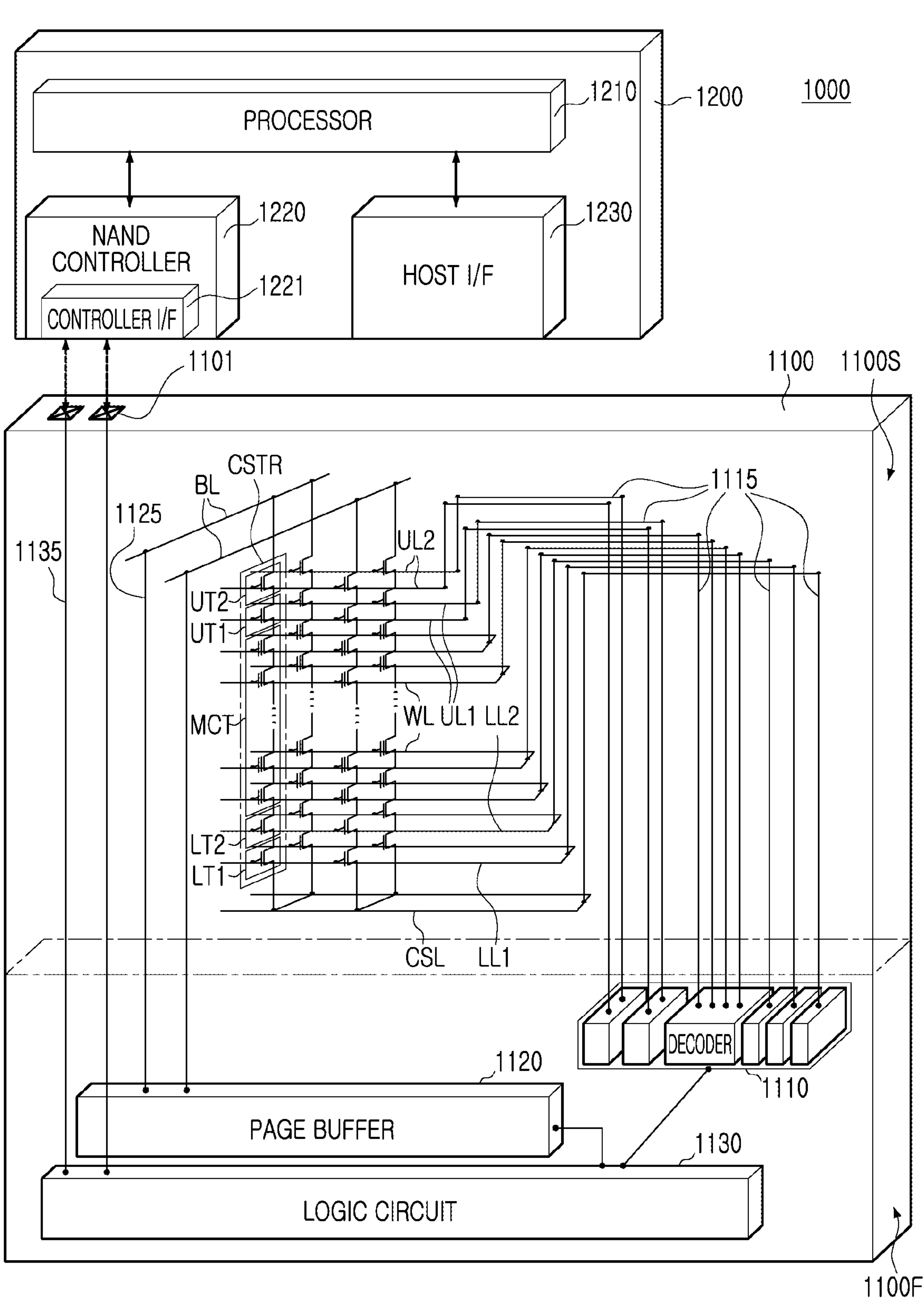
FIG. 19 is a view schematically illustrating a data storage system including a semiconductor device according to example embodiments.

FIG. 19 is a view schematically illustrating a data storage system including a semiconductor device according to example embodiments.

Referring to FIG. 19, a data storage system 1000 may include a semiconductor device 1100 and a controller 1200 electrically connected to the semiconductor device 1100. The data storage system 1000 may be a storage device including the semiconductor device 1100 as a single semiconductor device or a plurality of semiconductor devices, or an electronic device including the storage device. For example, the data storage system 1000 may be a solid state drive device (SSD), a universal serial bus (USB), a computing system, a medical device, or a communication device, including the semiconductor device 1100 as a single semiconductor device or a plurality of semiconductor devices.

The semiconductor device 1100 may be a non-volatile memory device, e.g., a NAND flash memory device according to any one of embodiments described above with reference to FIGS. 1 to 13B. The semiconductor device 1100 may include a first semiconductor structure 1100F, and a second semiconductor structure 1100S on the first semiconductor structure 1100F. In example embodiments, the first semiconductor structure 1100F may be disposed next to the second semiconductor structure 1100S. The first semiconductor structure 1100F may be a peripheral circuit structure including a decoder circuit 1110, a page buffer 1120, and a logic circuit 1130. The second semiconductor structure 1100S may be a memory cell structure including bit lines BL, a common source line CSL, word lines WL, first and second upper gate lines UL1 and UL2, first and second lower gate lines LL1 and LL2, and memory cell strings CSTR between each of the bit lines BL and the common source line CSL.

In the second semiconductor structure 1100S, each of the memory cell strings CSTR may include lower transistors LT1 and LT2 adjacent to the common source line CSL, upper transistors UT1 and UT2 adjacent to each of the bit lines BL, and a plurality of memory cell transistors MCT disposed between each of the lower transistors LT1 and LT2 and each of the upper transistors UT1 and UT2. The number of lower transistors LT1 and LT2 and the number of upper transistors UT1 and UT2 may be variously changed according to embodiments.

In example embodiments, each of the upper transistors UT1 and UT2 may include a string select transistor, and each of the lower transistors LT1 and LT2 may include a ground select transistor. The lower gate lines LL1 and LL2 may be gate electrodes of the lower transistors LT1 and LT2, respectively. The word lines WL may be gate electrodes of the memory cell transistors MCT, and the upper gate lines UL1 and UL2 may be gate electrodes of the upper transistors UT1 and UT2, respectively.

In example embodiments, the lower transistors LT1 and LT2 may include a lower erase control transistor LT1 and a ground select transistor LT2, connected in series. The upper transistors UT1 and UT2 may include a string select transistor UT1 and an upper erase control transistor UT2, connected in series. At least one of the lower erase control transistor LT1 or the upper erase control transistor UT2 may be used for an erase operation of erasing data stored in the memory cell transistors MCT using a gate-induced-drain-leakage (GIDL) phenomenon.

The common source line CSL, the first and second lower gate lines LL1 and LL2, the word lines WL, and the first and second upper gate lines UL1 and UL2 may be electrically connected to the decoder circuit 1110 through first connection interconnections 1115 extending from the first semiconductor structure 1100F into the second semiconductor structure 1100S. The bit lines BL may be electrically connected to the page buffer 1120 through second connection interconnections 1125 extending from the first semiconductor structure 1100F into the second semiconductor structure 1100S.

In the first semiconductor structure 1100F, the decoder circuit 1110 and the page buffer 1120 may perform a control operation on at least one selected memory cell transistor among the plurality of memory cell transistors MCT. The decoder circuit 1110 and the page buffer 1120 may be controlled by the logic circuit 1130. The semiconductor device 1100 may communicate with the controller 1200 through an input/output pad 1101 electrically connected to the logic circuit 1130. The input/output pad 1101 may be electrically connected to the logic circuit 1130 through input/output connection interconnections 1135 extending from the first semiconductor structure 1100F into the second semiconductor structure 1100S.

The controller 1200 may include a processor 1210, a NAND controller 1220, and a host interface 1230. According to embodiments, the data storage system 1000 may include a plurality of semiconductor devices 1100, and in this case, the controller 1200 may control the plurality of semiconductor devices 1100.

The processor 1210 may control an overall operation of the data storage system 1000 including the controller 1200. The processor 1210 may operate according to a predetermined firmware, and may access to the semiconductor device 1100 by controlling the NAND controller 1220. The NAND controller 1220 may include a controller interface 1221 processing communications with the semiconductor device 1100. A control command for controlling the semiconductor device 1100, data to be written to the memory cell transistors MCT of the semiconductor device 1100, data to be read from the memory cell transistors MCT of the semiconductor device 1100, or the like may be transmitted through the controller interface 1221. The host interface 1230 may provide a communication function between the data storage system 1000 and an external host. When a control command is received from the external host through the host interface 1230, the processor 1210 may control the semiconductor device 1100 in response to the control command.

Figure 20:
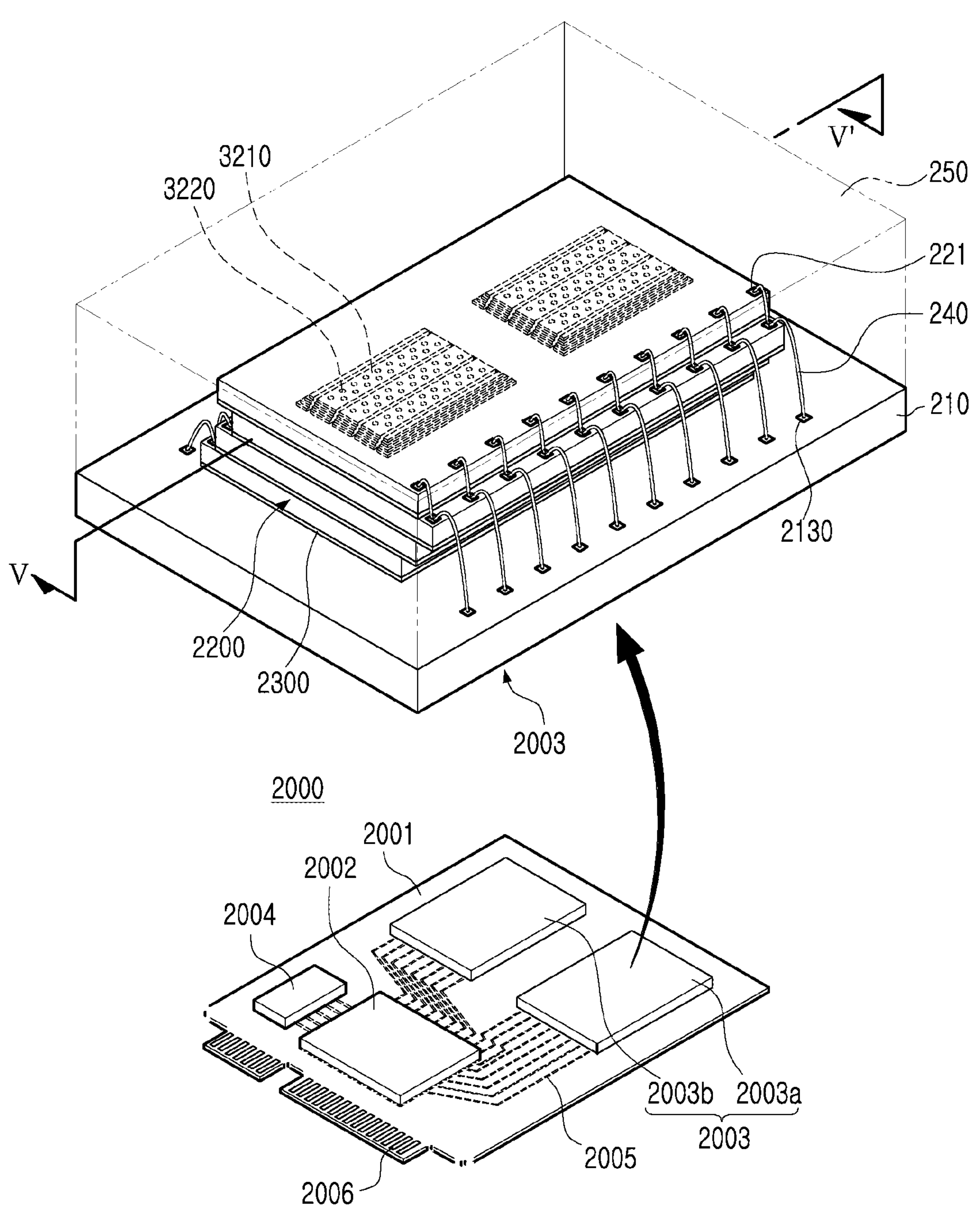
FIG. 20 is a perspective view schematically illustrating a data storage system including a semiconductor device according to example embodiments.

FIG. 20 is a perspective view schematically illustrating a data storage system including a semiconductor device according to example embodiments.

Referring to FIG. 20, a data storage system 2000 according to an example embodiment may include a main substrate 2001, a controller 2002 mounted on the main substrate 2001, at least one semiconductor package 2003, and a dynamic random-access memory (DRAM) 2004. The semiconductor package 2003 and the DRAM 2004 may be connected to the controller 2002 by wiring patterns 2005 formed on the main substrate 2001.

The main substrate 2001 may include a connector 2006 including a plurality of pins, which may be coupled to an external host. The number and an arrangement of the plurality of pins in the connector 2006 may vary according to a communication interface between the data storage system 2000 and the external host. In example embodiments, the data storage system 2000 may be communicated with the external host according to any one interface of a universal serial bus (USB), peripheral component interconnect express (PCI-Express), serial advanced technology attachment (SATA), M-Phy for universal flash storage (UFS), or the like. In example embodiments, the data storage system 2000 may be operated by power supplied from the external host through the connector 2006. The data storage system 2000 may further include a power management integrated circuit (PMIC) distributing power, supplied from the external host, to the controller 2002 and the semiconductor package 2003.

The controller 2002 may write data to the semiconductor package 2003 or read data from the semiconductor package 2003, and may improve an operation speed of the data storage system 2000.

The DRAM 2004 may be a buffer memory reducing a difference in speed between the semiconductor package 2003, which may be a data storage space, and the external host. The DRAM 2004 included in the data storage system 2000 may also operate as a type of cache memory, and may provide a space temporarily storing data in a control operation on the semiconductor package 2003. When the DRAM 2004 is included in the data storage system 2000, the controller 2002 may further include a DRAM controller controlling the DRAM 2004 in addition to a NAND controller controlling the semiconductor package 2003.

The semiconductor package 2003 may include first and second semiconductor packages 2003*a* and 2003*b*, spaced apart from each other. Each of the first and second semiconductor packages 2003*a* and 2003*b* may be a semiconductor package including a plurality of semiconductor chips 2200. Each of the first and second semiconductor packages

2003*a* and 2003*b* may include a package substrate 2100, semiconductor chips 2200 on the package substrate 2100, adhesive layers 2300 disposed on a lower surface of each of the semiconductor chips 2200, a connection structure 2400 electrically connecting each of the semiconductor chips 2200 and the package substrate 2100, and a molding layer 2500 covering the semiconductor chips 2200 and the connection structure 2400 on the package substrate 2100.

The package substrate 2100 may be a printed circuit board including upper pads 2130. Each of the semiconductor chips 2200 may include an input/output pad 2210. The input/output pad 2210 may correspond to the input/output pad 1101 of FIG. 19. Each of the semiconductor chips 2200 may include gate stack structures 3210 and channel structures 3220. Each of the semiconductor chips 2200 may include the semiconductor device described above with reference to FIGS. 1 to 13B.

In example embodiments, the connection structure 2400 may be a bonding wire electrically connecting the input/output pad 2210 and the upper pads 2130. Therefore, in each of the first and second semiconductor packages 2003*a* and 2003*b*, the semiconductor chips 2200 may be electrically connected to each other by a bonding wire process, and may be electrically connected to the upper pads 2130 of the package substrate 2100. According to embodiments, in each of the first and second semiconductor packages 2003*a* and 2003*b*, the semiconductor chips 2200 may be electrically connected to each other by a connection structure including a through silicon via (TSV), instead of a connection structure 2400 by a bonding wire process.

In example embodiments, the controller 2002 and the semiconductor chips 2200 may be included in one (1) package. In an example embodiment, the controller 2002 and the semiconductor chips 2200 may be mounted on a separate interposer substrate, different from the main substrate 2001, and the controller 2002 and the semiconductor chips 2200 may be connected to each other by a wiring formed on the interposer substrate.

Figure 21:
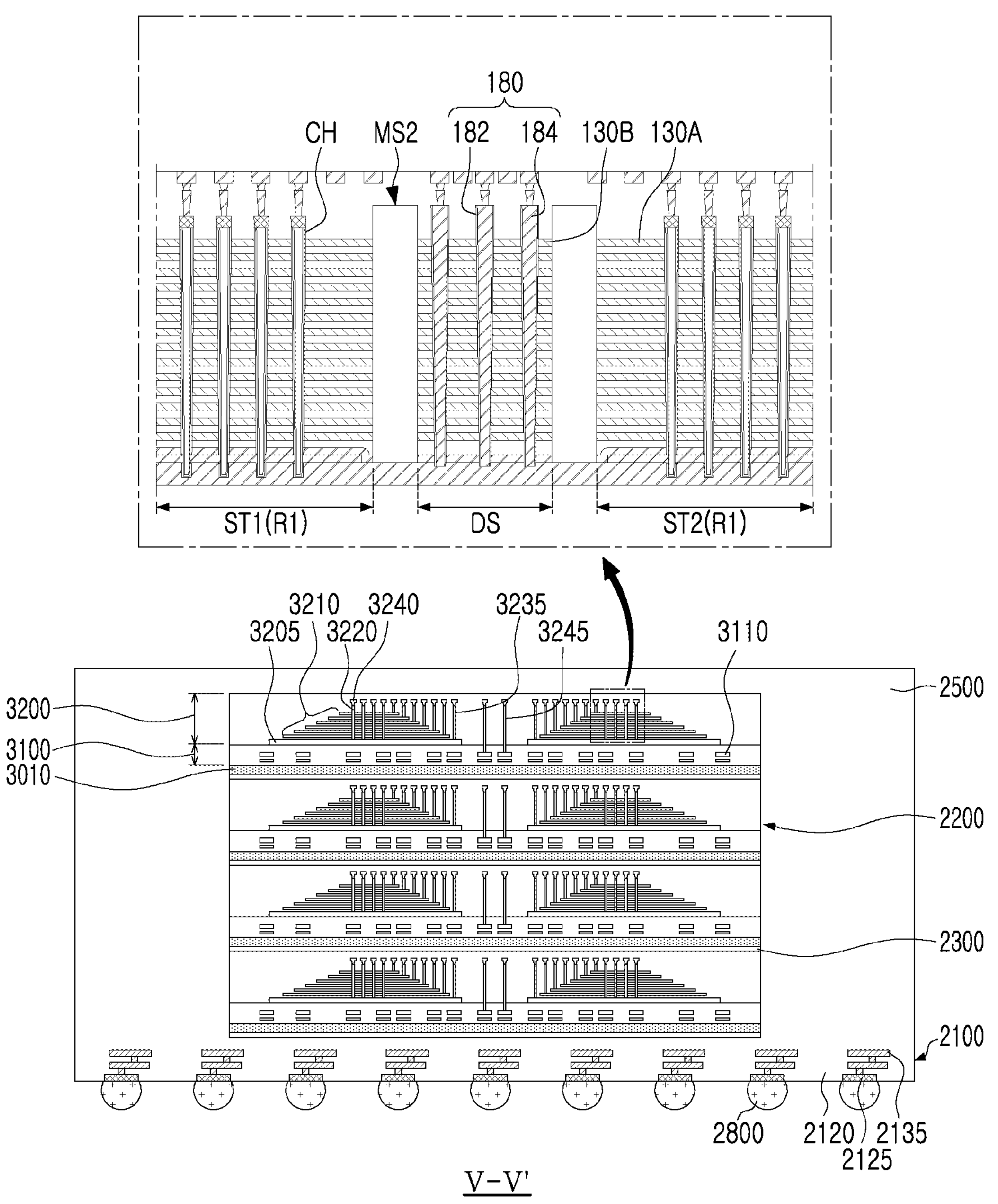
FIG. 21 is a cross-sectional view schematically illustrating a semiconductor package according to an example embodiment.

FIG. 21 is a cross-sectional view schematically illustrating a semiconductor package according to an example embodiment. FIG. 21 illustrates an example embodiment of the semiconductor package 2003 of FIG. 20, and conceptually illustrates a region taken along line V-V' of the semiconductor package 2003 of FIG. 20.

Referring to FIG. 21, in the semiconductor package 2003, the package substrate 2100 may be a printed circuit board. The package substrate 2100 may include a package substrate body portion 2120, upper pads 2130 (refer to FIG. 20) disposed on an upper surface of the package substrate body portion 2120, lower pads 2125 disposed on a lower surface of the package substrate body portion 2120 or exposed from the lower surface, and internal interconnections 2135 electrically connecting the upper pads 2130 and the lower pads 2125 in the package substrate body portion 2120. The upper pads 2130 may be electrically connected to the connection structures 2400. The lower pads 2125 may be connected to the wiring patterns 2005 of the main substrate 2001 of the data storage system 2000, as illustrated in FIG. 20, through-conductive connection portions 2800.

Each of the semiconductor chips 2200 may include a semiconductor substrate 3010, and a first semiconductor structure 3100 and a second semiconductor structure 3200, sequentially stacked on the semiconductor substrate 3010. The first semiconductor structure 3100 may include a peripheral circuit region including peripheral interconnections 3110. The second semiconductor structure 3200 may include a common source line 3205, a gate stack structure 3210 on the common source line 3205, channel structures 3220 and separation regions, passing through the gate stack structure 3210, bit lines 3240 electrically connected to the channel structures 3220, and contact plugs 3235 electrically connected to the word lines WL (refer to FIG. 19) of the gate stack structure 3210. As described above with reference to FIGS. 1 to 13B, in each of the semiconductor chips 2200, first source contact structures 180 may be disposed to pass through a dummy structure DS.

Each of the semiconductor chips 2200 may include a through-interconnection 3245 electrically connected to the peripheral interconnections 3110 of the first semiconductor structure 3100 and extending into the second semiconductor structure 3200. The through-interconnection 3245 may be disposed outside the gate stack structure 3210, and may further be disposed to pass through the gate stack structure 3210. Each of the semiconductor chips 2200 may further include an input/output pad (2210 in FIG. 20) electrically connected to the peripheral interconnections 3110 of the first semiconductor structure 3100.

By way of summation and review, an aspect of embodiments provides a semiconductor device having improved reliability and electrical characteristics. An aspect of embodiments also provides a data storage system including a semiconductor device having improved reliability and electrical characteristics.

That is, according to embodiments, a semiconductor device having improved reliability and electrical characteristics and a data storage system including the same may be provided by including source contact structures passing through a dummy structure between stack structures, e.g., regions between second separation regions dividing a memory block, to be connected to an underlying source structure.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A semiconductor device, comprising:

a first substrate structure including a substrate, circuit elements on the substrate, and first bonding metal layers on the circuit elements; and a second substrate structure connected to the first substrate structure on the first substrate structure, the second substrate structure including:

a source structure, a first stack structure and a second stack structure, each of the first stack structure and the second stack structure including first gate electrodes stacked on the source structure to be spaced apart from each other in a first direction perpendicular to an upper surface of the source structure, the first stack structure and the second stack structure being spaced apart from each other in a second direction perpendicular to the first direction, a dummy structure on the source structure between the first stack structure and the second stack structure, the dummy structure including second gate electrodes spaced apart from each other in the first direction, first separation regions passing through the first stack structure and the second stack structure, the first separation regions extending in the second direction and being spaced apart from each other in a third direction perpendicular to the first direction and the second direction, second separation regions extending in the third direction between the dummy structure and each of the first stack structure and the second stack structure, each of the second separation regions including an isolation insulating layer extending in the first direction and contacting side surfaces of the first gate electrodes and the second gate electrodes, channel structures passing through the first stack structure and the second stack structure in the first direction, each of the channel structures including a channel layer connected to the source structure through a side surface of the channel layer, and first source contact structures passing through the dummy structure in the first direction, each of the first source contact structures including a first contact layer connected to the source structure through a lower surface of the first contact layer, the first contact layer being conductive.

2. The semiconductor device as claimed in claim 1, wherein the second substrate structure further includes:

first contact plugs on the channel structures;

second contact plugs on the first source contact structures;

first interconnection lines on the first contact plugs, the first interconnection lines extending in the third direction; and second interconnection lines on the second contact plugs, the second interconnection lines extending outwardly from the first stack structure and the second stack structure in the third direction.

3. The semiconductor device as claimed in claim 2, wherein the second interconnection lines are around the first stack structure and the second stack structure, as viewed in a plan view, the second interconnection lines surrounding the first interconnection lines.

4. The semiconductor device as claimed in claim 1, wherein the second substrate structure further includes second source contact structures outside the first stack structure and the second stack structure, the second source contact structures extending in the first direction and being connected to the source structure, each of the second source contact structures including a second contact layer that is conductive.

5. The semiconductor device as claimed in claim 1, wherein each of the first source contact structures further includes a contact insulating layer covering a side surface of the first contact layer and extending in the first direction.

6. The semiconductor device as claimed in claim 1, wherein each of the first source contact structures further includes contact insulating layers between the first contact layer and the second gate electrodes, the contact insulating layers being spaced apart from each other in the first direction.

7. The semiconductor device as claimed in claim 1, wherein, in each of the first source contact structures, the first contact layer is in contact with the second gate electrodes through a side surface of the first contact layer.

8. A semiconductor device, comprising:

a first substrate structure including a substrate, circuit elements on the substrate, and first bonding metal layers on the circuit elements; and a second substrate structure connected to the first substrate structure on the first substrate structure, the second substrate structure including:

a source structure, a first stack structure and a second stack structure, each of the first stack structure and the second stack structure including first gate electrodes stacked on the source structure to be spaced apart from each other in a first direction perpendicular to an upper surface of the source structure, the first stack structure and the second stack structure being spaced apart from each other in a second direction perpendicular to the first direction, a dummy structure on the source structure between the first stack structure and the second stack structure, the dummy structure including second gate electrodes spaced apart from each other in the first direction, first separation regions passing through the first stack structure and the second stack structure, the first separation regions extending in the second direction and being spaced apart from each other in a third direction perpendicular to the first direction and the second direction, second separation regions extending in the third direction between the dummy structure and each of the first stack structure and the second stack structure, channel structures passing through the first stack structure and the second stack structure in the first direction, each of the channel structures including a channel layer connected to the source structure through a side surface of the channel layer, and first source contact structures passing through the dummy structure in the first direction, each of the first source contact structures including a first contact layer connected to the source structure through a lower surface of the first contact layer, the first contact layer being conductive, wherein the second gate electrodes are in a floating state to which no electrical signal is applied.

9. The semiconductor device as claimed in claim 1, wherein the second separation regions connect end portions of the first separation regions on one side of the first separation regions in the second direction.

10. The semiconductor device as claimed in claim 1, wherein the second substrate structure further includes third separation regions connecting the second separation regions to each other.

11. The semiconductor device as claimed in claim 10, wherein the third separation regions are spaced apart from points where the first separation regions and the second separation regions are connected, in the third direction.

12. The semiconductor device as claimed in claim 10, wherein each of the first source contact structures is in each of the third separation regions.

13. The semiconductor device as claimed in claim 10, wherein the dummy structure further includes sacrificial insulating layers on the same level as the second gate electrodes around the first source contact structures and contacting side surfaces of the first source contact structures in the third direction.

14. The semiconductor device as claimed in claim 1, wherein:

the first substrate structure further includes a lower interconnection structure electrically connected to the circuit elements, and the second substrate structure further includes a through-via passing through the dummy structure and the source structure to be connected to the lower interconnection structure, and electrically connected to the first source contact structures.

15. The semiconductor device as claimed in claim 14, wherein the second substrate structure further includes an interconnection line on at least one of the first source contact structures and the through-via, the interconnection line electrically connecting the at least one of the first source contact structures and the through-via.

16. The semiconductor device as claimed in claim 2, wherein the second substrate structure further includes second source contact structures outside the first stack structure and the second stack structure, the second source contact structures extending in the first direction and being connected to the source structure, each of the second source contact structures including a second contact layer that is conductive, and wherein the second interconnection lines include first lines electrically connected to the first source contact structures and second lines electrically connected to the second source contact structures, the first lines and the second lines being spaced apart from each other.

17. The semiconductor device as claimed in claim 1, wherein the source structure includes:

a plate layer, the first source contact structures being in contact with the plate layer;

a first horizontal conductive layer on the plate layer, the channel layer of each of the channel structures being in contact with the first horizontal conductive layer; and a second horizontal conductive layer on the first horizontal conductive layer.

18. A data storage system, comprising:

a semiconductor storage device including a source structure, circuit elements on one side of the source structure, and an input/output pad electrically connected to the circuit elements; and a controller electrically connected to the semiconductor storage device through the input/output pad and controlling the semiconductor storage device, wherein the semiconductor storage device further includes:

a first stack structure and a second stack structure, each of the first stack structure and the second stack structure including first gate electrodes stacked on the source structure to be spaced apart from each other in a first direction perpendicular to an upper surface of the source structure, the first stack structure and the second stack structure being spaced apart from each other in a second direction perpendicular to the first direction;

a dummy structure on the source structure between the first stack structure and the second stack structure, the dummy structure including second gate electrodes stacked to be spaced apart from each other in the first direction;

first separation regions passing through the first stack structure and the second stack structure, the first separation regions extending in the second direction and being spaced apart from each other in a third direction perpendicular to the first direction and the second direction, second separation regions extending in the third direction between the dummy structure and each of the first stack structure and the second stack structure, each of the second separation regions including an isolation insulating layer extending in the first direction and contacting side surfaces of the first gate electrodes and the second gate electrodes, channel structures passing through the first stack structure and the second stack structure in the first direction, each of the channel structures including a channel layer connected to the source structure through a side surface of the channel layer; and first source contact structures passing through the dummy structure in the first direction, each of the first source contact structures including a first contact layer, which is conductive, connected to the source structure through a lower surface of the first contact layer.

* * * * *